(12) United States Patent
Ahmed et al.

(10) Patent No.: US 11,610,936 B2
(45) Date of Patent: Mar. 21, 2023

(54) MICRO LIGHT-EMITTING DIODE DISPLAYS HAVING COLOR CONVERSION DEVICES AND ASSEMBLY APPROACHES

(71) Applicant: Intel Corporation, Santa Clara, CA (US)

(72) Inventors: Khaled Ahmed, Anaheim, CA (US); Anup Pancholi, Hillsboro, OR (US); Ali Khakifirooz, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 766 days.

(21) Appl. No.: 16/440,755

(22) Filed: Jun. 13, 2019

(65) Prior Publication Data
US 2020/0395403 A1  Dec. 17, 2020

(51) Int. Cl.
| | |
|---|---|
| *H01L 27/15* | (2006.01) |
| *H01L 33/32* | (2010.01) |
| *H01L 33/50* | (2010.01) |
| *G09F 9/33* | (2006.01) |
| *H01L 33/22* | (2010.01) |

(52) U.S. Cl.
CPC .............. *H01L 27/156* (2013.01); *G09F 9/33* (2013.01); *H01L 33/22* (2013.01); *H01L 33/32* (2013.01); *H01L 33/502* (2013.01); *H01L 2933/0041* (2013.01)

(58) Field of Classification Search
None
See application file for complete search history.

(56) References Cited

U.S. PATENT DOCUMENTS

| | | | |
|---|---|---|---|
| 2018/0012949 A1* | 1/2018 | Takeya | H01L 51/5237 |
| 2018/0097033 A1* | 4/2018 | Ahmed | H01L 33/0075 |
| 2019/0121176 A1* | 4/2019 | Lee | H01L 27/322 |
| 2019/0355702 A1* | 11/2019 | Herner | H01L 33/32 |
| 2020/0052033 A1* | 2/2020 | Iguchi | H01L 27/156 |
| 2020/0091226 A1* | 3/2020 | Hwang | H01L 33/58 |
| 2021/0151637 A1* | 5/2021 | Martin | H01L 33/06 |

* cited by examiner

*Primary Examiner* — Nduka E Ojeh
(74) *Attorney, Agent, or Firm* — Schwabe, Williamson & Wyatt, P.C.

(57) ABSTRACT

Micro light-emitting diode displays and methods of fabricating micro LED displays are described. In an example, a micro light emitting diode pixel structure includes a plurality of micro light emitting diode devices in a dielectric layer. A transparent conducting oxide layer is above the dielectric layer. A color conversion device (CCD) is above the transparent conducting oxide layer and over one of the plurality of micro light emitting diode devices.

28 Claims, 36 Drawing Sheets

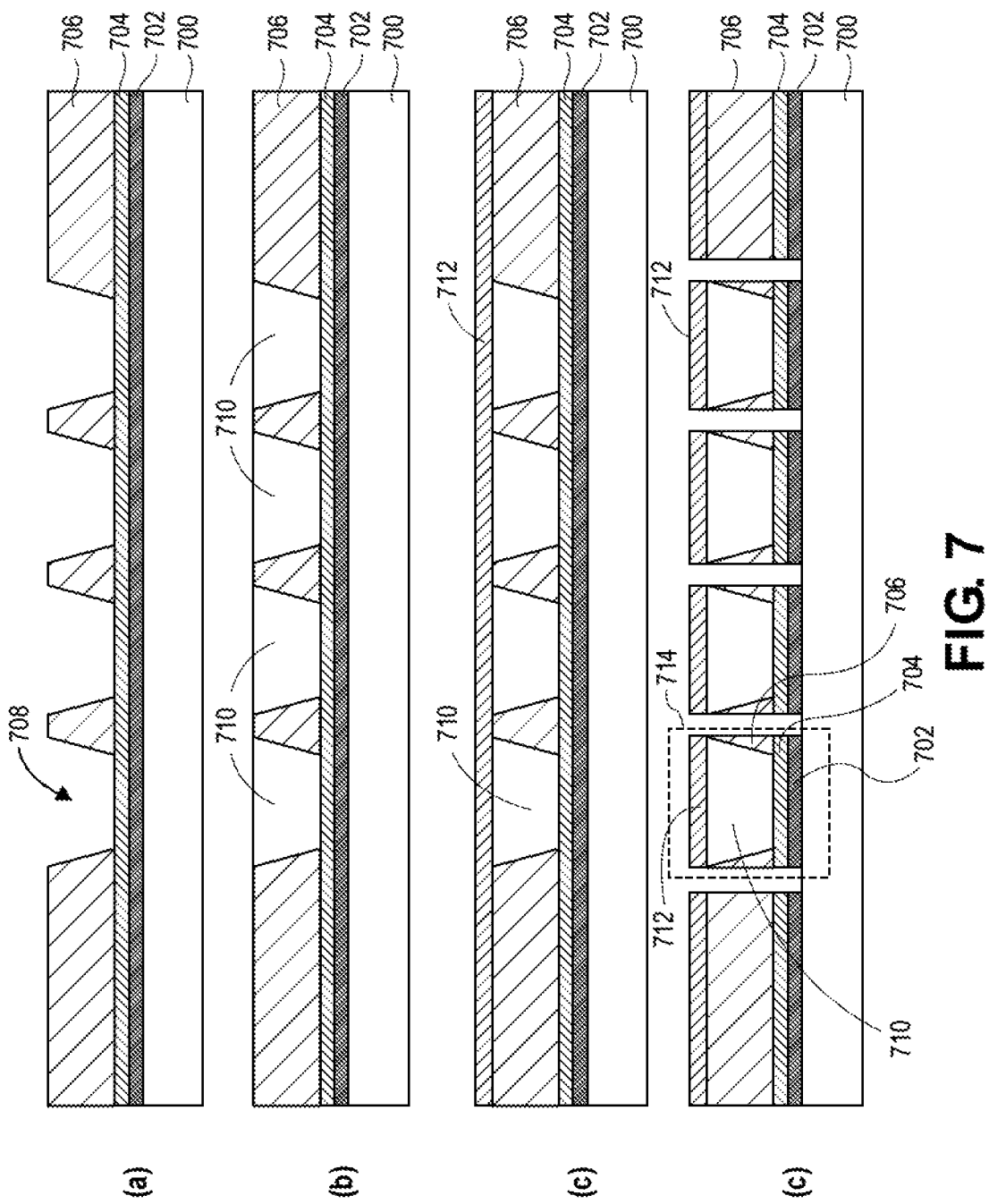

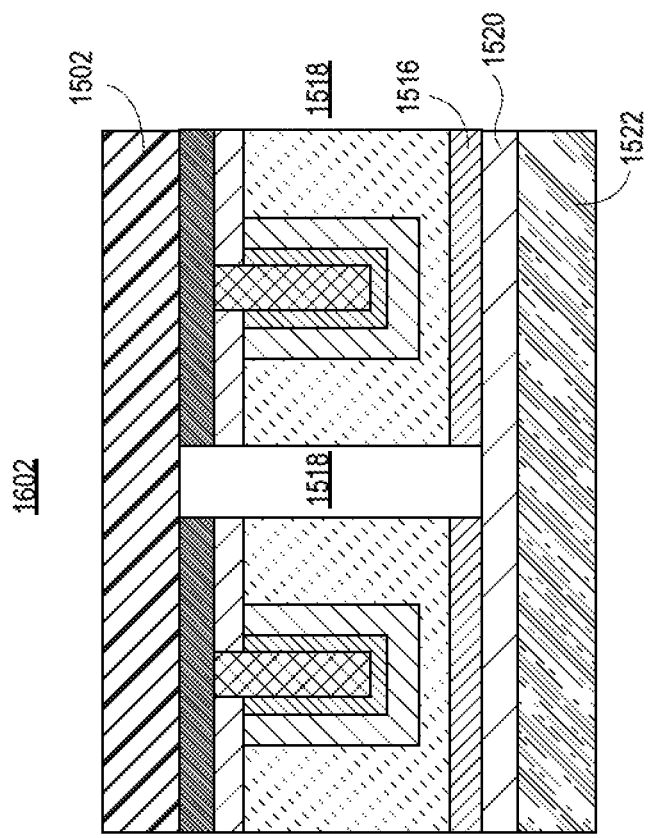
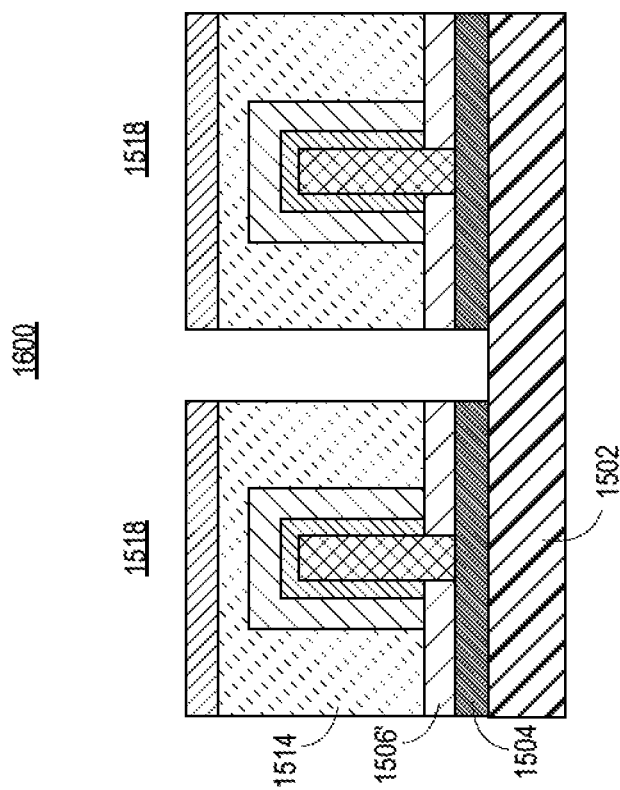
FIG. 16

MICRO LIGHT-EMITTING DIODE DISPLAYS HAVING COLOR CONVERSION DEVICES AND ASSEMBLY APPROACHES

TECHNICAL FIELD

Embodiments of the disclosure are in the field of micro-LED devices and, in particular, micro light-emitting diode displays and assembly approaches.

BACKGROUND

Displays having micro-scale light-emitting diodes (LEDs) are known as micro-LED, mLED, and μLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. These primarily square or rectangular-shaped units may be the smallest item of information in an image. Pixels are normally arranged in a two-dimensional (2D) matrix, and are represented using dots, squares, rectangles, or other shapes. Pixels may be the basic building blocks of a display or digital image and with geometric coordinates.

BRIEF DESCRIPTION OF THE DRAWINGS

FIG. 7 illustrates cross-sectional views of various operations in a method of fabricating micro color conversion devices, in accordance with an embodiment of the present disclosure.

FIG. 16 illustrates cross-sectional views of structures and having two micro LEDs at a stage of manufacturing corresponding to part (e) of FIG. 15A and part (f) of FIG. 15B, respectively, in accordance with an embodiment of the present disclosure.

DESCRIPTION OF THE EMBODIMENTS

Figure 1:
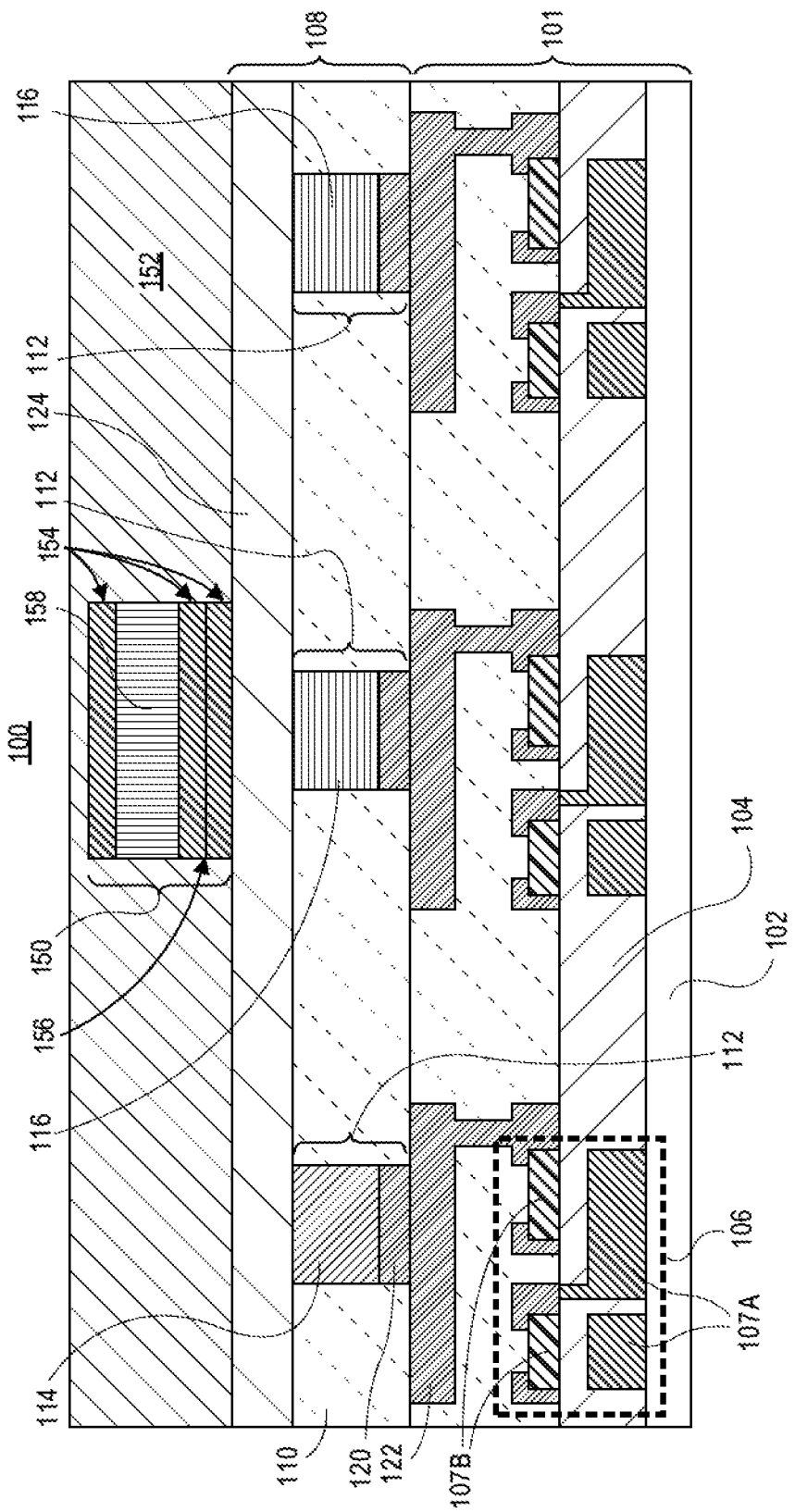
FIG. 1 illustrates a cross-sectional view of a pixel structure bonded to a display backplane and including a "color conversion device" (CCD) using oxide-to-oxide bonding to fabricate a red emitter, in accordance with an embodiment of the present disclosure.

Micro light-emitting diode (LED) displays and methods of fabricating micro LED displays are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to devices and architectures for micro LED displays. To provide context, displays based on inorganic micro LEDs (μLEDs) have attracted increasing attention for applications in emerging portable electronics and wearable computers such as head-mounted displays and wristwatches. Micro LEDs are typically first manufactured on Sapphire or silicon wafers (for example) and then transferred onto a display backplane glass substrate where on which active matrix thin-film transistors have been manufactured.

Micro LED displays promise 3×-5× less power compared to organic LED (OLED) displays. The difference would result in a savings in battery life in mobile devices (e.g., notebook and converged mobility) and can enhance user experience. In an embodiment, micro LED displays described herein consume two-fold less power compared to organic LED (OLED) displays. Such a reduction in power consumption may provide approximately 8 hours of additional battery life. Such a platform may even outperform platforms based on low power consumption central processing units (CPUs). Embodiments described herein may be associated with one or more advantages such as, but not limited to, high manufacturing yield, high manufacturing throughput (display per hour), and applicability for displays with a diagonal dimension ranging from 2 inches to 15.6 inches.

The "display" is the window for central processing unit (CPU) products in the PC business. Embodiments described herein may be applicable to fabricating low-power micro LED displays for use in Converged Mobility computing devices powered by CPUs. Currently, micro LED displays require improved optical design to maximize power efficiency.

In a first aspect of the present disclosure, micro LED displays with color conversion devices (CCDs) and assembly methods of micro LED displays with color conversion devices are described.

To provide context, currently, micro LED displays require better or improved (higher efficiency) red micro emitters. State-of-the-art methods to achieve efficient red micro emitters include the use of quantum dots loaded into a photoresist that are spin-coated on the display and then patterned using lithography. Such an approach provides low power efficiency and high production cost. By contrast, embodiments described herein provide for manufacturable micro LED display device structures that result in higher external quantum efficiency for red micro emitters, and lower manufacturing cost.

Other state-of-the-art approaches include the use of micro LED displays with blue emitters based on GaN material system and color conversion for both red and green utilizing quantum dot photoresist color conversion films. Disadvantages associated with such an approach can include display power consumption that is about 2-3× higher than desired. The production cost using quantum dot photoresist is typically about 2× higher than desired. QDs are playing an increasingly important role in displays in general, both in sharpening the spectral response of traditional phosphors, or altogether replacing them in display applications as pixels shrink below 10 μm. When QDs or other expensive nanomaterial coatings need to be laid down on top of less than 10 μm blue micro LEDs, however, there lacks a materials efficient process for quickly depositing precise, ultra-uniform films of such coatings. For example, ink-jet printing, spin or spray coating, slot-die or other relatively inefficient, costly approaches can have drawbacks.

To provide further context, significant manufacturing issues and challenges in depositing QDs in applications such as the above surround fine pitch pixilation, the practicality of dispensing over local versus global areas, throughput, obtaining highly uniform QD coatings, and cost effectiveness. QDs are still relatively expensive, placing a premium on material efficient processes. QDs can be deposited in one of two ways: ink-jet printed with the appropriate color QDs at each pixel or blanket "printed," or spin-coated over the display area and then patterned by some form of lithography. For low pixels per inch (PPI) and coarse demonstration purposes, ink-jet printing may be used, but it is typically much too slow for volume production, especially for PPIs where sub-pixel sizes approach less than 10 μm, leaving areal deposition and lithography as the preferred approach. Some 2-10 μm or more thickness of a perfectly uniform QD coating is typically needed, with the QDs closely packed, to fully absorb the blue emitted by an InGaN blue LED. Normal printing techniques are often too coarse, while spin-coating limited to wafers, and wastes material. Spin-coating users typically cite some 80-90% of the coating materials wasted, as well as edge-bead effects and the uniformity and packing issues tied to the centrifugal forces involved. Similarly, industrial slot-die processes are typically used for high volume coatings, but to achieve high uniformity such techniques rely on precisely controlled evaporation of a diluent first dispersed into the material to be coated. Additionally, evaporation tools are considered to be too expensive. A quantum dot pattern may be formed through transfer-printing and screen printing. However, the quantum dot patterns formed with transfer-printing tend to have poor resolution, where edges of the patterns are in a serrated form and the adhering power between the quantum dot layer and the base requires being further improved. Inkjet printing is also a method for forming a patterned quantum dot layer and such a method has proven to have a severe requirement for the inkjet printing device. In particular, there remain technical barriers to maintaining stability of the drops of ink jet and the precision of printing, making it essentially possible for use in mass production.

In accordance with one or more embodiments of the present disclosure, micro color conversion devices (CCDs) that convert blue light into red light are described. Such devices can be fabricated and then transferred onto a display backplane that has received both blue and green micro LEDs (e.g., made of GaN material system) from silicon wafers using an appropriate mass transfer technology. In an embodiment, a design for micro red color converter devices (CCDs) that is optimized for maximum external quantum efficiency is described. Such a design may involve the use of a stack of multiple layers of QDPR (quantum dot photoresist) with different indium phosphide (InP) QD loading volume fractions in each layer to create a graded refractive index stack that minimizes light trapping and maximizes quantum conversion efficiency of blue light (pumped by blue micro LEDs) into the CCD. In an embodiment, a method to transfer the CCDs from glass substrate onto the display backplane is described that results in unique final structures. In some embodiments, approaches described herein rely on oxide-to-oxide bonding technology that is amenable to high volume manufacturing.

As an exemplary pixel architecture, FIG. 1 illustrates a cross-sectional view of a pixel structure bonded to a display backplane and including a "color conversion device" (CCD) using oxide-to-oxide bonding to fabricate a red emitter, in accordance with an embodiment of the present disclosure.

Referring to FIG. 1, a pixel structure 100 includes a backplane 101. The backplane 101 includes a glass substrate 102 having an insulating layer 104 thereon. Pixel thin film transistor (TFT) circuits 106 are included in and on the insulating layer 104. Each of the pixel TFT circuits 106 includes gate electrodes 107A, such as metal gate electrodes, and channels 107B, such as polycrystalline silicon channels or IGZO channels. A portion of the insulating layer 104 may act as a gate dielectric for each of the pixel TFT circuits 106. A conductive mirror 122 is over each of the TFT circuits 106.

Referring again to FIG. 1, the pixel structure 100 includes a front plane 108 on the backplane 101. The front plane 108 includes LEDs in a dielectric layer 110, such as a carbon-doped oxide layer. In the example shown, three micro LEDs 112 are included. Each micro LED includes a corresponding micro light emitting diode device 114, 116 (left) or 116 (right) on a conductive interconnect structure 120, such as a conductive bump. In a particular embodiment, micro light emitting diode devices 114, 116 (left) and 116 (right) are green, blue and blue micro light emitting diode devices, respectively. It is to be appreciated that other arrangements may be used, including variation in number and/or colors of micro LED devices included. The front plane 108 also includes a transparent conducting oxide layer 124, such as a layer of indium tin oxide (ITO), as a cathode of the pixel structure 100. In an embodiment, a color conversion device (CCD) 150 is on or above a region of the transparent conducting oxide layer 124 over the light emitting diode device 116 (left). The CCD may be included within a passivation oxide layer 152. The CCD 150 includes oxide layers 154 which may include an oxide-to-oxide bond 156. A color conversion device (CCD) material layer 158 is sandwiched between the oxide layers 154. In an embodiment, the light emitting diode device 116 (left) is a blue light emitting diode device, and the CCD 150 converts blue light from the blue light emitting diode device to red light.

In an embodiment, each of the pixel TFT circuits 106 is a circuit such as circuit 1350, 2000 or 2200, described below. In one embodiment, each of the pixel thin film transistor circuits 106 includes a current mirror and a linearized transconductance amplifier coupled to the current mirror, as described in greater detail below. In an embodiment, the plurality of micro light emitting diode devices 114, 116 (left) and 116 (right) is a plurality of GaN nanowire-based or nanopyramid-based micro light emitting diode devices. Embodiments described herein may be based only on the backplane 101 described above. Embodiments described herein may be based only on the front plane 108 described above.

Advantages to implementing a structure such as described in association with FIG. 1 may include one or more of: (1) lower power consumption display with excellent color gamut and display lifetime, and/or (2) meeting of target production costs. It is to be appreciated that the demand for low power in consumer electronic devices has increased dramatically in the past ten years due to limited battery lifespan. One of the components with the highest percentage of total energy consumption, and therefore a suitable candidate for improvement, is the display. The developments of low power displays are becoming a high priority for the consumer electronics industry. Micro LED (µLED) display is a type of emissive display technology that uses a matrix of individually-switched self-illuminating inorganic diodes that can be controlled and lit without a master backlight. Inorganic µLEDs have a number of potential advantages over organic LEDs (OLEDs) for display applications. These include the possibility of high brightness. In µLED displays a desired color and luminance value are created from various combinations of three colors of light emitting elements (red, green and blue).

Figure 2:
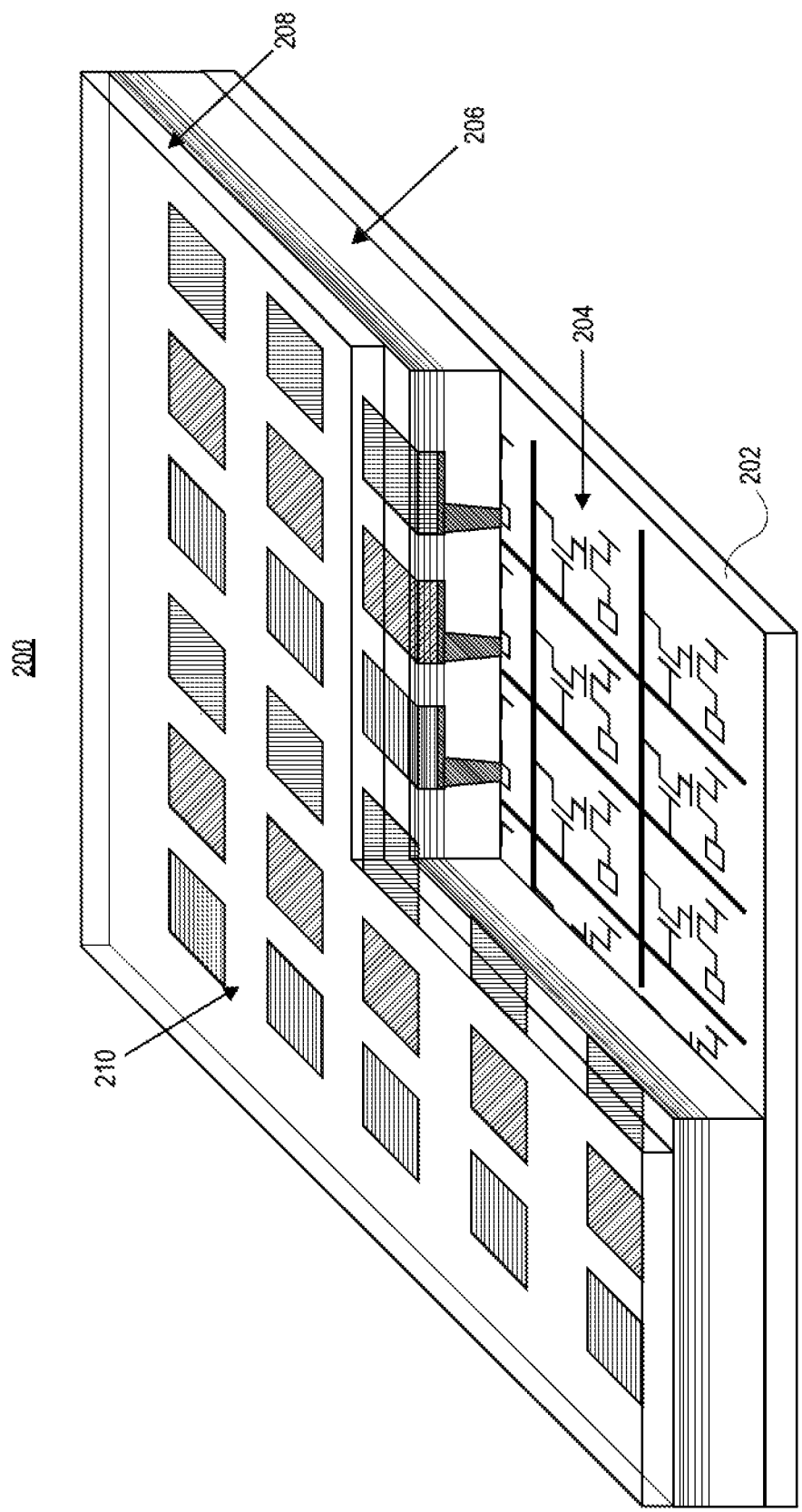
FIG. 2 illustrates a schematic of micro LED display architecture, in accordance with an embodiment of the present disclosure.

As an exemplary display architecture, FIG. 2 illustrates a schematic of micro LED or OLED display architecture, in accordance with an embodiment of the present disclosure. Referring to FIG. 2, a micro LED display 200 includes a backplane 202 having pixel circuits 204 thereon. An insulator 206 is over the pixel circuits 204. Micro LED layers 208 are included over the insulator 206. A transparent electrode 210 is over the micro LED layers 208.

Figure 3:
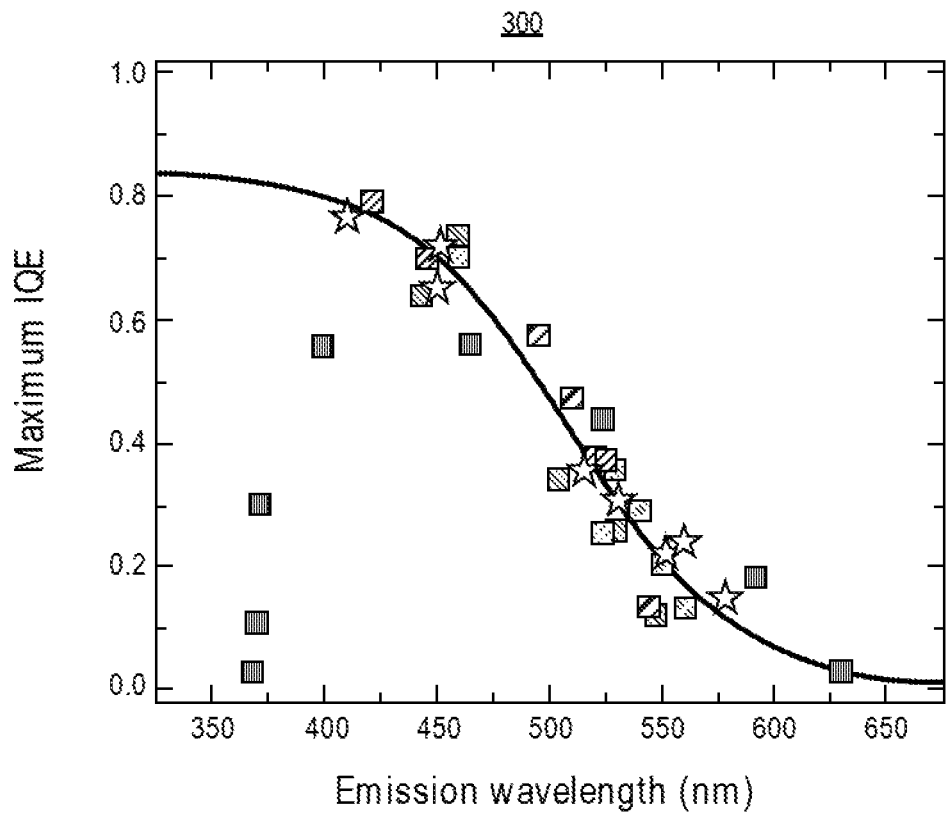
FIG. 3 is a plot of maximum IQE as a function of emission wavelength for a historical survey of experimental data of "planar" InGaN/GaN LED devices over the UV-to-Visible range, in accordance with an embodiment of the present disclosure.

To provide further context, an issue with efficiency of GaN-based red micro LEDs for light emitting devices, such as light emitting diodes (LED), is that the emission wavelength is determined by the band gap of the active region of the LED together with thickness determined confinement effects. Often, the active region includes one or more quantum wells (QWs). For III-nitride based LED devices, such as GaN based devices, the active region (e.g., quantum well) material is preferably ternary, such as $In_xGa_{1-x}N$, where 0≤x≤1. The band gap of such III-nitride can be dependent on the amount of In incorporated in the active region (e.g., in the QW(s)). A higher In incorporation can yield a smaller band gap and thus longer wavelength of the emitted light. InGaN may be a very attractive material for the development of various optical devices in the entire visible spectral range owing to the tenability of the bandgap energy by adjusting the indium content. A low-In-content InGaN-based blue light-emitting diode (LED) has exhibited an external quantum efficiency (EQE) of approximately 83%. However, the EQEs of long-wavelength LEDs emitting light in the green, yellow, orange, and red regions can be much lower. As an example, FIG. 3 is a plot 300 of maximum IQE as a function of emission wavelength for a historical survey of experimental data of "planar" InGaN/GaN LED devices over the UV-to-Visible range, in accordance with an embodiment of the present disclosure. Referring to plot 300, the maximum internal quantum efficiency (IQE) decreases as a function of wavelength.

To provide further context, critical factors causing low efficiency in high-In-content InGaN-based LEDs may include: (1) defects in the InGaN active layer due to the lattice mismatch between $In_xGa_{1-x}N$ and GaN (e.g., lattice mismatch between InN and GaN is 11%), and/or (2) the piezoelectric field in the strained InGaN active layers can become very large for high indium content, causing low internal quantum efficiency owing to electron-hole separation in InGaN multiple quantum wells. This can be particularly important for growing InGaN on c-plane GaN. For a/m-planes, however, the effect may be negligible.

Figure 4:
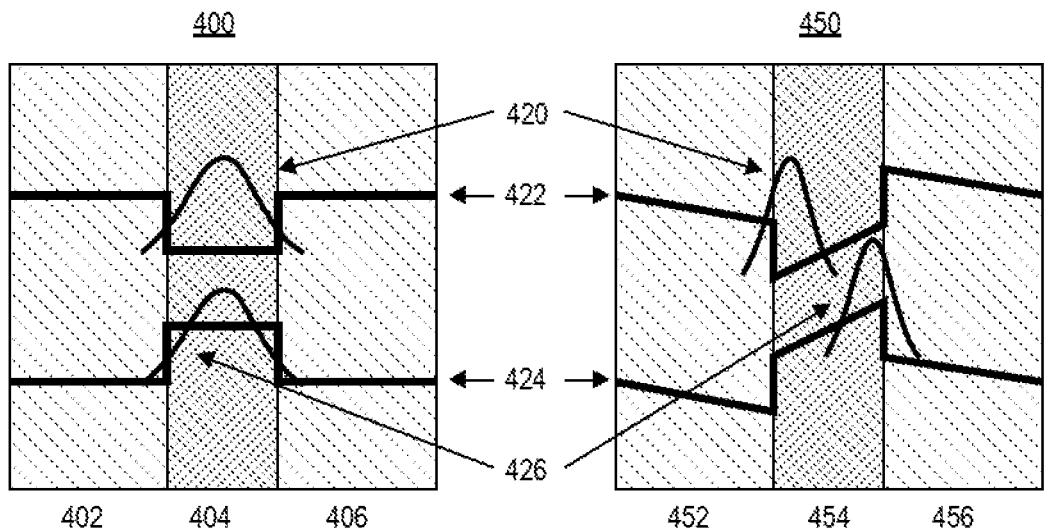
FIG. 4 is a schematic of band diagrams of GaN/InGaN/GaN quantum wells with different growth planes, in accordance with an embodiment of the present disclosure.

As an example, FIG. 4 is a schematic of band diagrams of GaN/InGaN/GaN quantum wells with different growth planes, in accordance with an embodiment of the present disclosure. Referring to FIG. 4, an a/m-plane structure 400 is shown for GaN 402, InGaN 404 and GaN 406 layers. A c-plane structure 450 is shown for GaN 452, InGaN 454 and GaN 456 layers. Corresponding parameters shown for the differing structures include electron wave function 420, conduction band edge 422, valence band edge 424 and hole wave function 426.

To provide further context, photoluminescent (PL) LEDs are unlike an electroluminescent LED (EL-LED), in that a PL light emitting device (or color conversion device (CCD)) does not require an electrical drive current from an external electronic circuit in order to emit light. Instead, as best understood, the PL-LED generates electron-hole pairs by absorption of light at a first wavelength $\lambda 1$ in an active region of the PL-LED. These electrons and holes then recombine in potential wells in the active region to emit light at a second wavelength $\lambda 2$ different from the first wavelength $\lambda 1$. The initiating radiation or "pump light" at the first wavelength $\lambda 1$ is typically provided by a blue, violet, or ultraviolet emitting EL-LED coupled to the PL-LED. The active region of the PL-LED can be made of a phosphor such as colloidal quantum dots. When a UV or blue light wave hits a phosphor or quantum dot film, several phenomena occur. The light is reflected at the surface (specular and diffuse behavior), selectively absorbed by the phosphor or quantum dot film, scattered by phosphor particles (differently depending on the particle size), converted to different wavelengths or transmitted through the film.

As used herein, a quantum dot (QD) refers to a crystalline inorganic particle that is spherically or nearly spherically shaped and has diameters between 2 and 50 nm. Optical properties of QDs (e.g., emission wavelength) are exquisitely sensitive to the precise size of the particle, and thus, allow one to tune them simply by controlling their size. For a given quantum dot, the emission band is dependent on the size of the quantum dot. With respect to Cd-free quantum dots, an InP-based Quantum Dot material system has been claimed to be able to match the color performance of the industry's best cadmium-based materials without requiring an exemption to the European Union's RoHS Directive. InP is a direct gap material with a band gap of 1.27 eV, which is suitable for achieving visible emission in the quantum confinement regime. As-prepared InP QDs generally show weak luminescence because of the existence of non-radiative carrier recombination originating from surface states. However, after over coating with a ZnS shell, InP QDs become highly luminescent. InP QDs are also attractive due to the stronger covalent bond as compared with the ionic bond in CdS QDs, increasing their photostability.

Figure 5A:
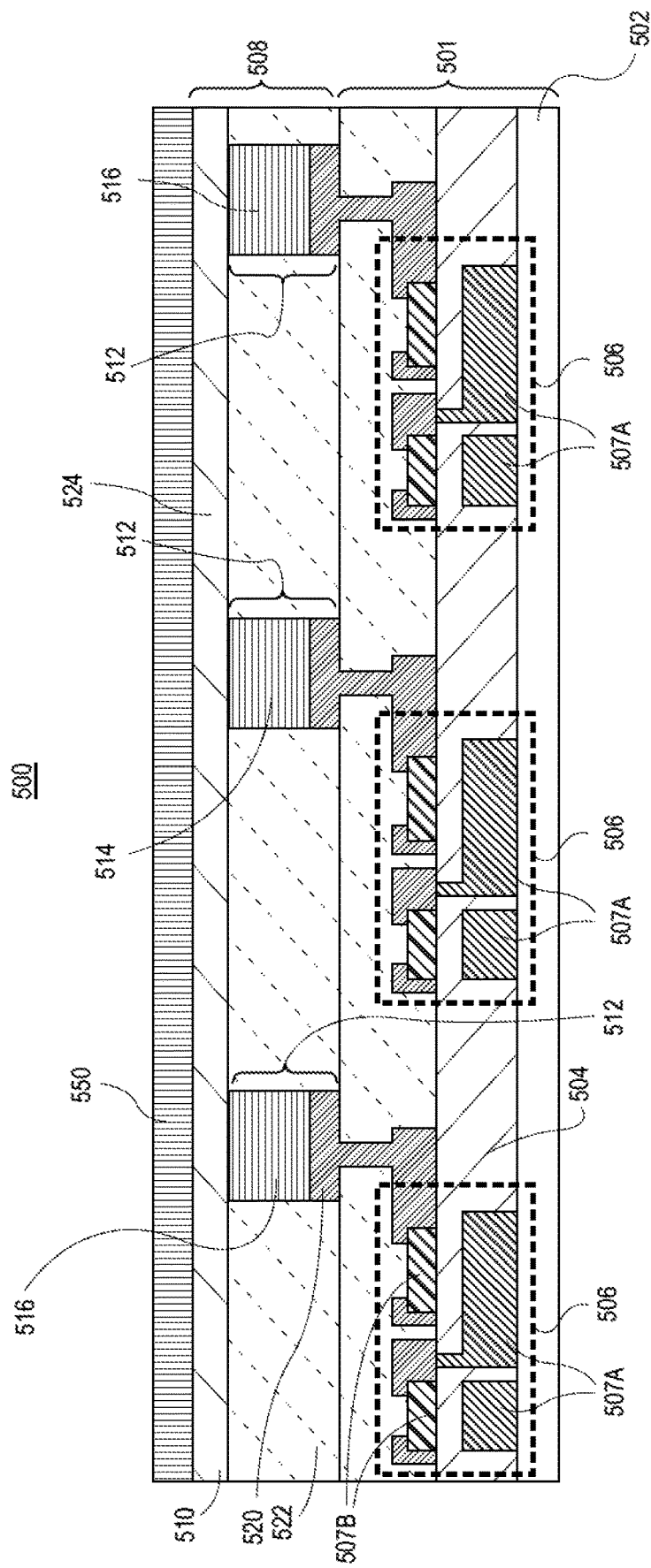
FIGS. 5A and 5B illustrate cross-sectional views of various operations in the fabrication of a pixel structure bonded to a display backplane and including a quantum dot layer.
Figure 5B:
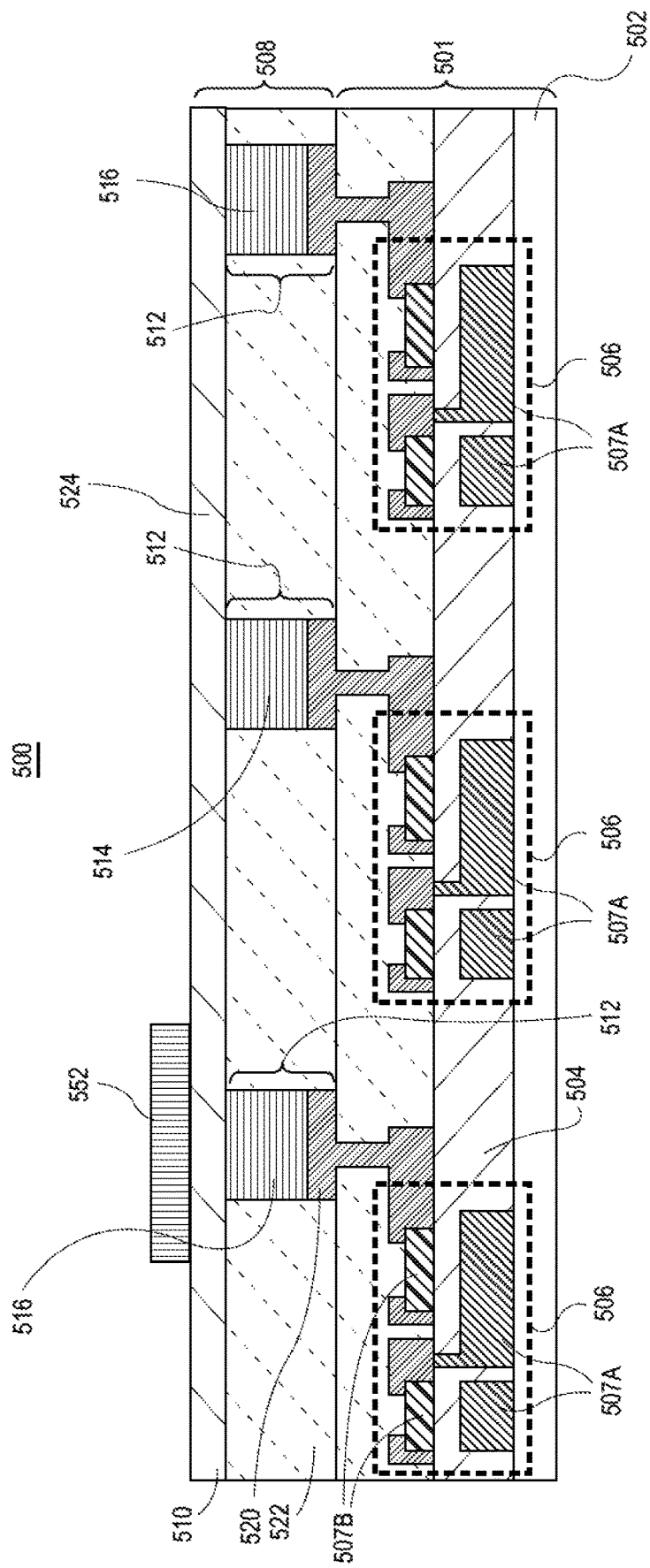

FIGS. 5A and 5B illustrate cross-sectional views of various operations in the fabrication of a pixel structure bonded to a display backplane and including a quantum dot layer.

Referring to FIG. 5, a pixel structure 500 includes a backplane 501. The backplane 501 includes a glass substrate 502 having an insulating layer 504 thereon. Pixel thin film transistor (TFT) circuits 506 are included in and on the insulating layer 504. Each of the pixel TFT circuits 506 includes gate electrodes 507A, such as metal gate electrodes, and channels 507B, such as polycrystalline silicon channels or IGZO channels. A portion of the insulating layer 504 may act as a gate dielectric for each of the pixel TFT circuits 506. A conductive mirror 522 is over each of the TFT circuits 506.

Referring again to FIG. 5, the pixel structure 500 includes a front plane 508 on the backplane 501. The front plane 508 includes LEDs in a dielectric layer 510, such as a carbon-doped oxide layer. In the example shown, three micro LEDs 512 are included. Each micro LED includes a corresponding micro light emitting diode device 514, 516 (left) or 516 (right) on a conductive interconnect structure 520, such as a conductive bump. In a particular embodiment, micro light emitting diode devices 514, 516 (left) and 516 (right) are green, blue and blue micro light emitting diode devices, respectively. The front plane 508 also includes a transparent conducting oxide layer 524, such as a layer of indium tin oxide (ITO), as a cathode of the pixel structure 500.

A photoresist film 550 loaded with quantum dots (QDs), i.e., a quantum dot photoresist (QDPR), is spin-coated on the display plane then patterned using lithography. Referring to FIG. 5B, the photoresist film 550 is then patterned to form a layer 552 including color conversion devices (QDs). In this case, the technology can achieve very high resolution but it may be accompanied by wasting approximately 90% of an expensive material.

To provide further context, according to Snell's law, if the incident angle of light passing from a high refractive index medium to a low refractive index medium is larger than a critical angle, then the light undergoes total internal reflection such that it cannot enter the low refractive index medium. Most light emitted by a light emitting diode is subjected to the total internal reflection issue so as to decrease the overall emission efficiency of the light emitting diode.

With respect to a CCD design, when InP QDs (size of approximately 3 nm, and refractive index of approximately 3.5) are loaded into a photoresist (e.g., a transparent binder material with refractive index nPR=1.7), the "quantum dot photoresist" color conversion film will have an effective refractive index neff that has a value between 1.7 and 3.5, according to "effective medium theory". The increase in refractive index from the lower refractive index host material (photoresist) may be understood in terms of effective medium theory. Optical and dielectric properties of a mixture may be described in terms of the properties of its constituent components. The refractive index of a mixture, for example, may be well approximated by a volume weighted average of the refractive indices of its components if the mixture may be treated as a host material including non-scattering portions of other materials. Under such circumstances, the refractive index neff of a medium is formed by the mixture of volumes vi of components having refractive indices ni.

It is to be appreciated that the higher the volume fraction of InP quantum dots, the higher the effective refractive index. Higher effective refractive index will result in light trapping inside the quantum dot photoresist film (via total internal reflections), and the external quantum efficiency of the micro emitter will decrease. In order to improve external quantum efficiency of the micro emitter (and reduce power consumption of micro LED display), one or more embodiments described herein involve the use a layered stack of QDPR films, each with thickness of approximately 1-5 µm, and different volume fractions of InP quantum dots. Such an arrangement results in a graded refractive index stack, with larger InP QD volume fraction in the bottom layer and lower InP QD volume fraction in the top (closer to air) layers. The final arrangement can result in higher external quantum efficiency.

Figure 6:
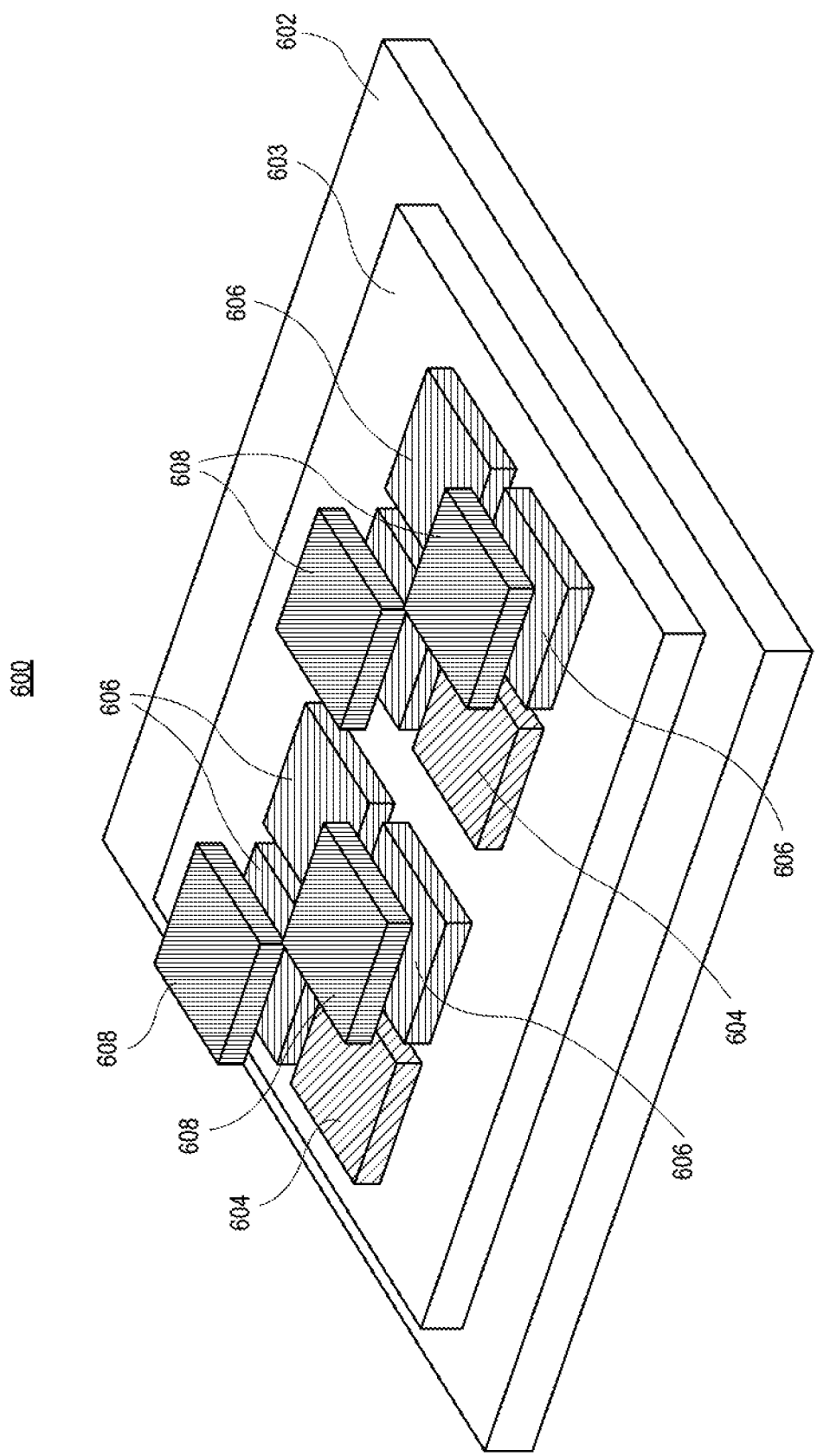
FIG. 6 schematically illustrates an angled cross-sectional view of a display device, in accordance with an embodiment of the present disclosure.

With respect to display architecture, FIG. 6 schematically illustrates an angled cross-sectional view of a display device, in accordance with an embodiment of the present disclosure. Referring to FIG. 6, a display 600 includes a backplane 602 having a TCO layer (common cathode) 603 thereon. Green LEDs 604 and blue LEDs 606 are included within the TCO layer 603. A color conversion device (CCD) 608 is included over select ones of the blue LEDs 606. In one embodiment, the color conversion device (CCD) 608 ultimately provides a source of red light.

Referring again to FIG. 6, in a particular embodiment, the blue 606 and green 604 µLEDs that have been grown monolithically on one wafer are transferred to the display backplane using an appropriate transfer method (e.g., a Direct Transfer Method described herein). A transparent conductive oxide (e.g. ITO) is deposited on all µLEDs to provide common cathode contact. Color Conversion Devices (CCDs) 608 are prepared on a glass substrate separately. In one embodiment, the CCDs are composed of quantum dot photoresist films sandwiched between two oxide (e.g., $SiO_2$) films on the top and bottom. The CCDs may be transferred to the display backplane using the "Direct Transfer Method" by bonding the CCDs to "oxide pads" that have been patterned on top of the ITO common cathode.

As an exemplary processing scheme, FIG. 7 illustrates cross-sectional views of various operations in a method of fabricating micro color conversion devices, in accordance with an embodiment of the present disclosure. In one embodiment, the schematic provides a process flow for fabricating "color conversion devices" with dimension in the range 4-20 µm. "Dimension" may refer to the edge of a square or the radius of a circle.

Referring to part (a) of FIG. 7, a material stack includes a floor oxide layer 704 on an amorphous silicon layer 702 on a glass substrate 700. Cavities 708 are created in an oxide material 706 using patterning and etching. Referring to part (b) of FIG. 7, color conversion films 710 are deposited inside the cavities 708. Referring to part (c) of FIG. 7, a "bonding oxide" 712 is deposited on top of the color conversion films 710 using a low temperature deposition process (e.g., around 100 degrees Celsius or less). Referring to part (d) of FIG. 7, patterning and etching is performed to form micro color conversion devices (CCD) 714 that are ready to be transferred to a display backplane. It is to be appreciated that, in one embodiment, the amorphous silicon layer 702 is used to release the CCD 714 from the glass substrate 700 when transferring onto the display backplane. In a particular embodiment, for releasing the CCD, UV irradiation is used to ablate the amorphous silicon layer 702 and the CCD 714 is detached from the substrate 700.

A two-step process for transferring micro LEDs from a silicon wafer to a display backplane may be used. First, selective bonding is performed using thermocompression bonding (TCB). Prior to bonding, both substrates (Micro-LED wafer and target display backplane) may be subjected to pre-processing steps of plasma treatment and cleans to activate the surface. Surface activation may ensure that the micro-LED will have strong bond with target Cu pads on display backplane. Next, selective release of micro LEDs are performed using backside (silicon side) irradiation with infrared laser, e.g., with a wavelength greater than 1300 nm. Post bond and release, a clean step may be implemented on the display backplane having the micro-LEDs thereon to clean any residuals from release layer left on micro-LEDs.

Figure 8A:
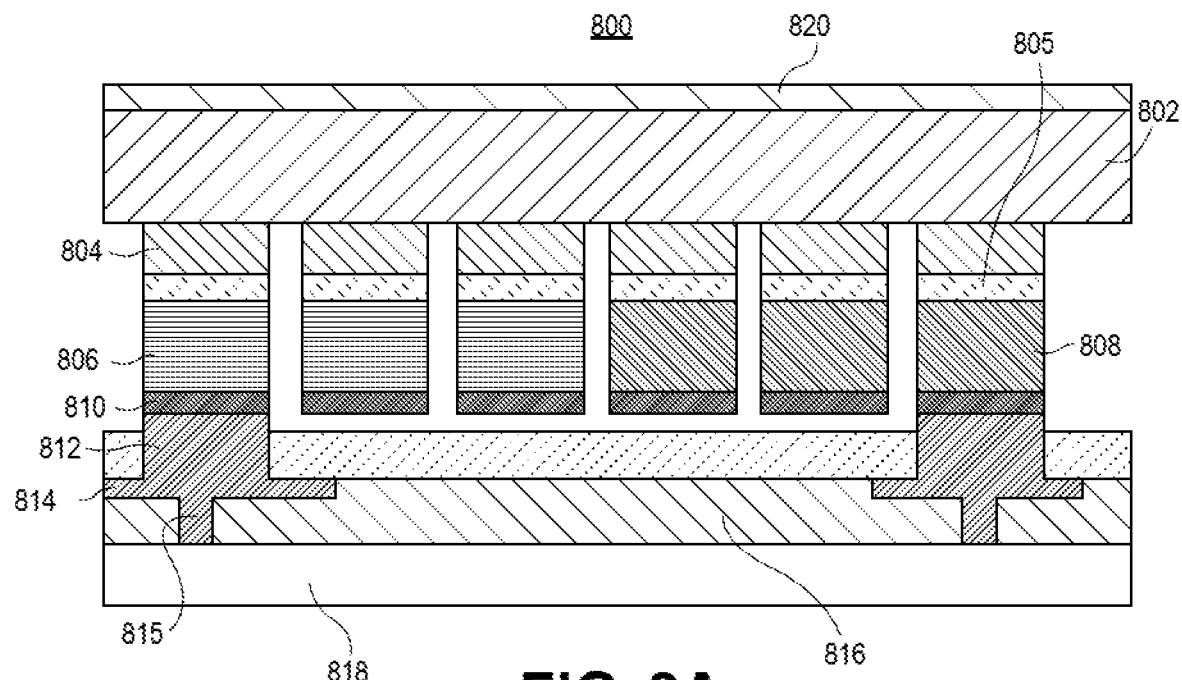
FIG. 8A illustrates a cross-sectional view of assembly components (e.g., micro LED wafer and display backplane) during "selective bonding" of micro LEDs, in accordance with an embodiment of the present disclosure.

As an example, FIG. 8A illustrates a cross-sectional view of assembly components (e.g., micro LED wafer and display backplane) during "selective bonding" of micro LEDs, in accordance with an embodiment of the present disclosure.

Referring to FIG. 8A, an LED substrate 802, such as a silicon wafer, has a patterned growth or nucleation layer 804 thereon, such as a patterned aluminum nitride layer. Individual micro LEDs 806/808 are associated with each pattern feature of the patterned growth or nucleation layer 804. In one embodiment, a first group of one type of micro LEDs 806, such as blue micro LEDs, is adjacent a second group of micro LEDs 808, such as green micro LEDs. A release layer 805, such as a metal nitride layer, may be between the individual micro LEDs 806/808 and the associated pattern feature of the patterned growth or nucleation layer 804, as is depicted. A metal bonding layer 810, such as a copper or aluminum layer, is on each of the individual micro LEDs 806/808. A backplane 818 is opposite the LED substrate 802. The backplane 818 may include a dielectric layer 816 having conductive features therein. The conductive features may include reflective plates 814 and associated vias 815. Metal pads or bumps 812 are on the reflective plates 814. In an embodiment, metal bonding layer 810 is a copper layer and metal pads or bumps 812 are copper pads or bumps. In another embodiment, metal bonding layer 810 is an aluminum layer and metal pads or bumps 812 are aluminum pads or bumps. Selected ones of the individual micro LEDs 806/808 are bonded to a corresponding metal pads or bumps 812 to provide a micro LED wafer bonded to a display backplane. An anti-reflective coating 820 is formed on the LED substrate 802.

Figure 8B:
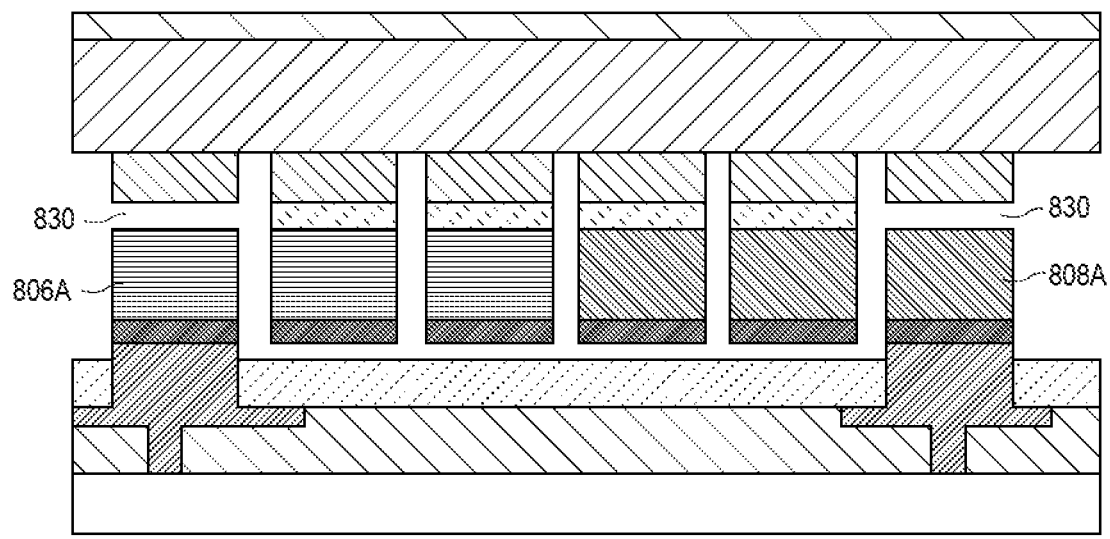
FIG. 8B illustrates a cross-sectional view of assembly components (e.g., micro LED wafer and display backplane) during "selective release" of micro LEDs, in accordance with an embodiment of the present disclosure.

FIG. 8B illustrates a cross-sectional view of assembly components (e.g., micro LED wafer and display backplane) during "selective release" of micro LEDs, in accordance with an embodiment of the present disclosure. The LED substrate 802 is then released from the display backplane 818 upon removal of release layer 805 at locations 830 of the selected ones of the individual micro LEDs 806/808. The selective release leaves micro LEDs 806A and 808A remaining as bonded to the display backplane 818. The remaining micro LEDs on LED substrate 802 may then be bonded to another display backplane.

As an example of a blanket release approach, FIGS. 9A-9E illustrate cross-sectional views of various operations in a method of assembling a micro LED display, in accordance with an embodiment of the present disclosure.

Figure 9A:
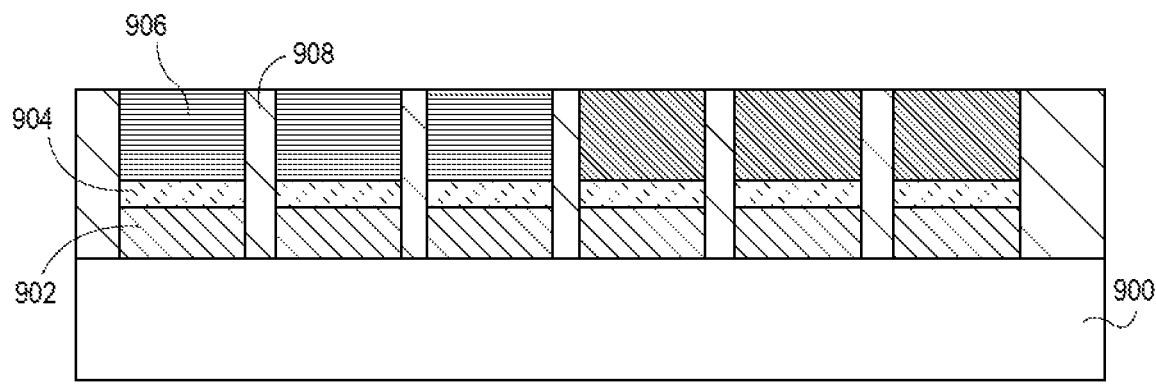
FIGS. 9A-9E illustrate cross-sectional views of various operations in a method of assembling a micro LED display, in accordance with an embodiment of the present disclosure.

Referring to FIG. 9A, an LED substrate 900, such as a silicon wafer, has a patterned growth or nucleation layer 902 thereon, such as a patterned aluminum nitride layer. Individual micro LEDs 906 are associated with each pattern feature of the patterned growth or nucleation layer 902. A release layer 904, such as a metal nitride layer, may be between the individual micro LEDs 906 and the associated pattern feature of the patterned growth or nucleation layer 902, as is depicted. An insulating layer 908 surrounds the micro LEDs 906.

In an embodiment, "blanket release" of micro LEDs is performed by irradiation (e.g., through the wide-bandgap micro LEDs) with infra-red laser with a wavelength greater than approximately 1300 nm. The release layer (transition metal nitride) absorbs the infra-red radiation and bonds between the release layer and micro LEDs become very weak.

Figure 9B:
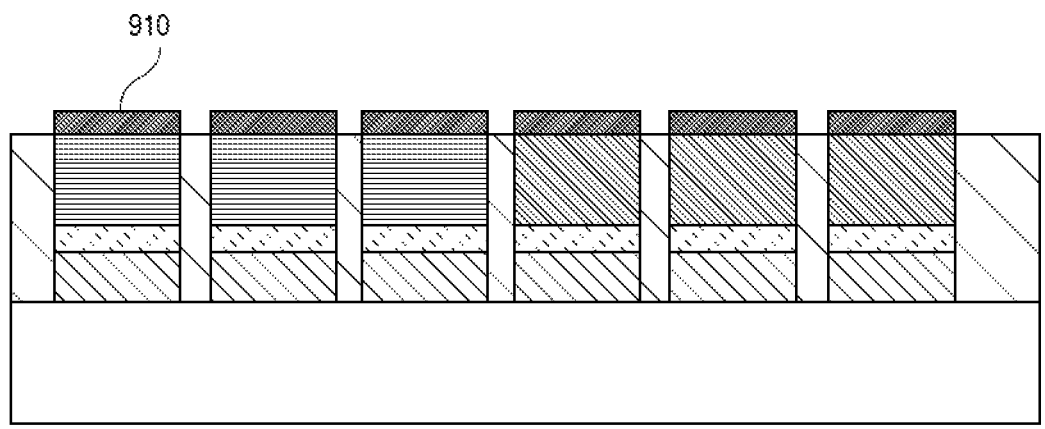
Figure 9C:
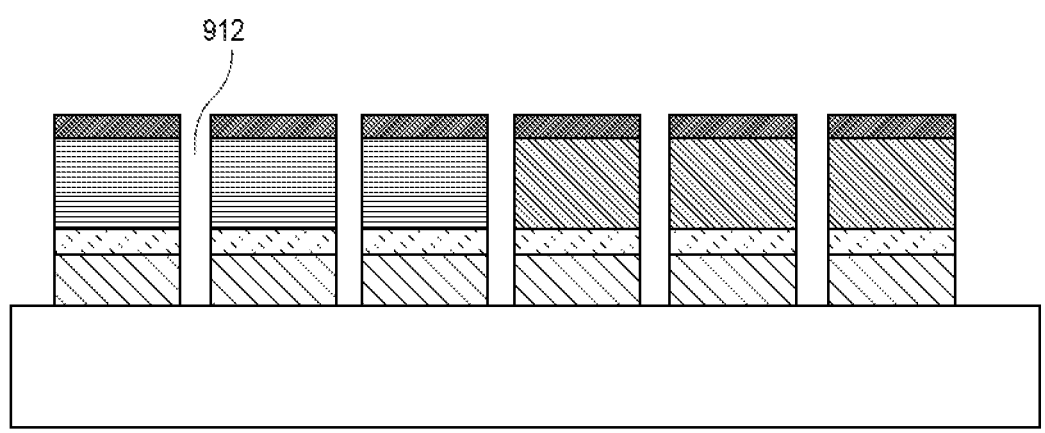

Referring to FIG. 9B, a metal bonding layer 910, such as a copper or aluminum layer, is formed as a pad on each of the individual micro LEDs 906. The insulating layer 908 is then removed to form trenches 912, as depicted in FIG. 9C.

Figure 9D:
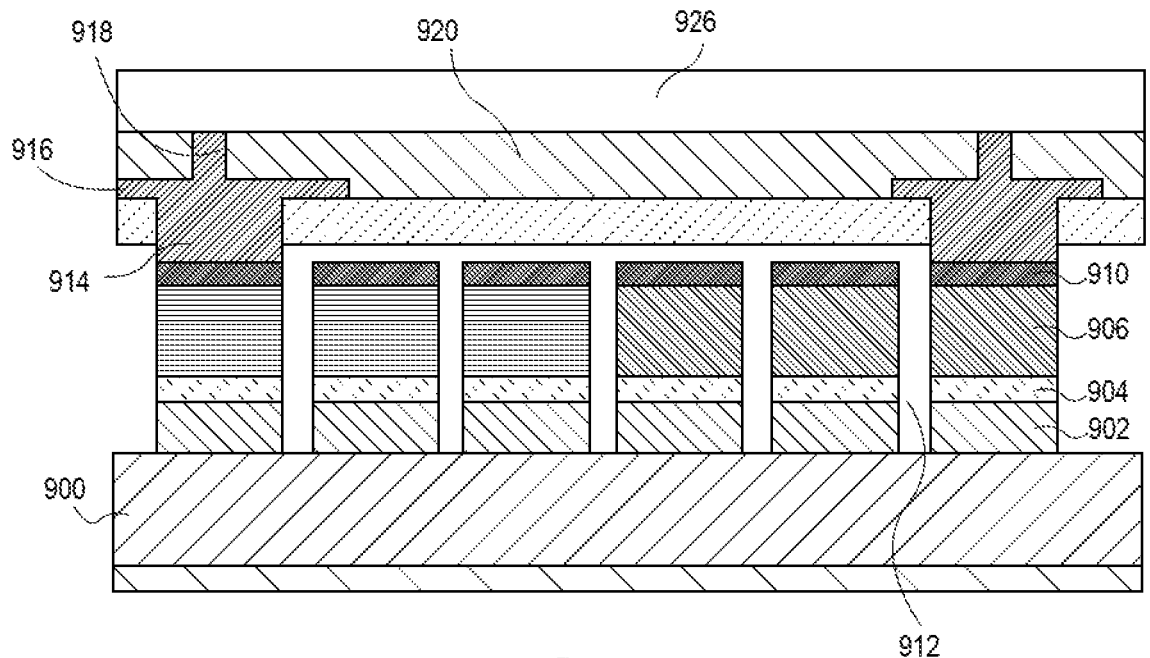
Figure 9E:
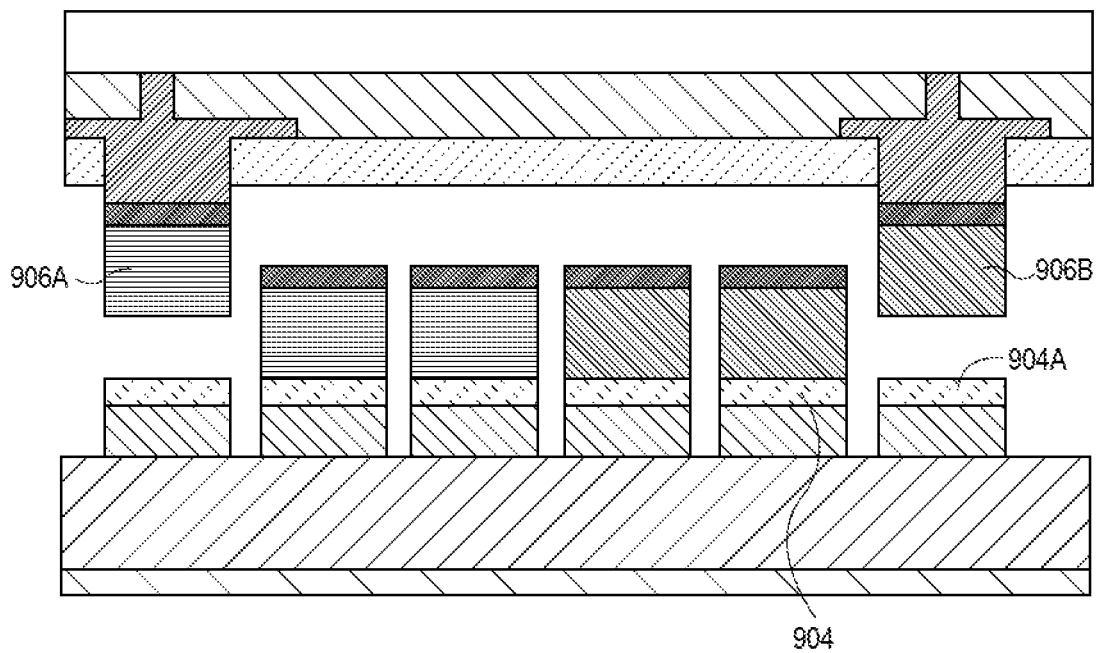

Referring to FIG. 9D, a backplane 926 is positioned opposite the substrate 900. The backplane 926 includes a dielectric layer 920 having conductive features therein. The conductive features may include reflective plates 916 and associated vias 918. Metal pads or bumps 914 are on the reflective plates 916. Mechanical separation of the micro LEDs from silicon wafer is then performed, as is depicted in FIG. 9E. Referring to FIG. 9E, release occurs at location labeled 904A, 906A and 906B.

In another aspect, transfer approaches for transferring color conversion devices (CCD) to a display backplane are described. In an embodiment, quantum dot based color conversion devices are implemented to convert blue light to red. Once the micro-LEDs are transferred onto display backplane, transparent conductive oxide such as indium tin oxide (ITO) can be deposited. A uniform oxide film can be deposited on a wafer with CCDs and then patterned to isolate CCDs on the wafer itself from neighboring CCDs. In a next operation, the display backplane with micro-LEDs is bonded with a CCDs glass wafer. Selective bond and release (or release and bond) of CCDs can be performed using a similar method described above for transferring micro-LED to display backplane. In order to achieve successful oxide to oxide bonding, both interfaces may need to be extremely flat, such as achieved by chemical mechanical planarization (CMP). Prior to bonding, both interfaces may be subjected to pre-processing steps for plasma and clean treatment. In one embodiment, a plasma operation can help activate the bonding surface and a clean can leave a few monolayers as well as clean for any contamination that may otherwise cause issues in establishing close and uniform contact at the interface for bonding. In the case of a few monolayers of the wafer remaining at the surface can render the surface hydrophilic and aid with a subsequent bonding process. Upon bonding, a heat treatment may be performed to improve bond strength and hence reliability. Finally, a transparent oxide can be grown on entire displace backplane to encapsulate blue devices, green devices and blue plus CCD devices.

In a second aspect, micro devices assembly (MDA) technology and structures for fabricating micro LED displays are described.

To provide context, transferring red, green, and blue (RGB) micro LEDs that have been grown monolithically on one wafer to a display backplane is advantageous from cost and yield perspectives. However, making monolithic RGB micro LEDs on one wafer with optimal efficiency for each color is very challenging. Additionally, monolithic RGB on one wafer is limited to GaN-based material system which has limited power efficiency for red micro LED. Micro devices assembly methods and structures for making micro LED displays are needed to enable assembly of red, green, and blue micro LEDs with different material systems and on different substrates.

In accordance with one or more embodiments of the present disclosure, micro devices assembly methods and display structures are described for making micro LED displays. Such approaches can enable assembly of red, green, and blue micro LEDs that can be made with different material systems and on different substrates (e.g., wafer types). Approaches described herein can be implemented to leverage existing equipment and process technologies, and can be highly manufacturable. Additionally, the resulting structures can provide the desired optoelectronics performance for low power displays. In one embodiment, red micro LED are made using organic layers (e.g., micro OLEDs) on wafers and then transferred to the display backplane.

Figure 10:
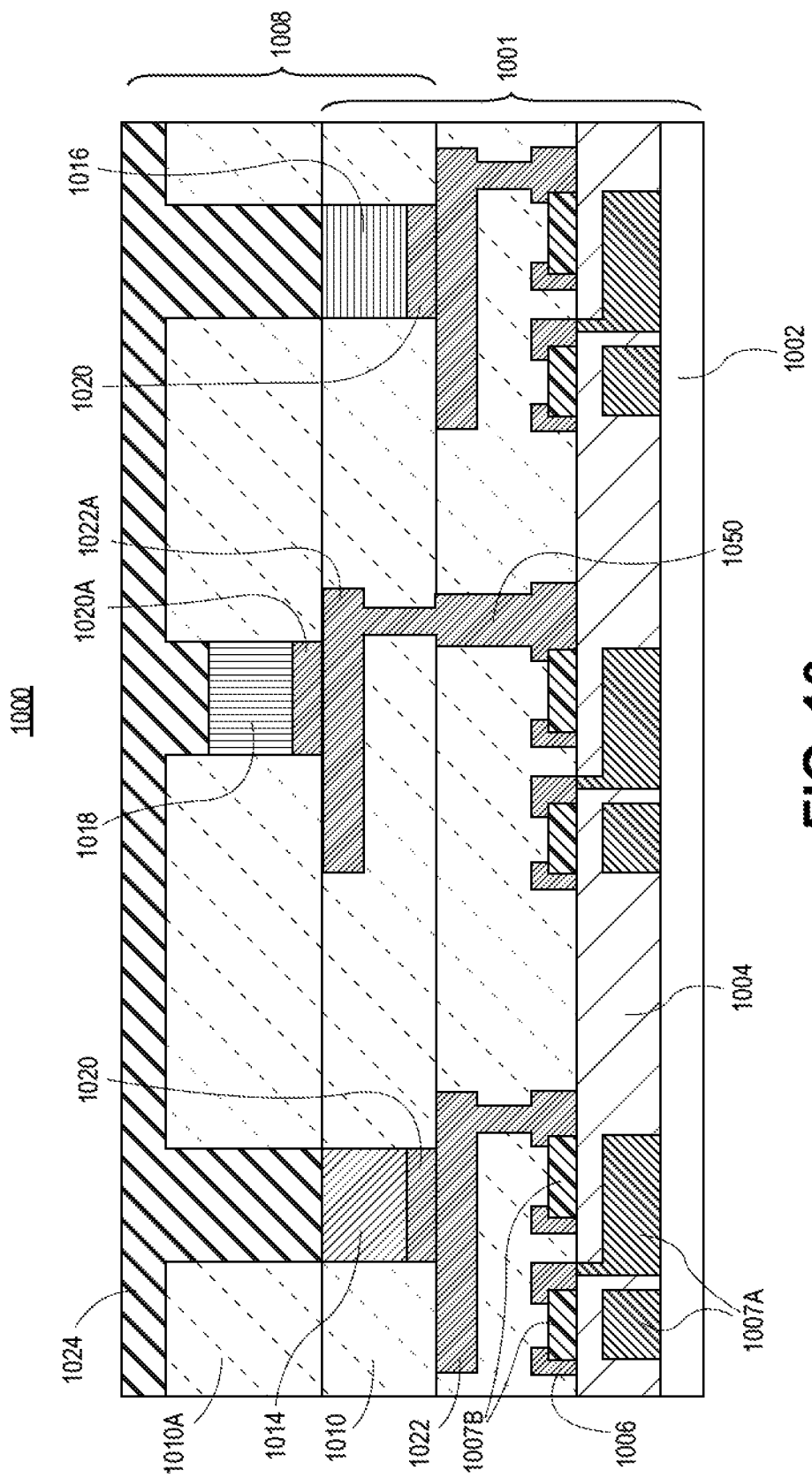
FIG. 10 illustrates a cross-sectional view of a micro LED display assembly after transfer of red, green, and blue micro LEDs, in accordance with an embodiment of the present disclosure.

FIG. 10 illustrates a cross-sectional view of a micro LED display assembly after transfer of red, green, and blue micro LEDs, in accordance with an embodiment of the present disclosure.

Referring to FIG. 10, a pixel structure 1000 includes a backplane 1001. The backplane 1001 includes a glass substrate 1002 having an insulating layer 1004 thereon. Pixel thin film transistor (TFT) circuits 1006 are included in and on the insulating layer 1004. Each of the pixel TFT circuits 1006 includes gate electrodes 1007A, such as metal gate electrodes, and channels 1007B, such as polycrystalline silicon channels or IGZO channels. A portion of the insulating layer 1004 may act as a gate dielectric for each of the pixel TFT circuits 1006. A conductive mirror 1022 is over each of the TFT circuits 1006. In the case of a red LED, the backplane 1001 may further be viewed to include a conductive via 1050 in the same layer as the conductive mirrors 1022 of blue and green LEDs, and a conductive mirror 1022A of the red LED.

Referring again to FIG. 10, the pixel structure 1000 includes a front plane 1008 on the backplane 1001. The front plane 1008 includes LEDs in a dielectric layer 1010, such as a carbon-doped oxide layer. In the example shown, a green micro LED 1014 and a blue micro LED 1016 are included. Since the green micro LED 1014 and the blue micro LED 1016 are in a same plane as the conductive mirror 1022A of the red LED, the structure of FIG. 10 can be viewed as having an overlapping backplane 1001 and front plane 1008. The green micro LED 1014 and the blue micro LED 1016 are on a conductive interconnect structure 1020, such as a conductive bump.

The front plane 1008 also includes a red LED 1018 in a second dielectric layer 1010A, such as a second carbon-doped oxide layer. The red micro LED 1018 is on a conductive interconnect structure 1020A, such as a conductive bump. The front plane 1008 also includes a transparent conducting oxide layer 1024, such as a layer of indium tin oxide (ITO), as a cathode of the pixel structure 1000. In an embodiment, the resulting structure can be viewed as a non-planar arrangement of LEDs, in that red LED 1018 is in a layer above the layer including the green micro LED 1014 and the blue micro LED 1016.

Advantages of implementing a structure such as described in association with FIG. 10 can include much lower technical risk (i.e., faster time to market), and/or higher power efficiency. It is to be appreciated that a key to realizing the promised power reductions with micro LED displays is the fabrication of LEDs with high power efficacies for the three color LED emitters. Enabling large scale μLED displays manufacturing requires a manufacturer to bring together three major separate technologies and supply chain bricks: (1) micro LED manufacturing, (2) display manufacturing, and (3) transfer technology tool manufacturing.

In a typical display, each pixel is constituted of Red, Green and Blue (RGB) subpixels controlled independently by a matrix of transistors. The idea behind μLED displays is to use individual, small LED chips as the sub-pixel. Unlike OLEDs, inorganic LED require high processing temperatures (e.g., greater than 1000° C.) and cannot be "grown" and patterned directly on top of the transistor matrix. In most cases, the micro LED chips are therefore manufactured separately then positioned and connected to the transistor matrix via a pick and place process. Volume production at costs compatible with the applications still faces multiple engineering and manufacturing challenges. Such challenges include: LED epitaxy quality and homogeneity, efficiency of very small μLEDs, sidewall effects, massively parallel chip transfer technologies (e.g., pick and place) with position accuracy and high throughput, cost, handling of small die, etc., interconnects, color conversion, defect management, supply chain, and cost of production. Just like OLED, μLED is an emissive display technology. However, because of the inorganic nature of the emitting materials, their efficiency and narrow emission bands, μLED also offer the prospect of significantly improved performance in terms of energy consumption, color gamut, brightness, contrast (High Dynamic Range), long lifetime and environmental stability (not sensitive to air, moisture), and compatibility with flexible backplane technologies to enable curved or flexible displays.

In an embodiment, a workflow for MDA technology includes: (1) Fabricating micro LEDs on silicon (or other) wafers. The micro LED wafers can be one of the following: a. three (or more) separate micro LED wafers for different colors (e.g., red, green, yellow, and blue) are manufactured, b. two separate micro LED wafers with one wafer having a green and blue micro LED arrays grown monolithically, and a third micro LED wafer having red micro LEDs, c. the green and blue micro LEDs may be composed of InGaN/GaN based material system, and the red micro LED may be composed of AlInGaP/GaP based material system or the InGaN/GaN based material system, or d. the micro LED structures can be planar, nanowire, nanopyramids, or any other suitable structure that provides high power efficiency. (2) Transferring green and blue micro LEDs from micro LED wafers having green and blue micro LEDs grown monolithically. Micro LEDs on micro LED wafers are first "selectively" bonded to display backplane using thermocompression bonding (e.g., Cu to Cu pads bonding), and then laser beams irradiated from the substrate side are used to "selectively" release the micro LEDs from wafer. (3) An interlayer dielectric (ILD) is deposited on the backplane having the green and blue micro LED transferred and CMP is performed to produce a planarized ILD. (4) Interconnect via trenches are formed using appropriate lithography and etching of the ILD layer to form a via connecting the "red pixel circuit" to a contact pad for transferring the red micro LED. (5) Copper (Cu) contact pads are formed only where the red micro LEDs are to be transferred. (6) Red micro LEDs are transferred, e.g., by a method described above in association with FIGS. 8A and 8B.

FIGS. 11A-11D illustrate cross-sectional views representing various operation in the fabrication of a micro LED display, in accordance with an embodiment of the present disclosure.

Figure 11A:
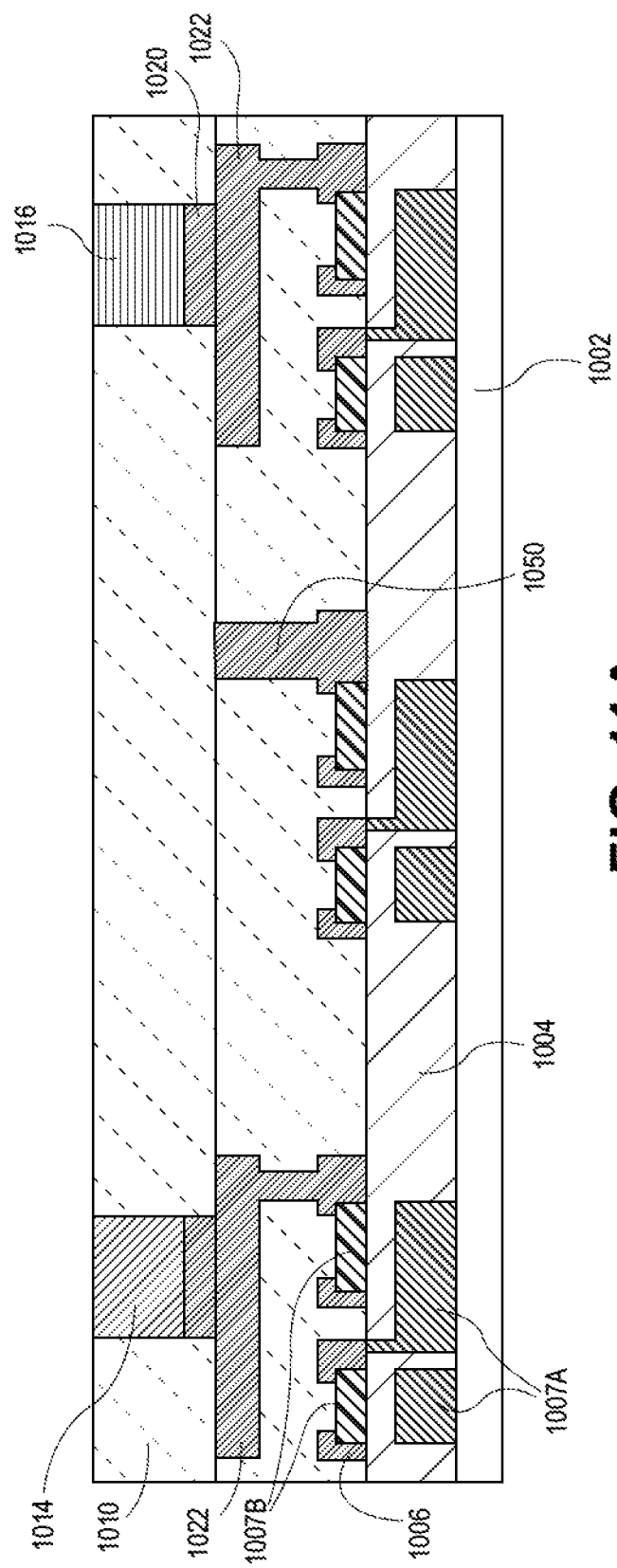
FIGS. 11A-11D illustrate cross-sectional views representing various operations in the fabrication of a micro LED display, in accordance with an embodiment of the present disclosure.
Figure 11B:
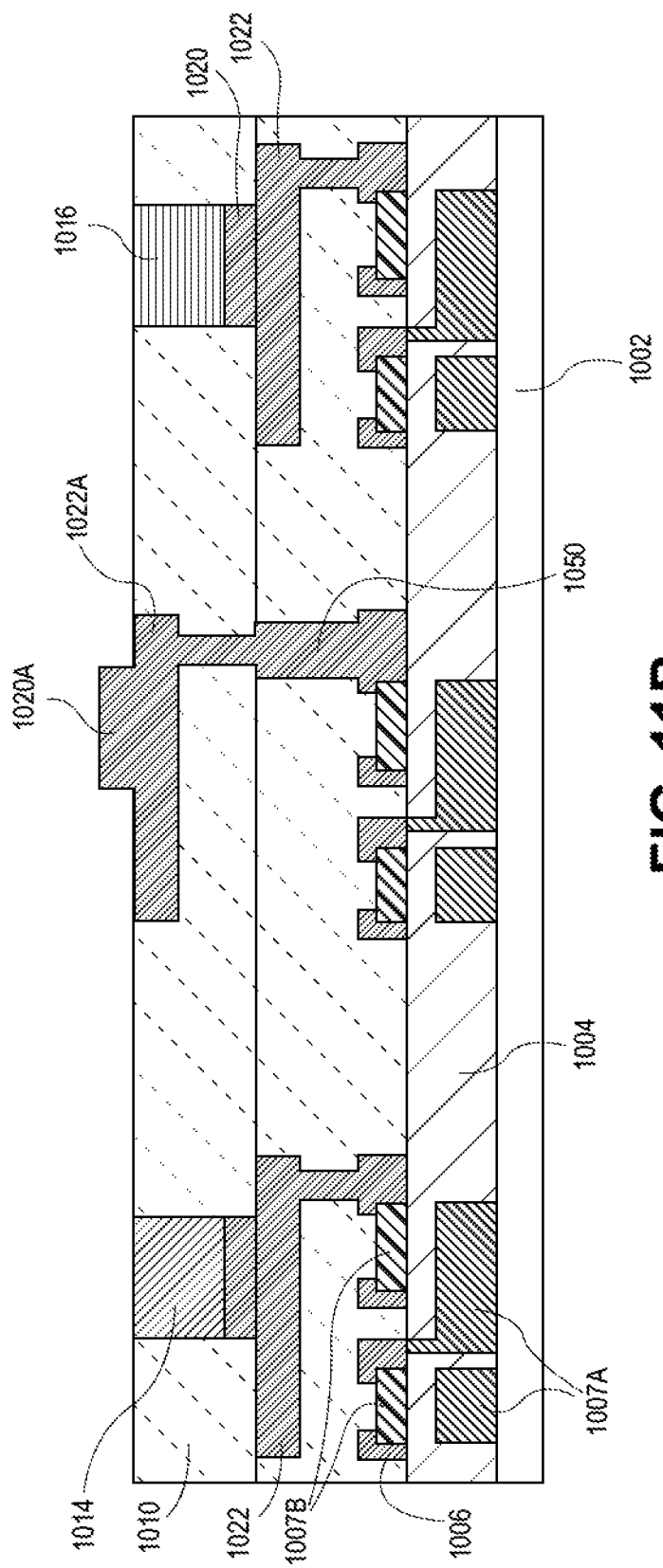
Figure 11C:
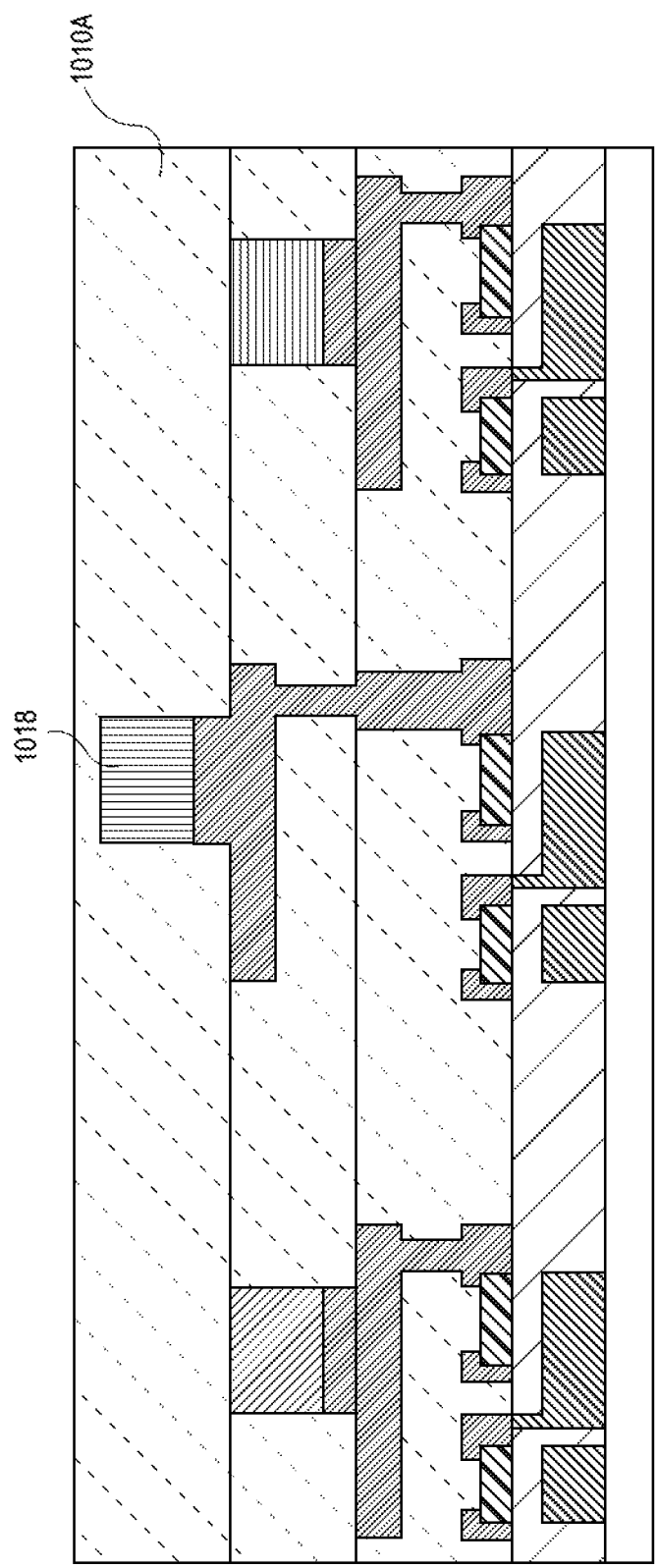
Figure 11D:
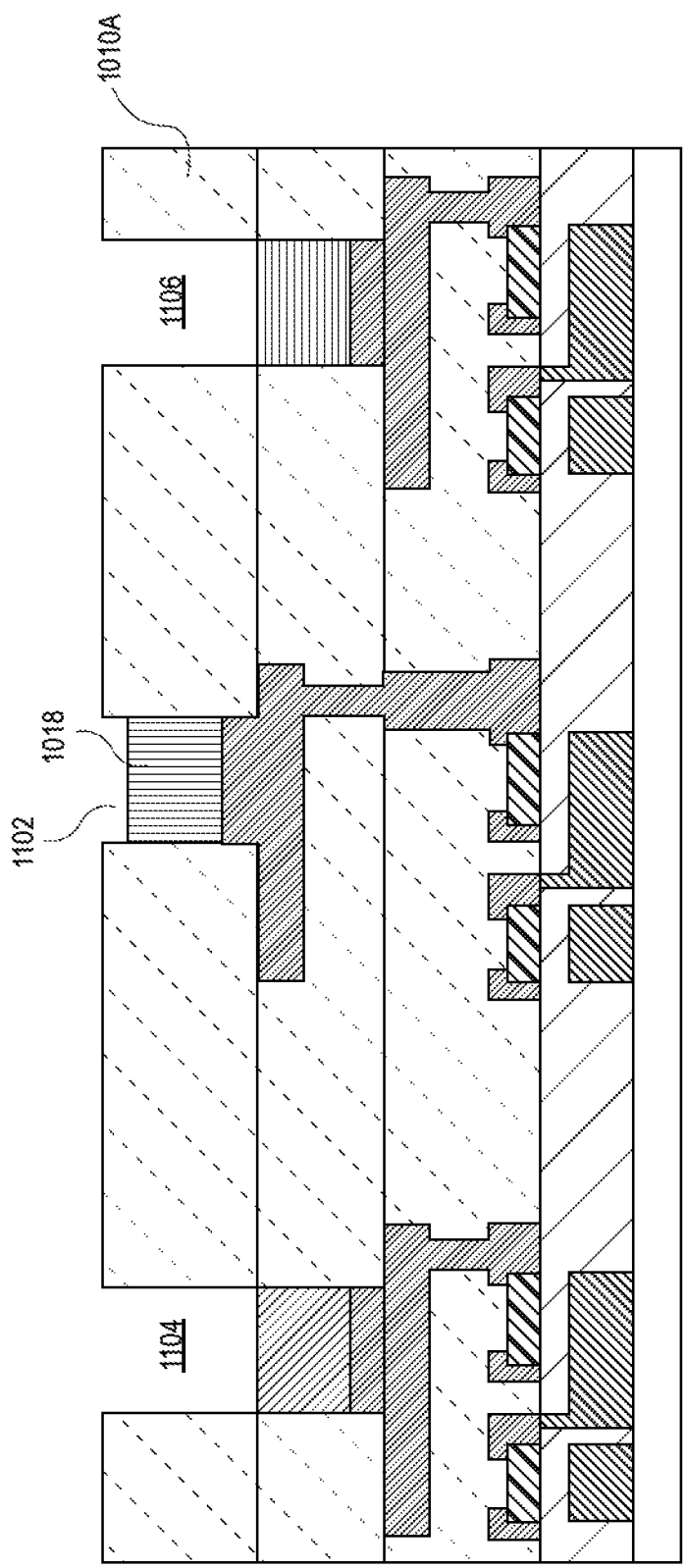

Referring to FIG. 11A, the lower portion of the structure of FIG. 10 is fabricated by transferring green and blue micro LEDs from a wafer, e.g., using a transfer method described in association with FIGS. 8A and 8B. Referring to FIG. 11B, an interconnect via, conductive mirror 1022A and copper pad 1020A are fabricated in a location for transferring red micro LEDs from a "red micro LED wafer". Referring to FIG. 11C, a red micro LED 1018 is transferred from a "red micro LED wafer" e.g., using a transfer method described in association with FIGS. 8A and 8B, and a planarization oxide 1010A is formed over the resulting structure. Referring to FIG. 11D, contact trenches 1102, 1104, and 1106 are formed over the green LED, red LED and blue LED, respectively. Subsequently, deposition of a transparent conductive oxide (TCO) is performed to provide a common cathode, resulting in structure 1000 of FIG. 10.

In an embodiment, as described above, copper via and pad formation as depicted in FIG. 11B is performed for ultimately attaching a red micro LED after green and blue micro LEDs have been attached to the display backplane. In one embodiment, damascene process technology is used to form Cu metal pads for received red micro LEDs. Furthermore, it is to be appreciated that instead of using solid-state "red" micro LEDs, in another embodiment, red LED 1018 is an OLED (micro Organic LEDs), such as an OLED manufactured on 300 mm wafers and transferred using a "Direct Transfer Method" to the backplane after forming the via for the red emitter.

In a third aspect, micro LED displays, pixel architectures, and their methods of manufacturing are described In an embodiment, micro LEDs are arranged in a matrix. The micro LEDs are driven through "Data Driver" and "Scan Driver" chips. Thin film transistors are used to make "pixel driver circuits" for each micro LED. The micro LEDs are made on a silicon wafer then transferred to a glass substrate called "backplane" where the "pixel driver circuits" have been fabricated using thin film transistors.

Figure 12:
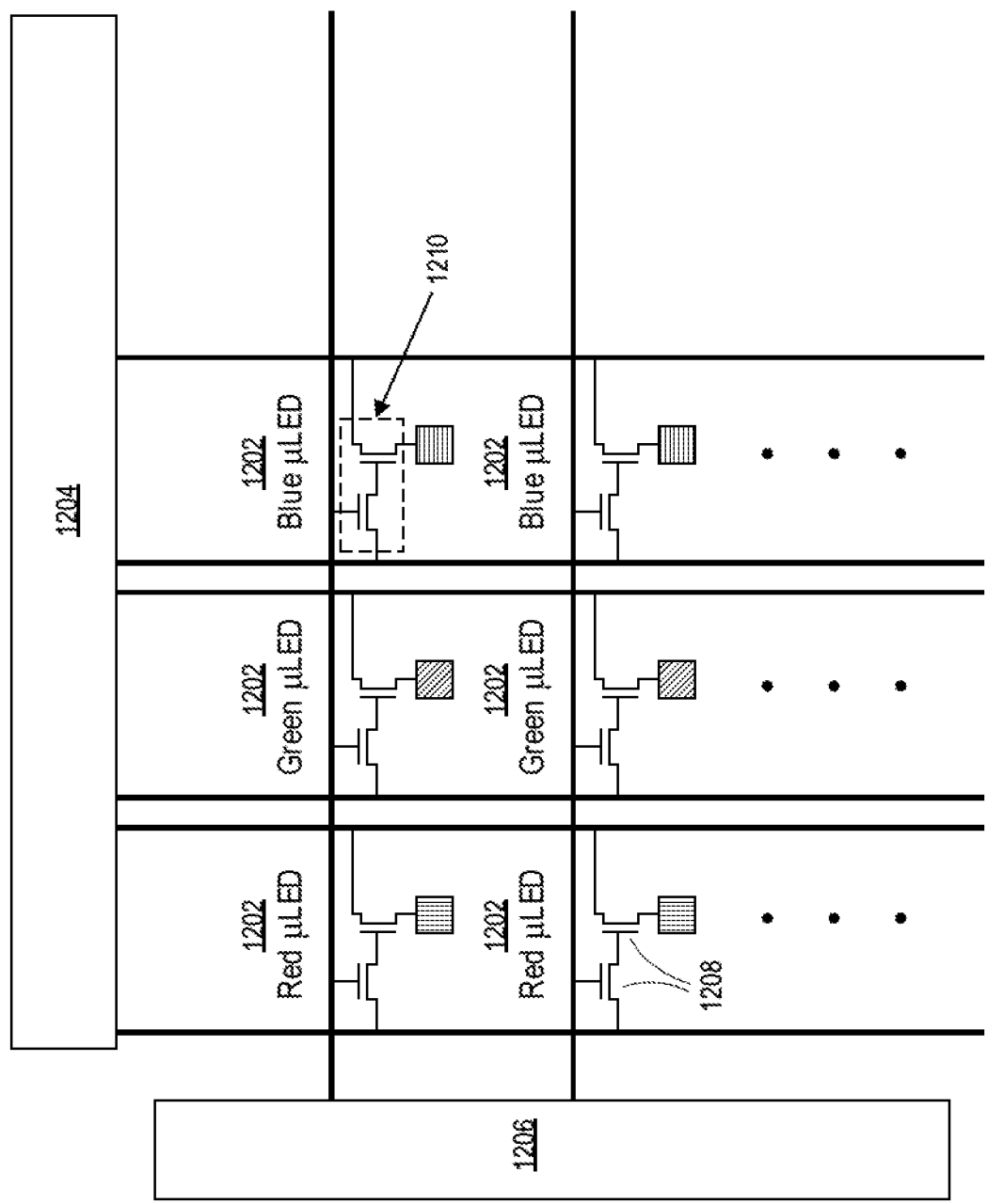
FIG. 12 is a schematic illustration of a micro light emitting diode (LED) display architecture, in accordance with an embodiment of the present disclosure.

As an example, FIG. 12 is a schematic illustration of a micro LED display architecture, in accordance with an embodiment of the present disclosure. Referring to FIG. 12, micro LEDs 1202 are arranged in a matrix. The micro LEDs are driven through "Data Driver" 1204 and "Scan Driver" 1206 chips. Thin film transistors 1208 are used to make "pixel driver circuits" 1210 for each micro LED. In an embodiment, the micro LEDs are fabricated on a silicon wafer then transferred to a glass substrate called "backplane" where the "pixel driver circuits" 1210 have been fabricated using thin film transistors.

Figure 13A:
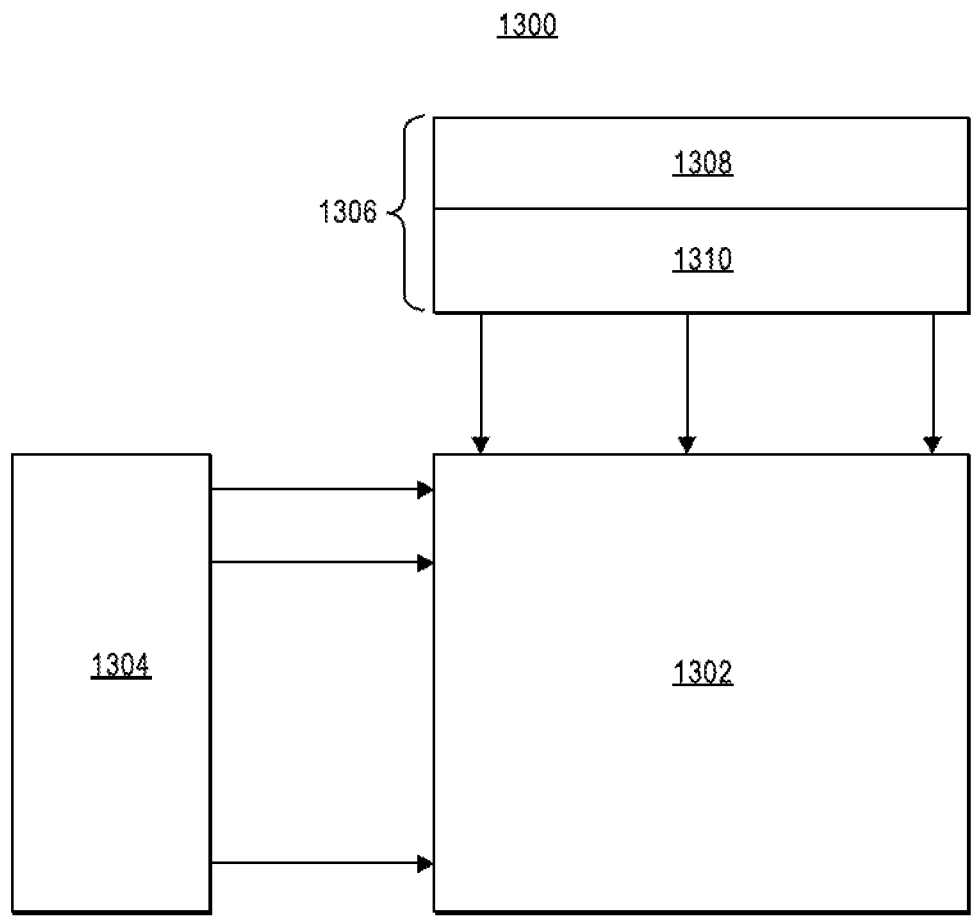
FIG. 13A is a block diagram of driver electronics architecture, in accordance with an embodiment of the present disclosure.

In accordance with one or more embodiments of the present disclosure, a pulse amplitude modulation driving scheme and circuit are described. For example, FIG. 13A is a block diagram 1300 of driver electronics architecture, in accordance with an embodiment of the present disclosure. Referring to the display system schematic of FIG. 13A, a μLED array 1302 (such as LED) is driven by a row driver 1304 and a column driver 1306. Each column driver 1306 has a 8 bit SRAM 1308 and a 256 bit DAC or 10 bit PAM 1310. The output of the DAC 1310 is a pulse having an amplitude determined by the current density required to achieve peak power efficacy. The width of the pulse is a function of the integrated current density needed by the micro LED to achieve a desired gray level and brightness.

Figure 13B:
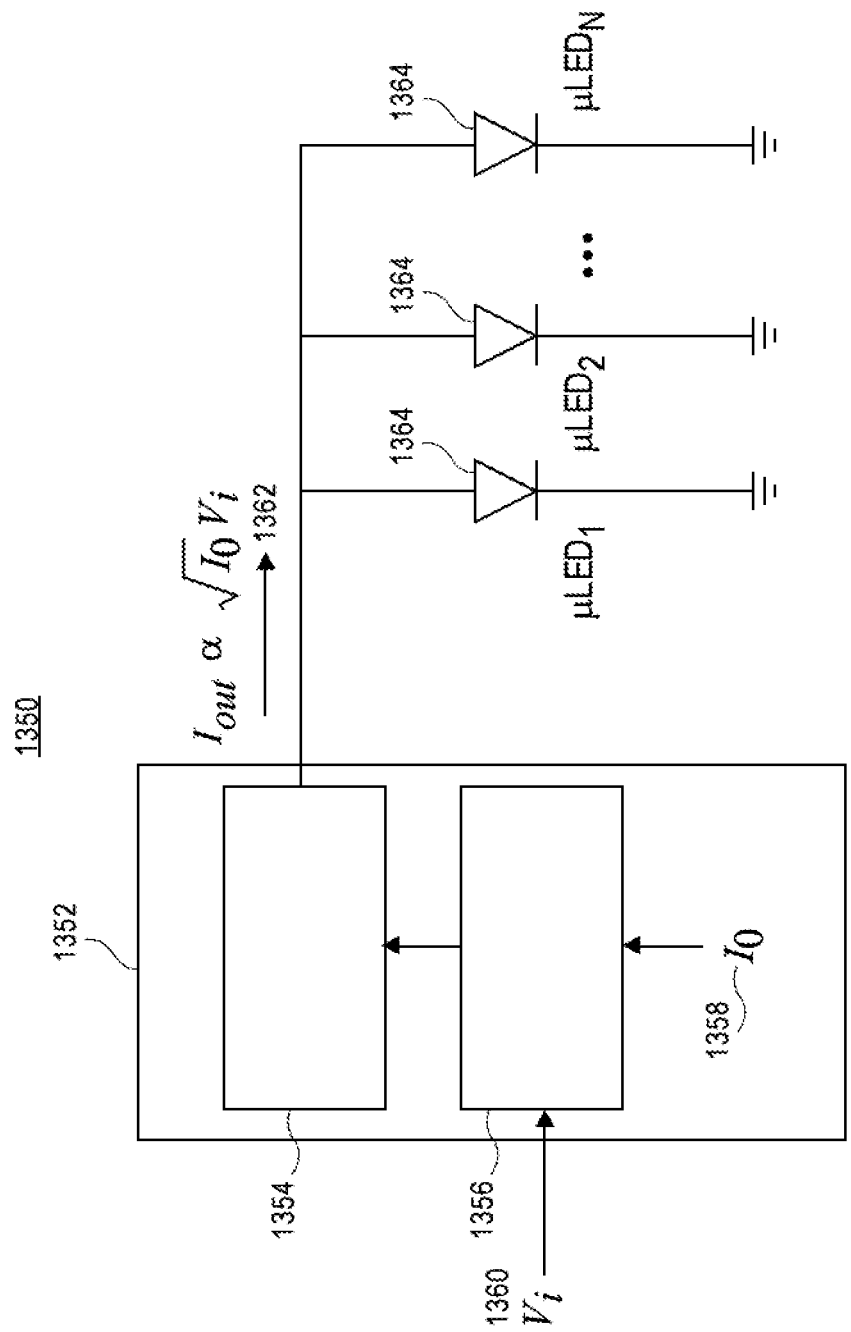
FIG. 13B is a block diagram of a pixel circuit including a linearized transconductance amplifier, in accordance with an embodiment of the present disclosure.

FIG. 13B is a block diagram of a pixel circuit including a linearized transconductance amplifier, in accordance with an embodiment of the present disclosure. Referring to FIG. 13B, a circuit 1350 includes a pixel circuit 1352. Pixel circuit 1352 includes a current mirror 1354 and a linearlized transconductance amplifier 1356. A pulsed current source 1358 is provided. Input data 1360 is input to pixel circuit 1352. Output data 1362 is output from pixel circuit 1352 and used to drive one or more micro LED devices 1364.

It is to be appreciated that the manufacturing of micro LED displays requires appropriate pixel structure for a given micro transfer technology. Previous approaches have focused on transfer methods that result in a common cathode display architecture. There is a need for a pixel architecture that allows the use of micro LED mass transfer using transfer technologies that imply a common anode configuration.

In accordance with one or more embodiments, wafer-to-wafer bonding equipment and process technologies is used to directly transfer micro LEDs from source wafer to target display backplane substrate. A multiple display pixel architecture having more than two micro LED per color per pixel is used to reduce the overall defect density on the produced display. Pixel driver circuits are implemented to accommodate a common anode configuration that results from a micro LED mass transfer method.

Advantages to implementing one or more embodiments described herein can include: low manufacturing cost (accomplished by transferring the red-green-blue micro LED pixels in one pass from silicon wafer to a "standard" display backplane), high (due to the micro LED redundancy and pixel architecture proposed), and/or lower risk on equipment development.

It is to be appreciated that approaches for fabricating a micro LED may include the use of red, green and blue micro LEDs fabricated from gallium nitride (GaN). Advantages of implementing one or more embodiments described herein may include one or more of, but need not be limited to, (1) improved light extraction, (2) a significant reduction in internal reflectivity, or (3) enhanced transmission, which serves to assist with light extraction from the device. Embodiments described herein may be implemented to enable large scale μLED display manufacturing that brings together three major separate technologies and supply chain bricks: (1) micro LED manufacturing, (2) display manufacturing, and (3) transfer technology tool manufacturing. In a typical display, each pixel is constituted of Red, Green and Blue (RGB) subpixels controlled independently by a matrix of transistors. The idea behind μLED displays is to use individual, small LED chips as the sub-pixel. Unlike OLEDs, inorganic LED require high processing temperatures (e.g., greater than 1000° C.) and cannot be "grown" and patterned directly on top of the transistor matrix. In most cases, the micro LED chips are therefore manufactured separately then positioned and connected to the transistor matrix via a pick and place process. Many companies and research organizations are currently working on μLED displays. However, volume production at costs compatible with the applications still face multiple engineering and manufacturing challenges. Such challenges include: LED epitaxy quality and homogeneity, efficiency of very small μLEDs, sidewall effects, massively parallel chip transfer technologies (e.g. pick and place) with position accuracy and high throughput, cost, handling of small die, etc., interconnects, color conversion, defect management, supply chain, and cost of production.

Micro LED (μLED) display is a type of emissive display technology that uses a matrix of individually-switched self-illuminating inorganic diodes that can be controlled and lit without a master backlight. Inorganic μLEDs have a number of potential advantages over organic LEDs (OLEDs) for display applications including high brightness, longer lifecycle, and imperviousness to image sticking and burn in. Typically, in μLED displays, a desired color and luminance value are created from various combinations of three colors of light emitting elements (red, green and blue).

It is to be appreciated that due to the inorganic nature of the emitting materials of micro LEDs versus OLEDs, the efficiency and narrow emission bands of μLEDs also offer the prospect of significantly improved performance in terms of: energy consumption, color gamut, brightness, contrast (High Dynamic Range), long lifetime and environmental stability (not sensitive to air, moisture), and compatibility with flexible backplane technologies to enable curved or flexible displays. In addition, μLEDs can deliver extremely high pixel density (up to 5000 PPI).

In a particular embodiment, upon fabrication of a micro-LED wafer, in order to fabricate a micro-LED based display, a transfer method is used in which micro-LEDs are transferred from a source wafer to a carrier wafer and then bonded with a target display backplane with the assistance of precise alignment, thermal compression bonding and selective release using an ultra-violet (UV) source as a source to release select one of the LEDs. In an example, FIG. 14 illustrates a cross-sectional view of a schematic of a display bonder apparatus, in accordance with an embodiment of the present disclosure.

Figure 14:
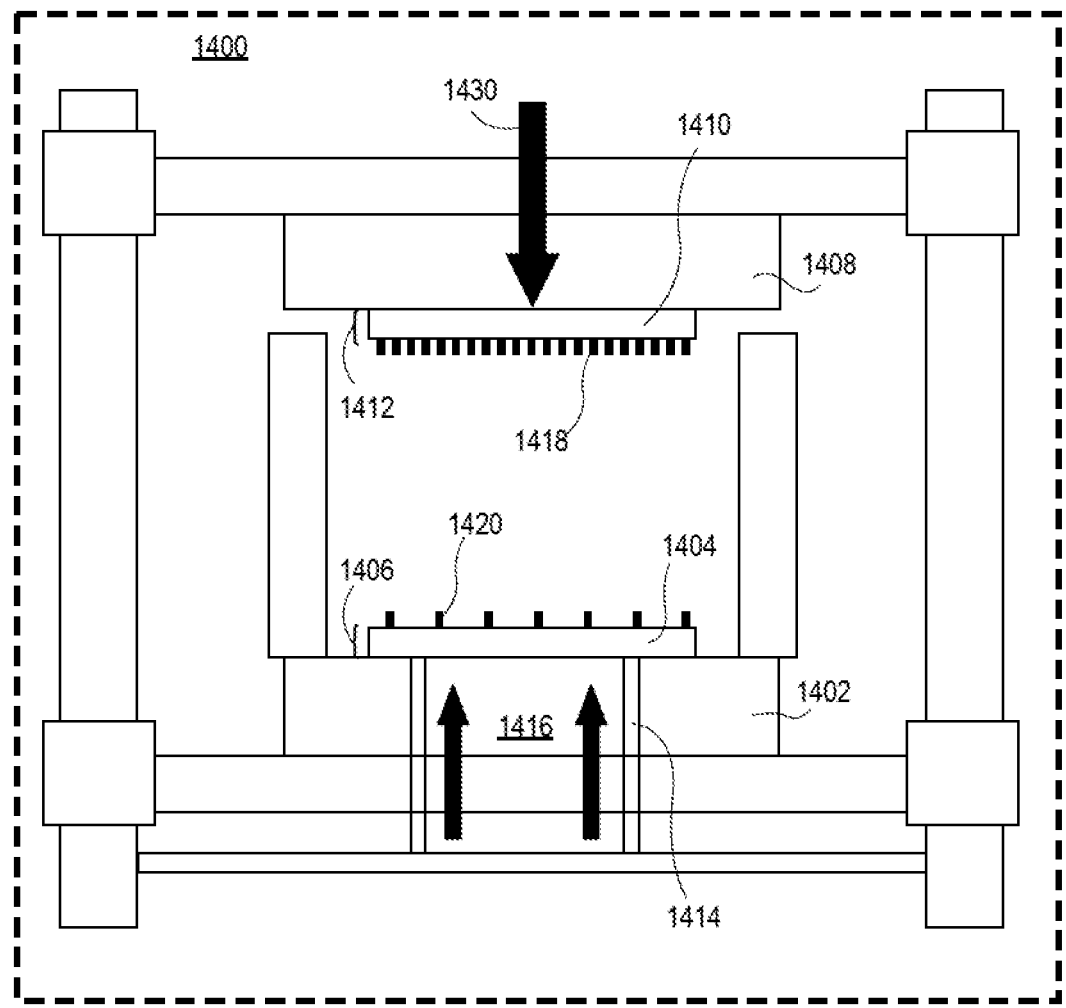
FIG. 14 illustrates a cross-sectional view of a schematic of a display bonder apparatus, in accordance with an embodiment of the present disclosure.

Referring to FIG. 14, a display bonder apparatus 1400 includes a first support 1402 for holding a display backplane substrate 1404 in a first position 1406. A second support 1408 is for holding a silicon wafer 1410 in a second position 1412. The second position 1412 is over the first position 1406. In one embodiment, a piston 1414 is coupled to the first support 1402. The piston 1414 is for moving the display backplane substrate 1404 from the first position 1406 toward the second position 1412. Further, the piston 1414 applies a force 1416 to the display backplane substrate 1404 to bond light-emitting diode (LED) pixel elements 1418 on the silicon wafer 1410 to metal bumps 1420 on the display backplane substrate 1404. In an embodiment, the display bonder apparatus further includes an ultra-violet (UV) source 1430 coupled to the second support 1408.

In an embodiment, the display bonder apparatus 1400 is used in a transfer process where a micro LED source wafer is brought into contact with a display substrate having metal bumps, such that the micro LED metal contacts and backplane metal bumps are opposite to one another. The bonding process involves orienting the two substrates (source wafer and display substrate) parallel to one another and compressing the two substrates together by applying force 1416 on the outer surface of the display substrate. The force 1416 may be applied to the center of the display substrate with a piston-type mechanism. The bonder apparatus 1400 may provide precise bonding and may be suitable for bonding one substrate pair at a time. The bonding apparatus may be provided with a vacuum chamber (or any controlled atmosphere) and an aligner. The substrates may be aligned in the aligner, loaded in the controlled atmospheric chamber (vacuum/other), and thereafter bonded to each other.

In another embodiment, a micro transfer process flow includes: (1) Blue chips, monolithic RGB or monolithic GB chips are fabricated on silicon wafers. (2) Micro LEDs on the source "silicon" wafer are all transferred to a temporary glass carrier wafer that is transparent to UV light. (3) The temporary glass wafer is aligned in close proximity to the target display substrate (e.g., backplane) in a wafer-to-wafer bonder tool. (4) Thermocompression bonding (TCB) is then used to bond micro LEDs to metal pad bumps on the target substrate, which may be performed at a temperature less than 400° C. (5) After bonding of micro LED RGB chips from the temporary glass wafer to first target display substrate, micro LED RGB chips are detached (de-bonded or released) selectively from the source wafer using UV radiation through the glass wafer. (6) A second target display substrate is brought in close proximity of the temporary glass wafer but with a misalignment that is exactly equivalent to the RGB chip pitch on the source wafer in order to pick new RGB chips from source glass wafer to second target display substrate (backplane). The necessary alignment may be performed using infrared imaging, optical, or mechanical approaches. In another embodiment, a method involves transferring micro LEDs to a carrier substrate (e.g., glass).

Figure 15A:
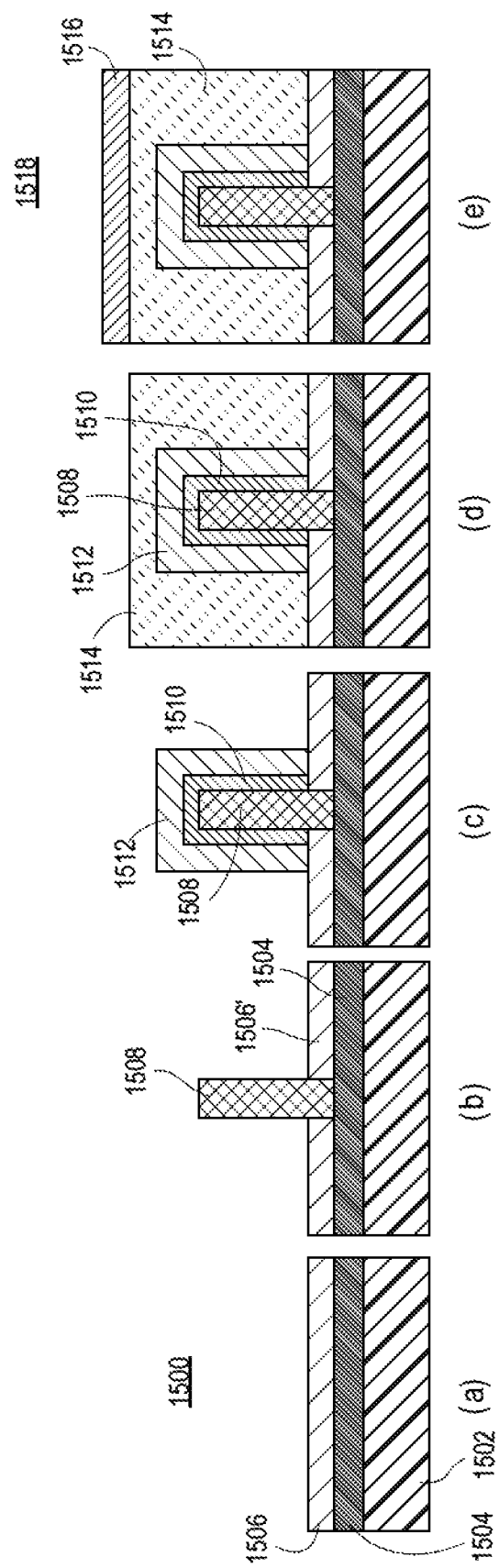
FIGS. 15A and 15B illustrate cross-sectional views of a method of fabricating and transferring a pixel structure, in accordance with an embodiment of the present disclosure.
Figure 15B:
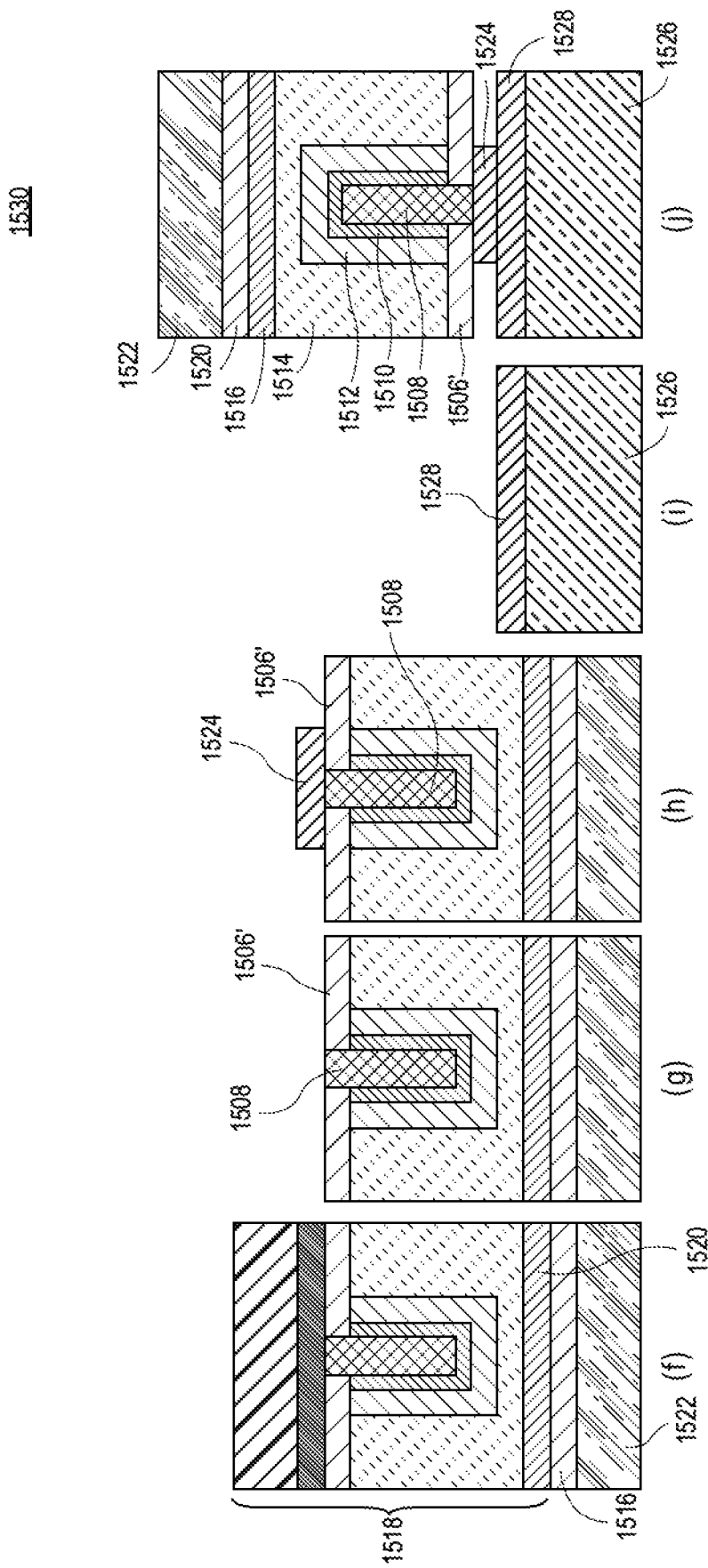

As an exemplary display assembly process, FIGS. 15A and 15B illustrate cross-sectional views of a method of fabricating and transferring a pixel structure, in accordance with an embodiment of the present disclosure.

Referring to part (a) of FIG. 15A, an exemplary method of fabricating RGB chips on a silicon wafer and then transferring the RGB chips to a display backplane begins with a starting structure 1500. Starting structure 1500 includes a silicon wafer 1502, a nucleation layer 1504 (e.g., an aluminum nitride/titanium nitride stack), and silicon nitride mask layer 1506. Referring to part (b) of FIG. 15A, lithography is used to form openings in the silicon nitride mask 1506 to form patterned silicon nitride mask 1506', the openings each having a diameter of approximately 100 nanometers. GaN nanowires 1508 are then epitaxially grown in the openings. Referring to part (c) of FIG. 15A, epitaxy is used to grow a multi quantum well (MQW) layer or stack 1510 (e.g., MQW=InGaN/GaN stack) and a cladding layer 1512, such as a P-type GaN cladding layer. Referring to part (d) of FIG. 15A, a transparent metal layer 1514, such as Indium Tin Oxide (ITO), is deposited. Referring to part (e) of FIG. 15A, an adhesion layer 1516, such as an amorphous silicon layer, is formed on structure 1518.

Referring to part (f) of FIG. 15B, a glass wafer 1522 coated with an adhesion layer 1516, such as an amorphous silicon layer is bonded to the structure 1518 of part (e) of FIG. 15A, e.g., using thermocompression bonding (TCB) at a temperature of, for example, less than 600 degrees Celsius. Referring to part (g) of FIG. 15B, the silicon wafer 1502 and the nucleation layer 1504 are removed, e.g., using IR laser ablation or wafer grinding. Referring to part (h) of FIG. 15B, a contact metal 1524, such as copper, is formed (e.g., by deposition and patterning) to contact the GaN nanowire 1508. Referring to part (i) of FIG. 15B, a backplane 1526 having a layer of conductive bumps 1528, e.g., a layer of copper bumps, is provided. Referring to part (j) of FIG. 15B, TCB is used to bond for, e.g., Cu-to-Cu bonding (without the use of solder or gold) at a temperature of, for example, less than 450 degrees Celsius to provide structure 1530. Although not depicted, UV irradiation through the glass wafer 1522 can be used to "selectively release" the micro LEDs that are already bonded to the display backplane. In an embodiment, selective release is achieved by either using masks or UV laser placement controls.

It is to be appreciated that numerous structures of the type 1530 may be included on a single backplane 1526. For example, FIG. 16 illustrates cross-sectional views of structures 1600 and 1602 having two micro LEDs at a stage of manufacturing corresponding to part (e) of FIG. 15A and part (f) of FIG. 15B, respectively, in accordance with an embodiment of the present disclosure. Referring to FIG. 16, individual LEDs may be separated from one another by etching a well through the transparent metal layer 1514, through the silicon nitride layer 1506' and through the nucleation layer 1504.

Figure 17:
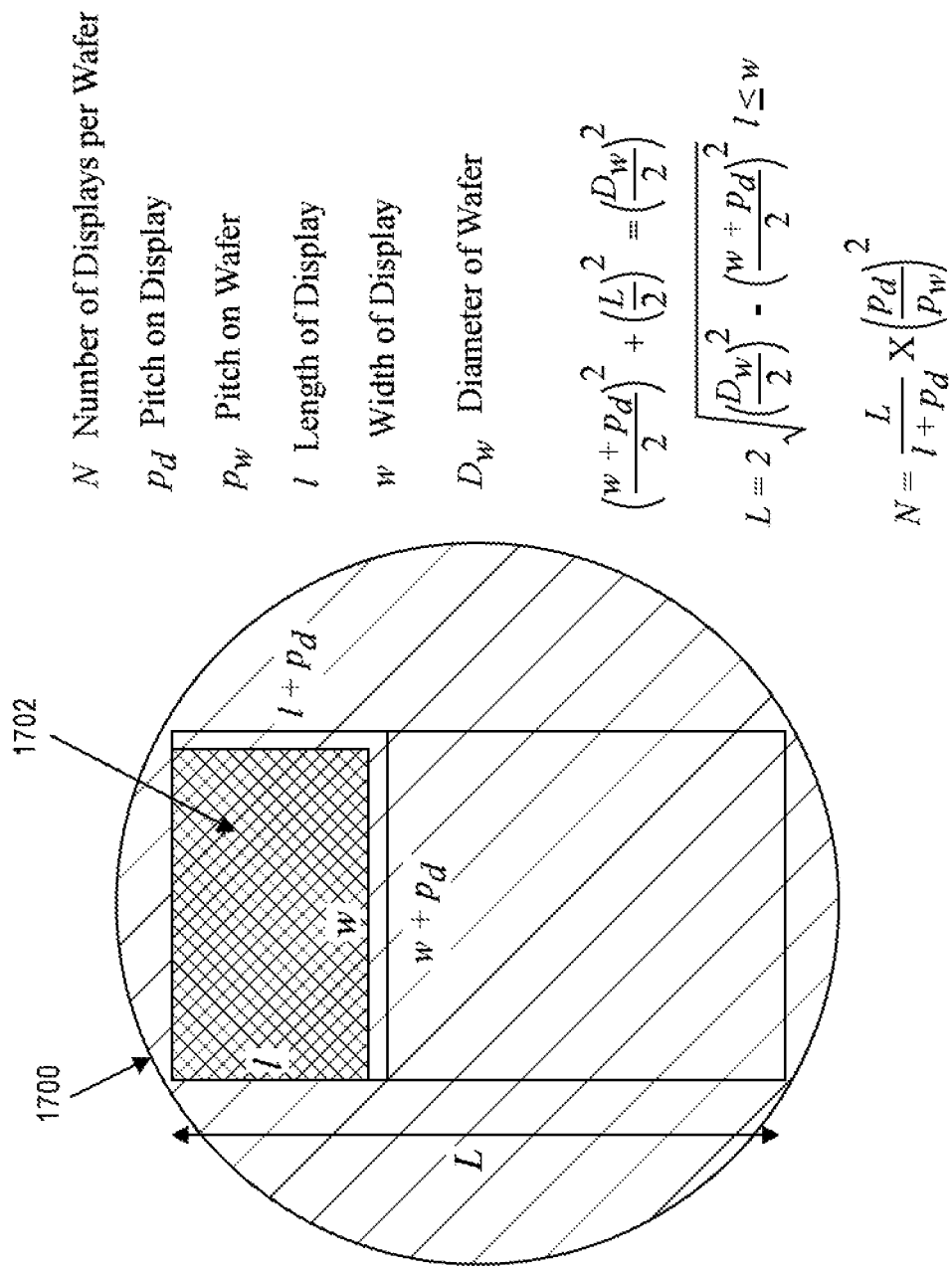
FIG. 17 is a schematic and related formulas illustrating parameters associated with an operation of bonding multiple rectangle displays from one round wafer, in accordance with an embodiment of the present disclosure.

FIG. 17 is a schematic and related formulas illustrating parameters associated with an operation of bonding multiple rectangle displays 1702 from one round wafer 1700, in accordance with an embodiment of the present disclosure. Referring to FIG. 17, display-to-micro LED bonding is based on a display backplane that is rectangular in shape while the temporary glass wafer 1700 is circular in shape. Depending on the display size and wafer diameter, the number of displays that can be made from one wafer 1700 can be determined. For example, if the display diagonal is 7 inches and the wafer diameter is 12 inches, approximately 20 displays per wafer can be fabricated if the pixel density is approximately 420 pixel per inch.

Figure 18:
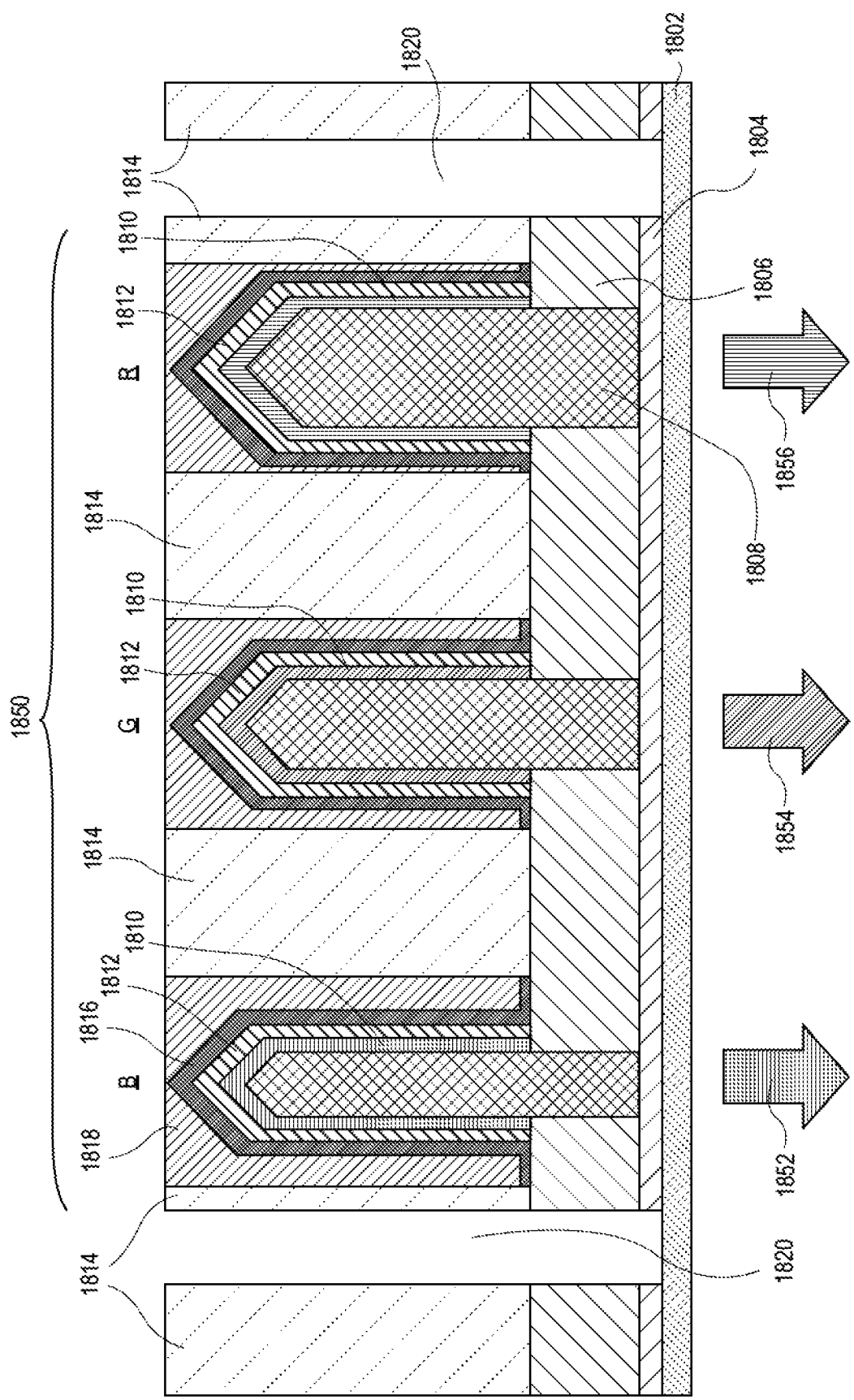
FIG. 18 illustrates a cross-sectional view of a red-green-blue subpixel (an RGB subpixel) with three nanowire LEDs, in accordance with an embodiment of the present disclosure.

FIG. 18 illustrates a cross-sectional view of a red green blue subpixel (an RGB subpixel) with three nanowire LEDs, in accordance with an embodiment of the present disclosure. Referring to FIG. 18, although shown as three different color micro-LEDs across (e.g., blue, green, red from left-right), the three are shown in this manner for illustrative purposes only. It is to be appreciated that for a pixel such as a 2×2 pixel element, only two micro LEDs would be viewable for a given cross-section. It is to be appreciated that a variety of arrangements of micro LEDs may be suitable to make a single pixel. In one embodiment, three micro LEDs are arranged side-by-side, as depicted in FIG. 18. In another embodiment, four micro LEDs are arranged in a 2×2 arrangement. In another embodiment, nine micro LEDs are arranged in a 3×3 arrangement (three red micro LEDs, three green micro LEDs, and three blue micro LEDs), etc. It is to be appreciated that a micro LED is composed of an array of nanowire LEDs. The number of nanowire LEDs per one micro LEDs is at least one. For example, a 10 micron×10 micron micro LED may be composed of 90 nanowire LEDs connected in parallel to emit light of a specific color. It is further to be appreciated that, with respect to FIG. 18, the micro LEDs are represented by one nanowire each for illustrative purposes. This in general is not the case. Typically, one micro LED will be composed of more than one nanowire LED. Also, in FIG. 18, one example arrangement is shown. That is, the three colors are adjacent to each other. However, in some cases, the micro LEDs of different colors are separated on the source wafer by a distance that may be half of the display pixel pitch, for example.

With reference again to FIG. 18, in a particular embodiment, a source micro LED wafer (such as a silicon wafer) has "RGB Chips" monolithically grown thereon. The silicon wafer is first coated with an aluminum nitride (AlN) buffer layer 1802, e.g., having a thickness of approximately 50 nanometers. The AlN buffer layer 1802 may have a bandgap of about 6 eV and may be transparent to infrared radiation. A metal-based nucleation layer (MNL) 1804 is then deposited on the AlN buffer layer 1802. The MNL 1804 may have a thickness in the range of 30-100 nm and may be crystalline or polycrystalline. A silicon nitride mask 1806 is then deposited on the MNL 1804. Lithography may then be used to open apertures in the silicon nitride mask 1806 with diameters carefully chosen to accommodate the subsequent formation of LEDs that emit red, green, and blue colors. N-type GaN nanowire cores are then grown, e.g., by metal organic chemical vapor deposition (MOCVD), as seeded from the MNL 1804. The nanowire cores may have diameters in the range 50 nm to 250 nm.

In an embodiment, after fabrication of further LED layers, example of which are described below, the starting source micro LED wafer (such as a silicon wafer) is removed to leave the layers 1802 and 1804 exposed. In one such embodiment, blue light 1852 may be emitted from LED (B) in the direction of the arrow, green light 1854 may be emitted from LED (G) in the direction of the arrow, and/or red light 1856 may be emitted from LED (R) in the direction of the arrow.

Referring again to FIG. 18, indium gallium nitride (InGaN) shells 1810 are grown around the GaN cores 1808, e.g., using MOCVD. The amount of indium in the InGaN shells 1810 depends on the GaN core diameter. In an embodiment, smaller core diameter result in the growth of InGaN shells with smaller indium content. Larger core diameters result in the growth of InGaN shells with larger indium content. For blue (B) color emission, the indium content is approximately 20% (e.g., $In_{0.2}Ga_{0.8}N$). For green (G) color emission, the indium content is approximately 30% (e.g., $In_{0.3}Ga_{0.7}N$). For red (R) color emission, the indium content is approximately 40% (e.g., $In_{0.4}Ga_{0.6}N$). A p-type GaN cladding layer 1812 may then be formed around the InGaN shells 1810, e.g., using MOCVD. The core-shell nanowires are then covered by an insulating material layer 1814, e.g., a silicon oxide (SiOx) layer. A lithography and etch may then be used to expose the p-GaN cladding layers 1812 for all color core-shell nanowire structures. Atomic layer deposition may then be used to conformally deposit a metal layer 1816 on the p-GaN cladding layers 1812. A metal fill process may then be performed to fill in contact metals 1818 for the micro LED structures.

Referring more generally to FIG. 18, a semiconductor structure includes a plurality of pixel elements 1850. Each of the pixel elements 1850 includes a first color nanowire LED, a second color nanowire LED (the second color different than the first color), and a pair of third color nanowire LEDs (the third color different than the first and second colors). A continuous insulating material layer 1814 is laterally surrounding the first color nanowire LED, the second color nanowire LED, and the pair of third color nanowire LEDs. Adjacent pixel elements are separated from one another by a trench 1820 between corresponding continuous insulating material layers 1814. It is to be appreciated that more than three colors may be fabricated. For example, structures may be fabricated for red, green, yellow or blue emission. In another example, structures may be fabricated for red, orange, green, or blue emission.

In an embodiment, for each of the pixel elements 1850, the first color is red, the second color is green, and the third color is blue. In another embodiment, for each of the pixel elements 1850, the first color is red, the second color is blue, and the third color is green. In another embodiment, for each of the pixel elements 1850, the first color is blue, the second color is green, and the third color is red. In an embodiment, for each of the pixel elements 1850, the first color nanowire LED, the second color nanowire LED, and the pair of third color nanowire LEDs have a 2×2 arrangement. In another embodiment, a structure referred to as "monolithic blue and green only" may be fabricated. In such a case, three times as many blue micro LEDs as the green micro LEDs are fabricated. Then, after transfer of the blue and green micro LEDs to the display backplane (at one shot of transfer), quantum dots are added on some of the blue micro LEDs to convert that blue to red color.

Figure 19:
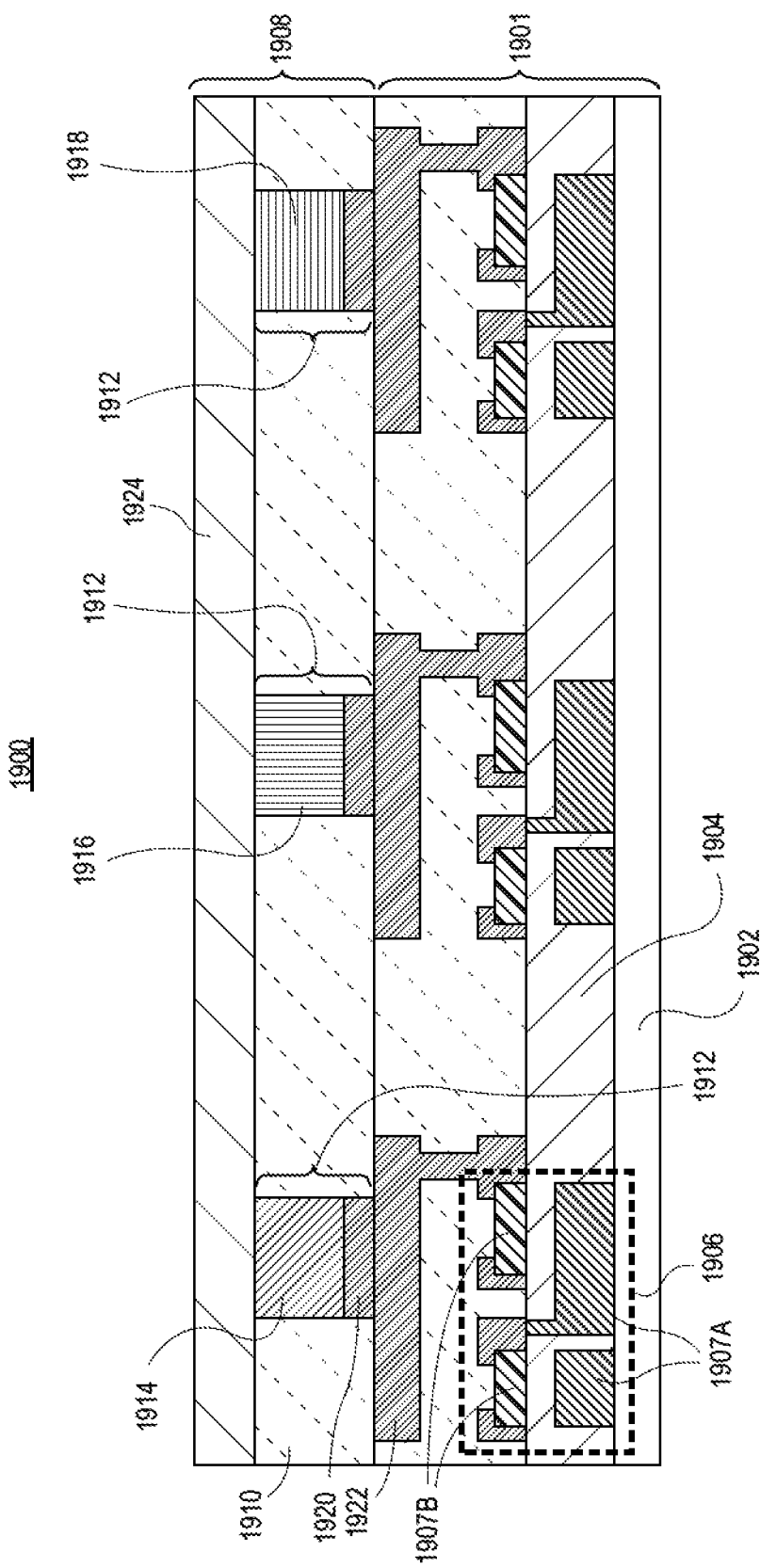
FIG. 19 illustrates a cross-sectional view of a pixel structure having a common anode configuration, in accordance with an embodiment of the present disclosure.

As an exemplary structure, FIG. 19 illustrates a cross-sectional view of a pixel structure having a common anode configuration, in accordance with an embodiment of the present disclosure.

Referring to FIG. 19, a pixel structure 1900 includes a backplane 1901. The backplane 1901 includes a glass substrate 1902 having an insulating layer 1904 thereon. Pixel thin film transistor (TFT) circuits 1906 are included in and on the insulating layer 1904. Each of the pixel TFT circuits 1906 includes gate electrodes 1907A, such as metal gate electrodes, and channels 1907B, such as polycrystalline silicon channels or IGZO channels. A portion of the insulating layer 1904 may act as a gate dielectric for each of the pixel TFT circuits 1906. A conductive mirror 1922 is over each of the TFT circuits 1906.

Referring again to FIG. 19, the pixel structure 1900 includes a front plane 1908 on the backplane 1901. The front plane 1908 includes LEDs in a dielectric layer 1910, such as a carbon-doped oxide layer. In the example shown, three micro LEDs 1912 are included. Each micro LED includes a corresponding micro light emitting diode device 1914, 1916 or 1918 on a conductive interconnect structure 1920, such as a conductive bump. In a particular embodiment, micro light emitting diode devices 1914, 1916 and 1918 are green, red and blue micro light emitting diode devices, respectively. It is to be appreciated that other arrangements may be used, including variation in number and/or colors of micro LED devices included. The front plane 1908 also includes a transparent conducting oxide layer 1924, such as a layer of indium tin oxide (ITO), as a cathode of the pixel structure 1900.

In an embodiment, each of the pixel TFT circuits 1906 is a circuit such as circuit 1350, 2000 or 2200, described herein. In one embodiment, each of the pixel thin film transistor circuits 1906 includes a current mirror and a linearized transconductance amplifier coupled to the current mirror, as described in greater detail below.

In an embodiment, the plurality of micro light emitting diode devices 1914, 1916 and 1918 (right) is a plurality of GaN nanowire-based or nanopyramid-based micro light emitting diode devices. Embodiments described herein may be based only on the backplane 1901 described above. Embodiments described herein may be based only on the front plane 1908 described above.

With reference again to FIG. 19, the anode and cathode contacts of the micro LEDs are shown. A common anode electrode (e.g., indium tin oxide) connects all anodes of all micro LEDs as shown. The cathodes are connected to pixel circuits as shown.

In an embodiment, pixel driver circuits for common anode configuration are described. Currently, low-temperature poly-silicon (LTPS) thin film transistor (TFT) technology is typically used with OLEDs. While LTPS TFTs are appropriate for use in small, high resolution displays for mobile applications (such as smartphones and smartwatches), it is considerably more expensive to produce large area displays (such as laptop displays), particularly compared to amorphous IGZO TFT technology.

Amorphous indium gallium zinc oxide (a-IGZO) TFTs operate only in the n-channel mode. The OLED is typically on the source side of the TFT and has a common cathode architecture. Thus, any variations in the OLED device (i.e.

the pixel) result in variations in the gate potential of the drive TFT, which in turn results non-uniform pixel luminance. An n-channel transistor, with the OLED on the drain side of the pixel circuit with a common anode architecture may be ideally suited for driving active matrix (AM) OLED pixels. However, in the past, it has not been possible to fabricate AM OLED displays with a common anode architecture because of the difficulty in depositing the indium tin oxide (ITO) anode layer on top of the organic layers of the OLED device stack. For example, deposition of an ITO anode layer onto the organic layers can damage the organic layers due to exposure to oxygen during sputter deposition process. Such a restriction does not exist when manufacturing micro LED displays.

Figure 20:
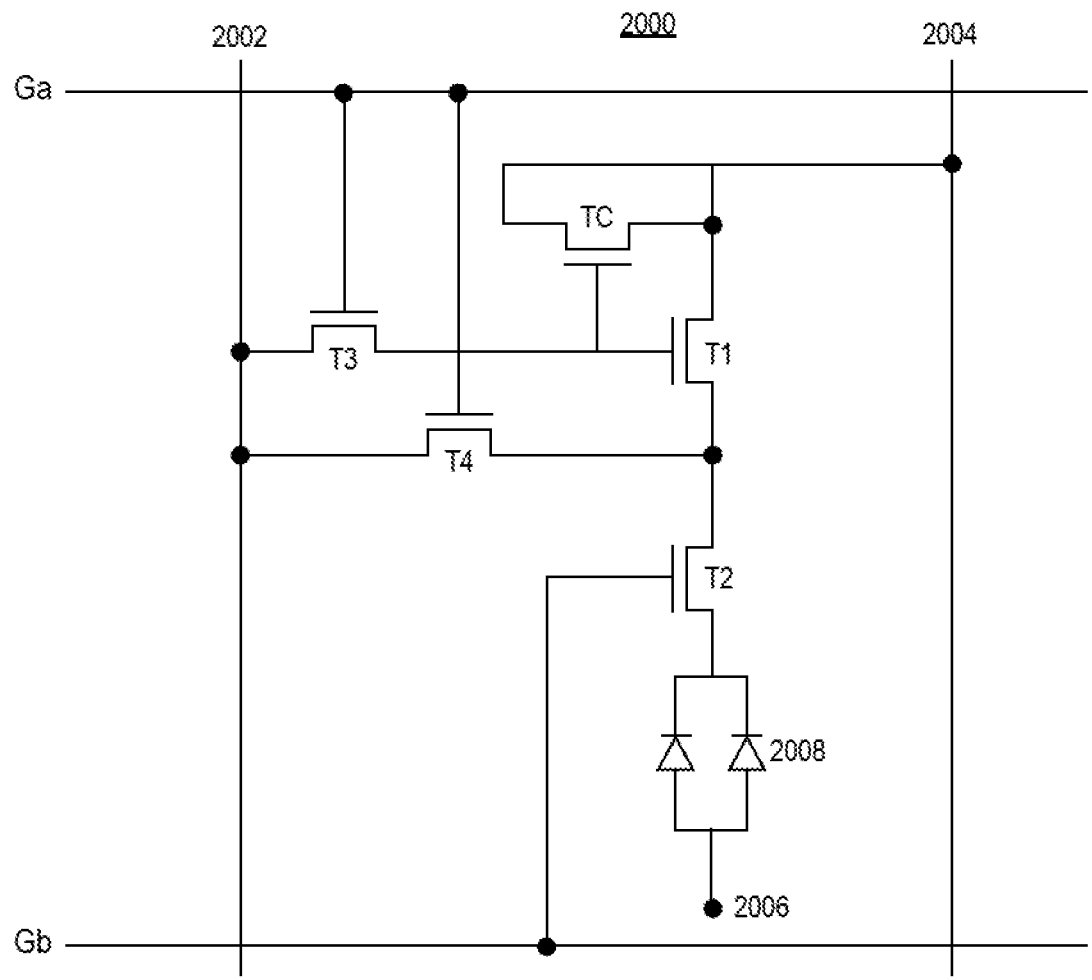
FIG. 20 is a schematic illustration of a pixel driver circuit that works with a common anode configuration, in accordance with an embodiment of the present disclosure.

FIG. 20 is a schematic illustration of a pixel driver circuit 2000 that works with a common anode configuration, in accordance with an embodiment of the present disclosure. The pixel driver circuit 2000 includes a data line 2002, ground 2004, a common anode supply voltage 2006 and micro LEDs 2008, a first scanning line Ga, and a second scanning line Gb. The pixel has a transistor T1 (current-control or first transistor), a transistor T2 (driving or second transistor), a transistor T3 (first switching or third transistor), a transistor T4 (second switching or fourth transistor), a micro LED 2008 and a storage capacitor TC. The gate electrodes of the transistors T3 and T4 are both connected to the first scanning line Ga. One of the source and drain regions of the transistor T3 is connected to the data line 2002 while the other is to the gate electrode of the transistor T1. Meanwhile, one of the source and drain regions of the transistor T4 is connected to the data line 2002 while the other is to the drain region of the transistor T1. The source region of the transistor T1 is connected to the power ground line 2004 while the drain region thereof is connected to the source region of the transistor T2. The gate electrode of the transistor T2 is connected to the second scanning line Gb. The drain region of the transistor T2 is connected to the pixel electrode possessed by the micro LED 2008. The micro LED 2008 has an anode and a cathode. The potential on the anode electrode is kept at a constant value. All transistors are n-channel type. The storage capacitor TC is formed between the gate electrode of the transistor T1 and the power ground line 2004. The storage capacitor TC, provided to maintain a voltage between the gate electrode and the source region of the transistor T1 (gate voltage), is not necessarily provided.

Figure 21A:
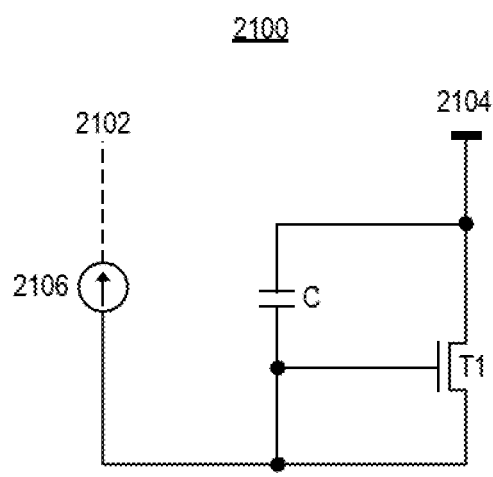
FIGS. 21A and 21B schematically illustrate portions of the circuit of FIG. 20 during a write period or a display period, respectively.
Figure 21B:
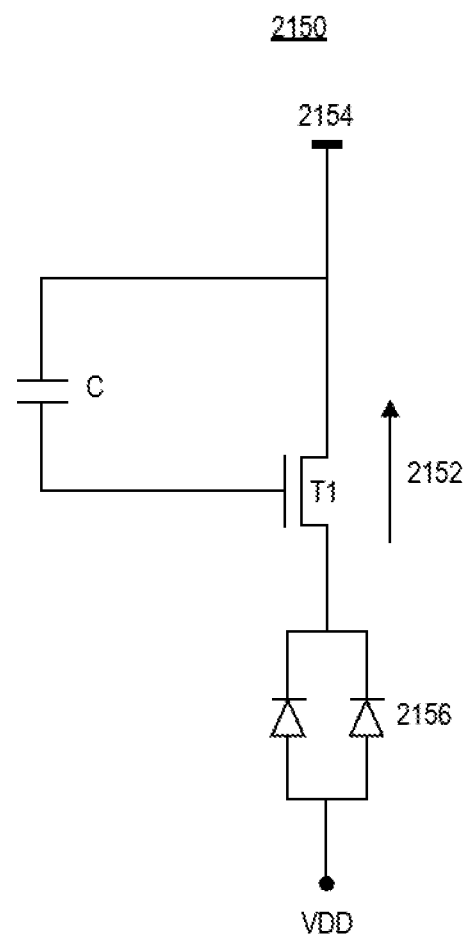

Explanation regarding the drive to the light-emitting device shown in FIG. 20, is made using FIGS. 21A and 21B, which schematically illustrate portions 2100 and 2150 of the circuit of FIG. 20 during a write period or a display period, respectively. In the present mode, the operation of each pixel of the light-emitting device shown in FIG. 20 is explained by separating with a write period Ta and a display period Td. In the write period Ta, the first scanning line Ga is selected. When the first scanning line Ga is selected, the transistors T3 and T4 connected at their gate electrode to the first scanning line Ga turn on. Note that, in the write period Ta, the second scanning line Gb is not selected and hence the T2 is off. On the basis of a potential of a video signal inputted to the signal line drive circuit, constant currents IDATA flow respectively between the data lines 2102 and the power ground lines 2104/2154. Note that, in the description, the current IDATA is referred to as a signal current.

FIG. 21A shows a schematic diagram of the pixel that, in the write period Ta, a constant current IDATA 2106 flows on the data line 2102 (represented by a constant current source). In the write period Ta, the transistors T3 and T4 are in an on state. Accordingly, when a constant current IDATA 2106 flows to the data line 2102, the constant current IDATA 2106 flows between the "source" and the "drain" regions of the transistor T1. At this time, the current IDATA 2106 is controlled in its magnitude by the constant current source so as to operate the transistor T1 in a saturation region. In the saturation region, provided that VGS is a potential difference between the gate electrode and the source region (gate voltage), μ is a transistor mobility, Cox is a gate capacitance per unit area, W/L is a ratio of a channel width W to a channel length L in the channel region, VTH is a threshold value, μ is a mobility and Id is a drain current of the transistor T1, the following Equation is held: IDATA=0.5μ Cox W/L (VGS−VTH)2.

In the above Equation, μ, Cox, W/L and VTH are fixed values as determined by the individual transistor. Meanwhile, the drain current Id of the transistor T1 is held IDATA 2106 by the constant current source. Accordingly, as can be seen from the above Equation, the gate voltage VGS of the transistor T1 is determined by a value of signal current IDATA 2106. When the write period Ta terminates, a display period Td commences. In the display period Td, the first scanning line Ga is not selected but the second scanning line Gb is selected.

FIG. 21B shows a schematic diagram of the pixel in the display period Td. The transistor T3 and the transistor T4 are off. Meanwhile, the transistor T2 is on. In the display period Td, the transistor T1 is maintained with VGS, as it is, determined in the write period Ta. Consequently, the drain current Id in value of the transistor T1 remains at the same value as the signal current IDATA 2152. Meanwhile, because the transistor T2 is on, the drain current Id flows to the micro LED 2156 through the transistor T2. Consequently, in the display period Td, a micro LED drive current having the same magnitude as the signal current IDATA 2152 flows to the micro LED 2156 and the micro LED emits light at a brightness commensurate with the magnitude of the micro LED drive current.

It is to be appreciated that write period Ta and display period Td occur on all the pixels. The timing of occurrence differs from pixel to pixel on each line. Note that, in the description, all the pixels having the same first scanning line or the same second scanning line of among a plurality of pixels possessed by the pixel section are referred to as the pixels on the same line.

In the case with a driving method using an analog video signal (analog driving method), the magnitude of IDATA is determined by the analog video signal to cause the micro LED to emit light at a brightness commensurate with the magnitude of IDATA, thereby providing tonal representation. In this case, one image is displayed by the occurrence of one write period Ta and one display period Td on all the pixels. The duration of from a commencement of write period Ta on any one pixel to a termination of display period Td on all the pixels is referred to as a frame period. The successive frame periods are overlapped with one another. On the other hand, in the case with a time-gray scale driving method using a digital video signal (digital driving method), a write period Ta and display period Td repeatedly occurs during one frame period on each pixel, thereby making it possible to display one image. Where an image is displayed by an n-bit video signal, at least write periods in the number of n and display periods in the number of n corresponding to each bit are provided in one frame period. The write periods (Ta1-Tan) in the number of n and the display periods (Td1-Tdn) in the number of n correspond to each bit of the video signal.

Figure 22:
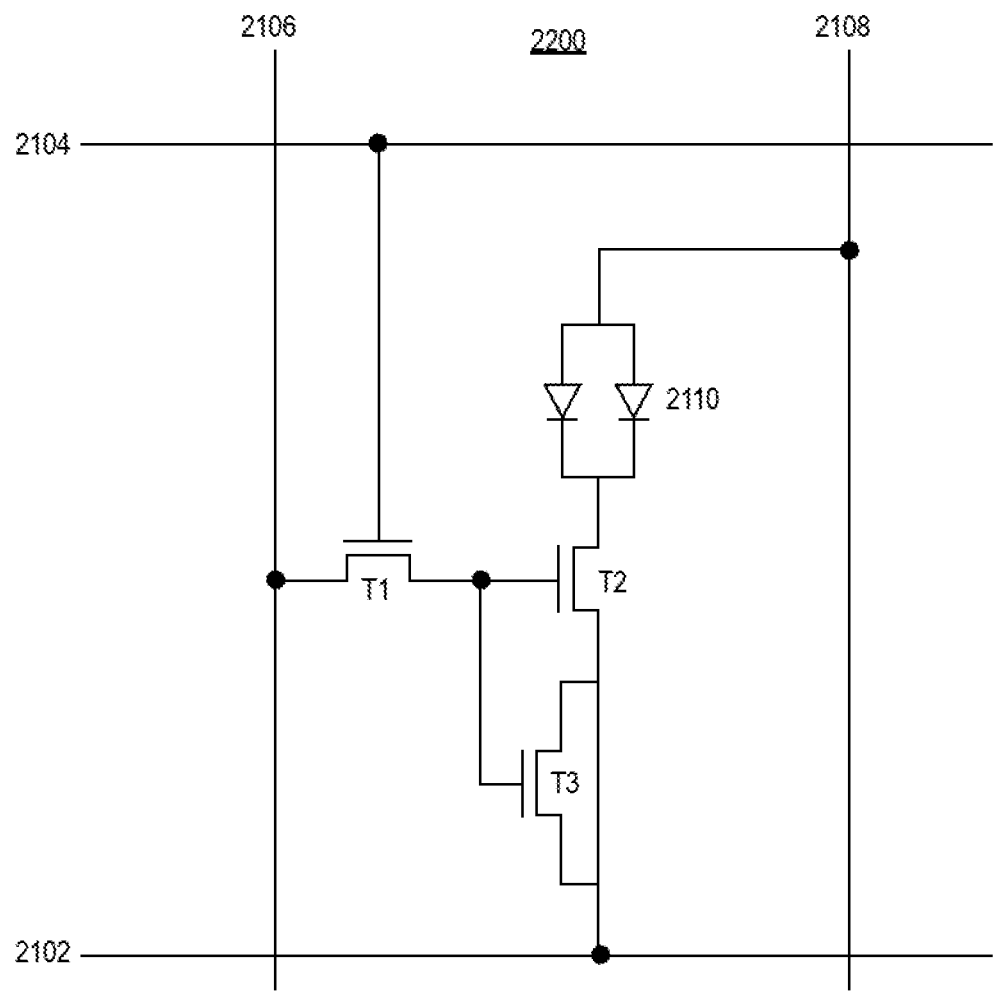
FIG. 22 is a schematic of a pixel driver circuit for use in a common anode micro LED display architecture, in accordance with an embodiment of the present disclosure.

In another embodiment, alternative pixel driver circuits for a common anode configuration are described. For example, another circuit configuration may be used for the common anode architecture shown in FIG. 19. As an example, FIG. 22 is a schematic of a pixel driver circuit 2200 for use in a common anode micro LED display architecture, in accordance with an embodiment of the present disclosure. For circuit 2200, a transistor T3 acts as a storage capacitor. There are two micro LEDs 2110 connected in parallel, representing the redundancy used to ensure that at least one micro LED functions if the other fails (e.g., it does not get transferred from micro LED source wafer to display backplane). Also depicted are a ground line 2102, a scan line 2104, a data line 2106, and a common anode (supply voltage) 2108.

In a fourth aspect, micro LED display and manufacturing apparatuses are described.

To provide context, in a typical display, each pixel is constituted of Red, Green and Blue (RGB) subpixels (emitters) controlled independently by a matrix of transistors. The idea behind μLED displays is to use individual, small inorganic LED chips as the sub-pixels (emitter). Unlike OLEDs, inorganic LED require high processing temperatures (e.g., greater than 1000° C.) and cannot be "grown" and patterned directly on top of the transistor matrix. In most cases, the μLED chips are therefore manufactured separately on a silicon wafer then positioned and connected to the transistor matrix via a pick and place process.

Previous μLED transfer (assembly) methods rely on using manufacturing equipment and methods that are based on small displays (e.g., less than 15.6 inches). However, there is a significant economic benefit (in terms of display production cost and required capital equipment investment) if μLEDs are transferred from silicon wafers (where they are grown at temperatures greater than 1000° C.) to mother glass (e.g., sizes greater than 700 mm×900 mm), then small displays are cut out from the mother glass. In reality, the approach has proved very challenging.

In accordance with an embodiment of the present disclosure, an apparatus such as described in association with FIG. 14 is used. However, in one embodiment, the UV source of FIG. 14 is instead an infrared (IR) source. A μLED source wafer is brought into contact with a display mother glass substrate having metal bumps, so that the μLED metal contacts and backplane metal bumps are opposite to each other. The bonding process involves orienting the two substrates (source wafer and display substrate) parallel to each other and compressing the two substrates together by applying a "force" on the outer surface of the carrier plate. The "Force" is usually applied to the center of the stack with a piston-type mechanism. The bonder apparatus provides precise bonding and is suitable for bonding one substrate pair at a time. The bonding apparatus may be provided with a vacuum chamber (or any controlled atmosphere) and an aligner. The substrates may be aligned in the aligner, loaded in the controlled atmospheric chamber (vacuum/other), and thereafter bonded to each other.

In an embodiment, an approach involves: (1) Blue chips, monolithic red green blue (RGB) or monolithic GB chips are fabricated on silicon wafers. (2) The μLED source wafer is aligned in close proximity to the target display substrate (backplane) in a wafer-to-wafer bonder. (3) Thermocompression bonding (TCB) is then used to bond micro LEDs to metal pad bumps on the target substrate in a manner similar to wafer-to-wafer bonding used in 3D IC manufacturing. The TCB may be performed at a temperature less than 400° C. (4) After bonding of μLED RGB chips from the source silicon wafer to first target part of the mother glass substrate, μLED RGB chips are detached (de-bonded or released) selectively from the source wafer using IR radiation through the silicon wafer. (5) A second micro LED source wafer is brought in close proximity of the mother glass but with a misalignment that is exactly equivalent to the RGB chips pattern on the source wafer in order to pick new RGB chips from source glass wafer to second patch of target mother glass display substrate (backplane). The necessary alignment may be performed using infrared imaging, optical, or mechanical approaches. (6) Operations (3)-(5) are repeated until all the pads on the mother glass receive μLEDs from source wafers. (7) Small displays are cut from mother glass to make PC notebook displays with sizes such as 13.3 inches in diagonal.

Figure 23:
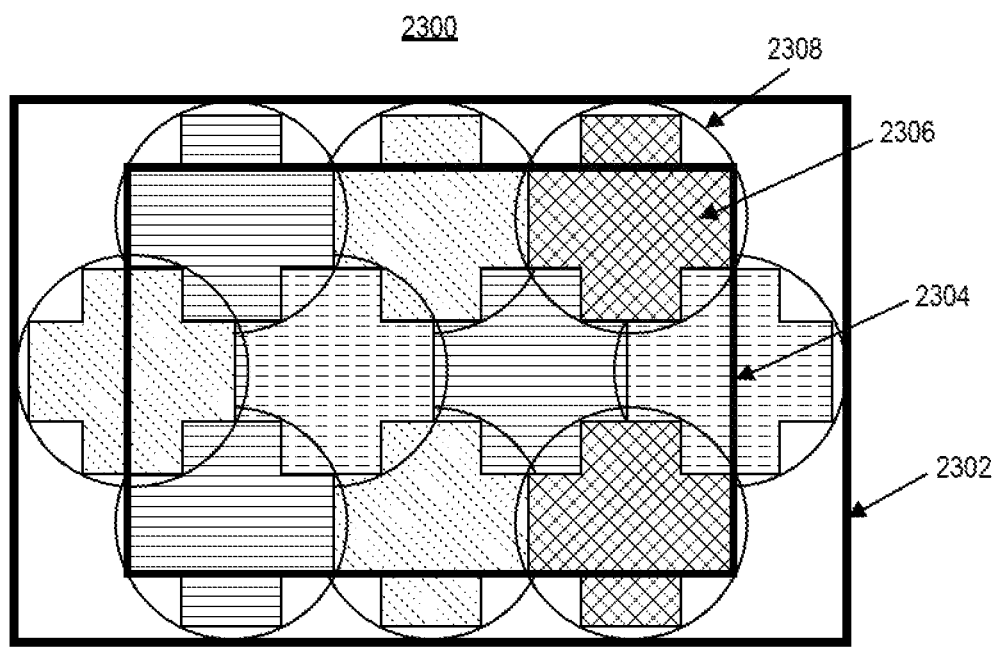
FIG. 23 is a schematic illustration of how many μLED wafers covered with arrays of μLEDs are used to directly transfer μLEDs to mother glass, in accordance with an embodiment of the present disclosure.

FIG. 23 is a schematic illustration 2300 of how many μLED wafers 2308 (e.g., silicon wafers) covered with arrays of μLEDs 2306 are used to directly transfer μLEDs to mother glass 2302 (or effective mother glass 2304), in accordance with an embodiment of the present disclosure. The transfer may be performed in a series of operations: (1) align, (2) selective bond, and (3) selective release. A cross patch of arrays of μLEDs is given as an example in this case. Other examples include square or hexagonal patches.

Figure 24:
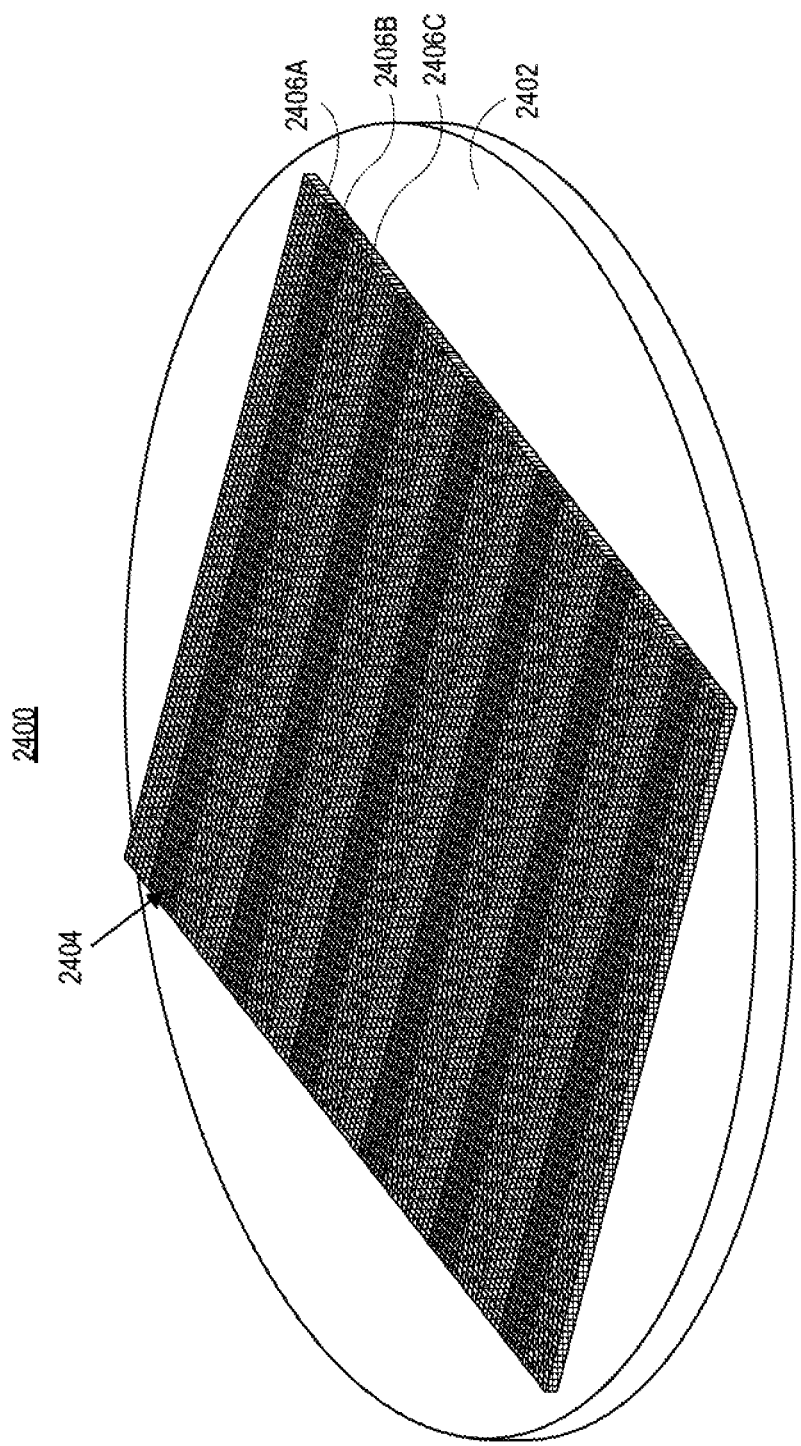
FIG. 24 is a schematic of a μLED array patch on a silicon wafer, in accordance with an embodiment of the present disclosure.

FIG. 24 is a schematic 2400 of a μLED array patch 2404 on a silicon wafer 2402, in accordance with an embodiment of the present disclosure. A square patch 2404 is shown in this example. Red 2406A, green 2406B, and blue 2406C μLED arrays may be grown on the silicon substrate 2402 according to a method described below.

Figure 25:
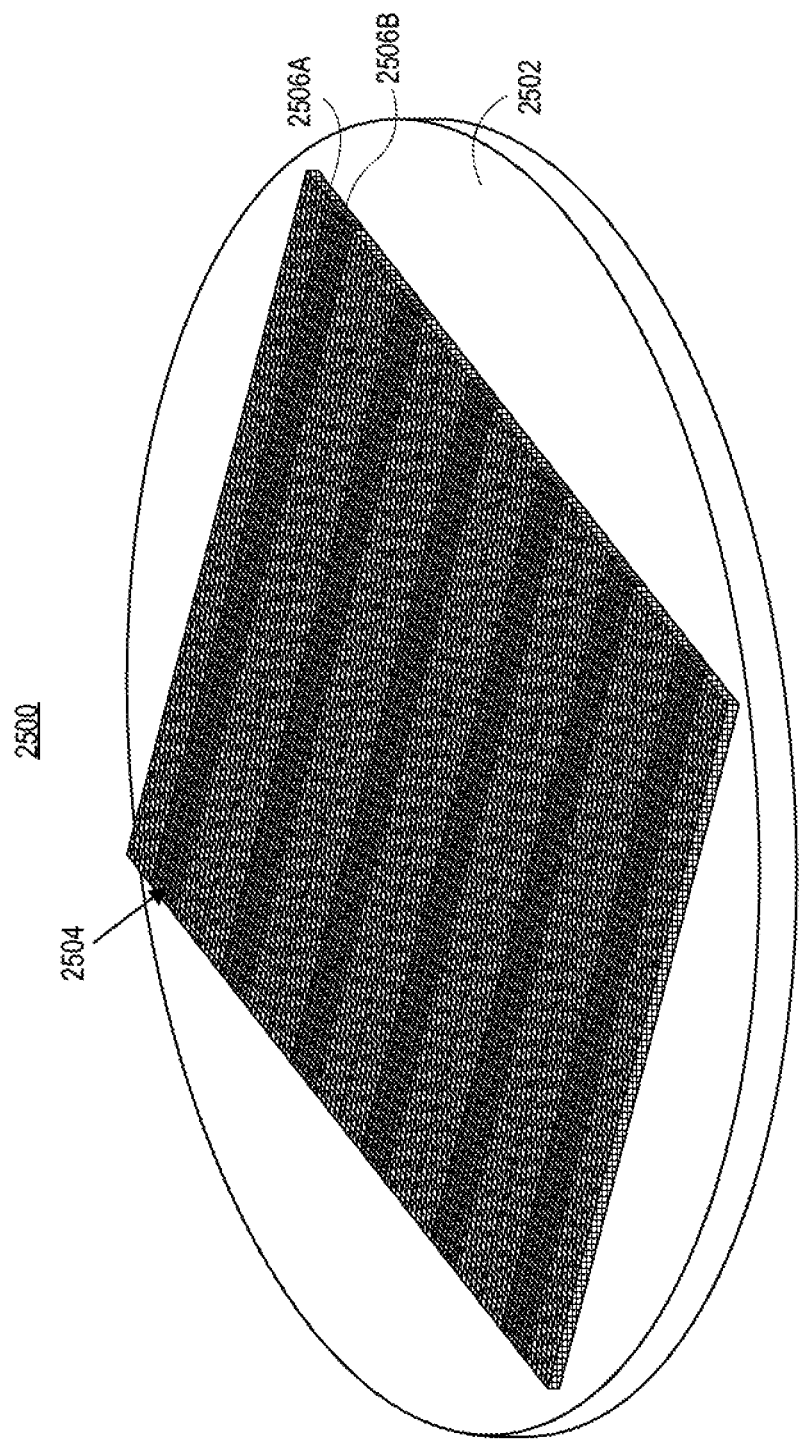
FIG. 25 is another schematic of a μLED array patch on a silicon wafer, in accordance with an embodiment of the present disclosure.

FIG. 25 is another schematic 2500 of a μLED array patch 2504 on a silicon wafer 2502, in accordance with an embodiment of the present disclosure. A square patch 2504 is shown in this example. Blue 2506A, green 2506B, and blue 2506A μLED arrays may be grown on the silicon substrate 2502 according to a method described below.

Figure 26:
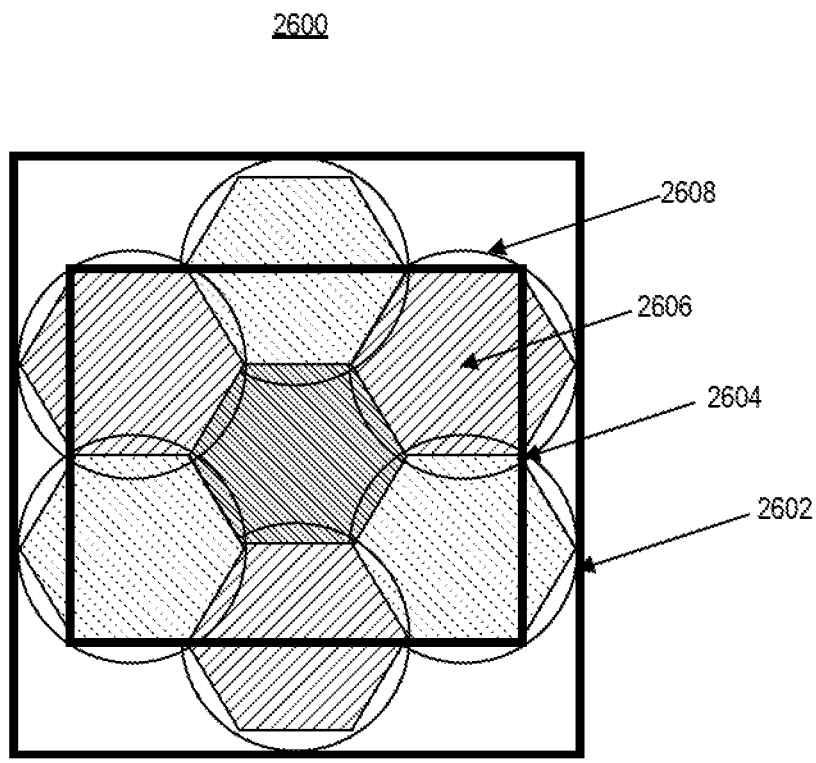
FIG. 26 is another schematic illustration of how many μLED wafers covered with arrays of μLEDs are used to directly transfer μLEDs to mother glass, in accordance with an embodiment of the present disclosure.

FIG. 26 is another schematic illustration 2600 of how many μLED wafers 2608 (e.g., silicon wafers) covered with arrays of μLEDs 2606 are used to directly transfer μLEDs to mother glass 2602 (or effective mother glass 2604), in accordance with an embodiment of the present disclosure. The transfer may be performed in a series of operations: (1) align, (2) selective bond, and (3) selective release. A hexagonal patch of arrays of μLEDs is given as an example in this case. Other examples include square or cross patches.

In a particular embodiment, transfer and bonding equipment is suitably sized to accommodate technology sizes such as Gen 4 (730 mm×920 mm) mother glass substrates or larger. An example is shown in FIG. 27 for illustration purposes of how many 13.3" displays may be made out of a Gen 4 mother glass, and how many wafers are needed to cover this mother glass size.

Figure 27:
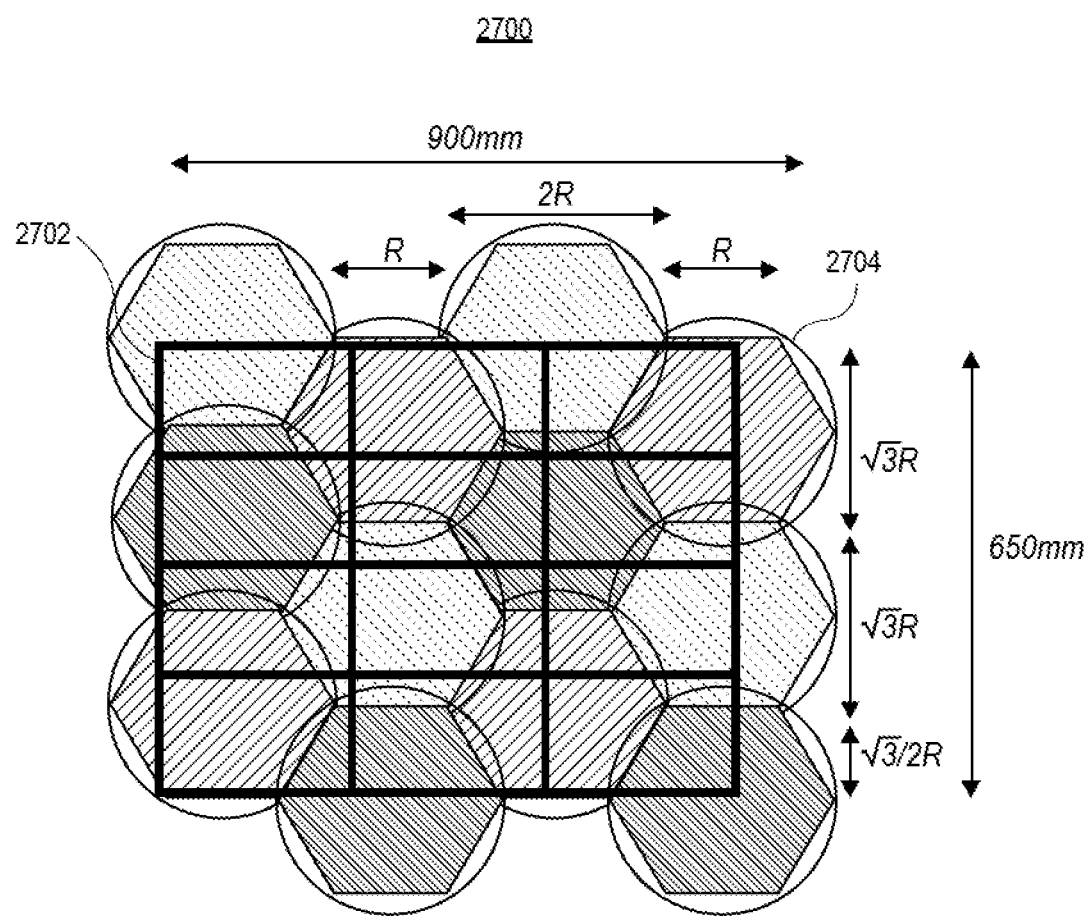
FIG. 27 illustrates a top-down view showing how 12 wafers are used to provide the needed μLEDs for a Gen 4 mother glass, in accordance with an embodiment of the present disclosure.

FIG. 27 illustrates a top-down view 2700 showing how 12 wafers 2704 are used to provide the needed μLEDs for a Gen 4 mother glass 2702, in accordance with an embodiment of the present disclosure. The wafers 2704 are used again for other mother glasses until all μLEDs on the wafers are transferred. In this schematic (which is made to-scale) R is the wafer radius (e.g. 150 mm). In this case 12 13.3" displays are cut from mother glass after finishing μLED transfer.

In another aspect, planarized structures for fabricating micro LED displays are described.

To provide context, the manufacturing of μLED displays requires planarization films that can provide the receiving surface when μLEDs are transferred from source wafer to display backplane. It may be desirable that the planarization material have a low dielectric constant to prevent errors in the TFT operation by parasitic capacitance. The dielectric constants of silicon nitride (SiNx) and $SiO_2$ for a conventional use are about 7 and 4, respectively. It may also be desirable that the planarization material have a superior insulation property, e.g., high intrinsic resistivity. Moreover, when used as a protection film, the planarization material should have a good adhesion property to ITO which is deposited on the protection film to form a pixel electrode. In addition, the upper processing temperature for these materials, ranging from 350 to 400° C., may be too high for a protection film of a TFT. In general, when the processing temperature for the insulation or protection film is higher than 250° C., the TFT characteristics may be affected by temperature.

In accordance with one or more embodiments of the present disclosure, a micro LED display and a method for manufacturing the same that substantially obviates one or more of the problems due to limitations and disadvantages of the related art are described. In particular, a method and structure for receiving a micro device on a receiving substrate are disclosed.

In an embodiment, micro LEDs are bonded to a backplane that has protrusions of electrically conductive pads that are sitting on a large light reflective metallic plate. Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. In one or more embodiments described herein, however, direct bonding of micro LEDs on a display backplane is performed followed be selective removal of the micro LEDs (as opposed to removing the whole wafer).

In an embodiment, a micro LED display includes a substrate. A thin film transistor is over the substrate, the thin film transistor having a gate, a source, a drain, a semiconductor layer, and a gate insulating layer. A protection film is over the thin film transistor, where the protection film includes a material or is derived from a material such as but not limited to Fluorinated polyimide, Teflon, cytop, fluoropolyarylether, Fluorinated parylene, PFCB (perfluorocyclobutane), or BCB (benzocyclobutene).

In one aspect, a method of manufacturing micro LED display includes first depositing a first metal on a substrate and forming a gate bus line and a gate electrode by patterning the first metal. A gate insulating layer is formed by depositing an inorganic material on the whole surface of the substrate on which the gate bus line and the gate electrode are formed. The method also involves sequentially depositing an intrinsic semiconductive material and an impure semiconductive material on the gate insulating layer and forming a semiconductor layer and an impure semiconductor layer by patterning the intrinsic semiconductive material and the impure semiconductive material. The method also involves depositing a second metal on the whole surface of the substrate on which the impure semiconductor layer is formed and forming a source bus line, a source electrode and a drain electrode by patterning the second metal. The method also involves forming a planarized protection layer by depositing organic material on the whole surface of the substrate through which interconnect vias to the source and drain electrodes are formed. The method also involves forming a contact hole in a portion of the protection layer covering the drain electrode. The method also involves depositing a conductive material on the substrate on which the planarized protection layer is formed and transferring micro LEDs on top of the conductive material to connect one terminal of the micro LED to a source or drain terminal of a TFT.

Figure 28A:
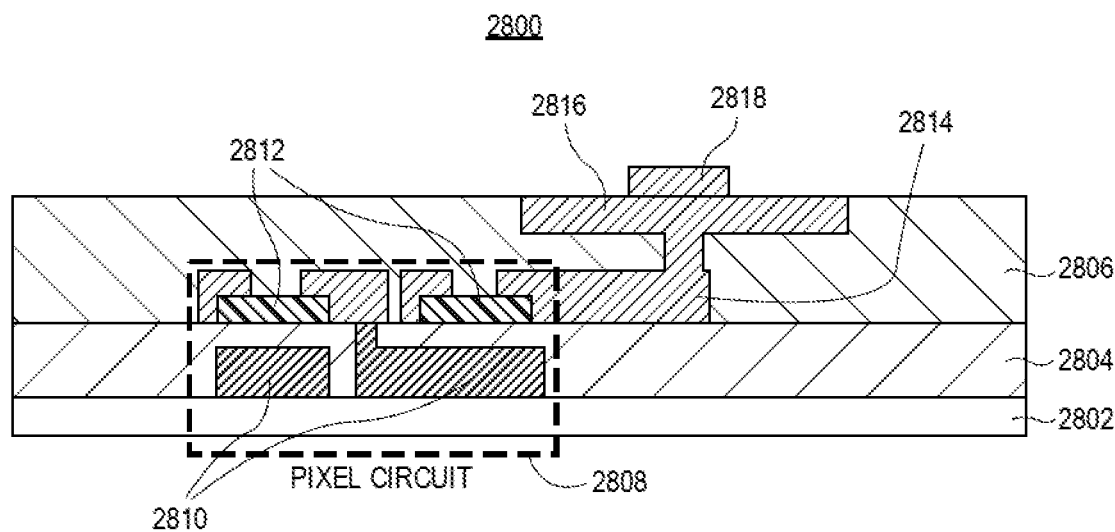
FIG. 28A illustrates a cross-sectional view of a display backplane prior to having micro LEDs bonded thereon, in accordance with an embodiment of the present disclosure.
Figure 28B:
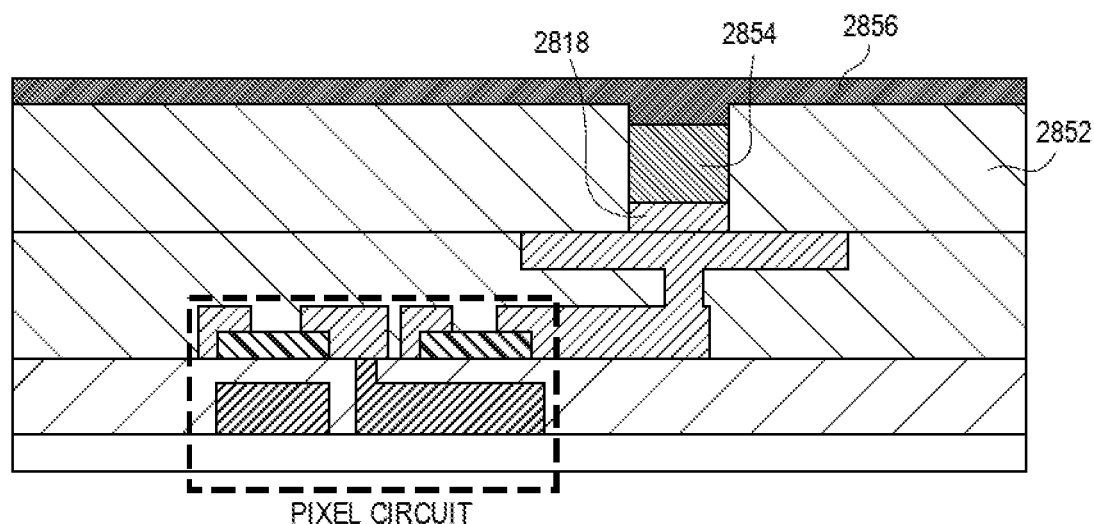
FIG. 28B illustrates a cross-sectional view of a display backplane having micro LEDs bonded thereon, in accordance with an embodiment of the present disclosure.

As an example, in accordance with an embodiment of the present disclosure, a method and structure for receiving a micro device on a receiving substrate are disclosed. Micro LEDs may be bonded to a backplane that has protrusions of electrically conductive pads that are sitting on a large light reflective metallic plate, as depicted in FIG. 28A. After bonding of the micro LEDs, one or more high refractive index spacers are fabricated around the micro LED to improve the light extraction efficiency and to control the output beam, as shown in FIG. 28B. It is to be appreciated that traditional technologies for transferring of devices include transfer by wafer bonding from a transfer wafer to a receiving wafer. One such implementation is "direct printing" involving one bonding operation of an array of devices from a transfer wafer to a receiving wafer, followed by removal of the transfer wafer. By contrast, embodiments described herein involve the direct bonding of micro LEDs on a display backplane followed by selective removal of the micro LEDs (as opposed to removing the whole wafer).

FIG. 28A illustrates a cross-sectional view of a display backplane prior to having micro LEDs bonded thereon, in accordance with an embodiment of the present disclosure.

Referring to FIG. 28A, a backplane structure 2800 includes a glass substrate 2802 having an insulating layer 2804 thereon. A planarization oxide layer 2806 may be on the insulating layer 2804. Pixel thin film transistor (TFT) circuits 2808 are included in and on the insulating layer 2804. Each of the pixel TFT circuits 2808 includes gate electrodes 2810, such as metal gate electrodes, and channels 2812. A portion of the insulating layer 2804 may act as a gate dielectric for each of the pixel TFT circuits 2808.

In an embodiment, the pixel TFT circuits 2808 are low temperature polysilicon (LTPS)-type TFTs. In another embodiment, the pixel TFT circuits 2808 are IZGO TFTs or IGZO-type TFTs, where the channel 2812 of each of the pixel TFT circuits 2808 includes a semiconducting oxide material. In an embodiment, the semiconducting oxide material is an IGZO layer that has a gallium to indium ratio of 1:1, a gallium to indium ratio greater than 1 (e.g., 2:1, 3:1, 4:1, 5:1, 6:1, 7:1, 8:1, 9:1, or 10:1), or a gallium to indium ratio less than 1 (e.g., 1:2, 1:3, 1:4, 1:5, 1:6, 1:7, 1:8, 1:9, or 1:10). A low indium content IGZO may refer to IGZO having more gallium than indium (e.g., with a gallium to indium ratio greater than 1:1), and may also be referred to as high gallium content IGZO. Similarly, low gallium content IGZO may refer to IGZO having more indium than gallium (e.g., with a gallium to indium ratio less than 1:1), and may also be referred to as high indium content IGZO. In another embodiment, the semiconducting oxide material is or includes a material such as tin oxide, antimony oxide, indium oxide, indium tin oxide, titanium oxide, zinc oxide, indium zinc oxide, gallium oxide, titanium oxynitride, ruthenium oxide, or tungsten oxide.

In an embodiment, the semiconducting oxide material is an amorphous, crystalline, or semi crystalline oxide semiconductor, such as an amorphous, crystalline, or semi crystalline oxide semiconductor IGZO layer. The semiconducting oxide material may be formed using a low-temperature deposition process, such as physical vapor deposition (PVD) (e.g., sputtering), atomic layer deposition (ALD), or chemical vapor deposition (CVD). The ability to deposit the semiconducting oxide material at temperatures low enough to be compatible with back-end manufacturing processes represents a particular advantage. The semiconducting oxide material may be deposited on sidewalls or conformably on any desired structure to a precise thickness, allowing the manufacture of transistors having any desired geometry.

In an embodiment, gate electrodes 2810 includes at least one P-type work function metal or N-type work function metal. For a P-type transistors, metals that may be used for the gate electrode 2810 may include, but are not limited to, ruthenium, palladium, platinum, cobalt, nickel, and conductive metal oxides (e.g., ruthenium oxide). For an N-type transistor, metals that may be used for the gate electrode 2810 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

The planarization oxide layer 2806 may have conductive features therein. The conductive features may include one or more interconnects 2814 and associated reflective plate or mirror 2816. Metal pads or bumps 2818 are on the reflective plate or mirror 2816. In an embodiment, metal pads or bumps 2818 are copper or aluminum pads or bumps. The structure of FIG. 28A may be referred to as a backplane.

A micro LED may be bonded to the backplane structure of FIG. 28A. In an example, FIG. 28B illustrates a cross-sectional view of a display backplane having a micro LED bonded thereon, in accordance with an embodiment of the present disclosure.

Referring to FIG. 28B, a front plane includes a micro LED 2854 bonded to a corresponding metal pads or bumps 2818 coupled to the backplane of FIG. 28A. A second planarization oxide or insulating layer 2852 may be formed to surround the bonded structure. A transparent electrode 2856, such as an indium tin oxide (ITO) layer, is formed thereon with a window exposing the micro LED 2854. The transparent electrode 2856 may function as a common cathode. In an embodiment, the micro LED 2854 is a green micro LED, a blue micro LED, or a red micro LED.

In an embodiment, a receiving backplane structure such as shown in FIGS. 28A and FIG. 28B includes a planarization film or material. The planarization film can be formed by a spin on glass (SOG) technique, or a deposition and CMP technique, or a planarization technique using an organic resin. In the case of forming the planarization film by using an organic material such as acrylic resin, a solution of the organic resin may be applied by spin-coating like the SOG technique. A poly(methyl methacrylate), polyacrylate, polycarbonate, poly(vinyl pyrrolidone), poly(vinyl alcohol), carboxylmethylcellulose, hydroxymethylcellulose or various fluorinated resins may be used as the resin. In one embodiment, such resins are transparent to visible light. The SOG process is characterized by spin-coating a solution in which a silanol compound is dissolved by a solvent such as methanol, to realize the planarization (smoothening) of the surface of the film. Accordingly, the solution of a silanol compound tends to be accumulated at a deep portion of, for example, the large contact-hole portion.

It is to be appreciated that it may be possible to use polyimide or acryl resin as a planarization film in order to obtain a smooth surface over the TFT. However, since the adhesion property between the resins and ITO (a pixel electrode) is typically poor, it is necessary to form a thin intermediate layer of an inorganic material prior to the ITO deposition to prevent the detachment of ITO during the patterning. In addition, the upper processing temperature for these materials, ranging from 350 to 400° C., may be too high for a protection film of a TFT. In general, when the processing temperature for the insulation or protection film is higher than 250° C., the TFT characteristics may be affected by temperature. Also, the dielectric constant of polyimide is 3.4 to 3.8, similar to that of SiNx, 3.5, and, as such, a parasitic capacitance may not be sufficiently reduced.

To provide further context, μLED arrays produce their own light in response to current flowing through the individual elements of the array. A variety of different LED-like luminescent sources have been used for such displays. One or more embodiments described herein utilize electroluminescent materials in μLEDs made of, for example, GaN, InGaN, or AlInGaP materials. Electrically, such devices behave like diodes with forward "on" voltage drops ranging from 1.9 volts (V) to 5 V, depending on the color and electrode quality.

Unlike liquid crystal displays (LCDs), μLEDs are current driven devices. However, they may be similarly arranged in a two-dimensional array (matrix) of elements to form a display. Active-matrix μLED displays typically use current control circuits integrated with the display itself, with one control circuit corresponding to each individual element on the substrate, to create high-resolution color graphics with a high refresh rate. Such a structure results in a matrix of devices, where one (or more) device is formed at each point where a row overlies a column. There will generally be at least M×N devices in a matrix having M rows and N columns. Typical devices function like light emitting diodes (LEDs), which conduct current and luminesce when voltage of one polarity is imposed across them, and block current when voltage of the opposite polarity is applied. To control such individual μLED devices located at the matrix junctions, it may be useful to have two distinct driver circuits, one to drive the columns and one to drive the rows. It is conventional to sequentially scan the rows (e.g., conventionally connected to device cathodes) with a driver switch to a known voltage such as ground, and to provide another driver to drive the columns (which are conventionally connected to device anodes). In operation, information is transferred to the matrix display by scanning each row in sequence. During each row scan period, each column connected to an element intended to emit light is also driven.

In contrast to conventional integral display architecture based on liquid crystal displays (LCDs), one or more embodiments described herein include the use of a micro LED emissive display which results in overall lower power. Monolithic RGB micro LED wafers may provide full color augmented reality display arrays. Wafer-to-wafer bonding approaches described herein provide a unique device structure that can be easily detected (e.g., metal-to-metal bonding structure and the monolithic RGB pixels). A driver circuit described herein may consume relatively very little area to fit into small pixels of high efficiency displays.

Figure 29:
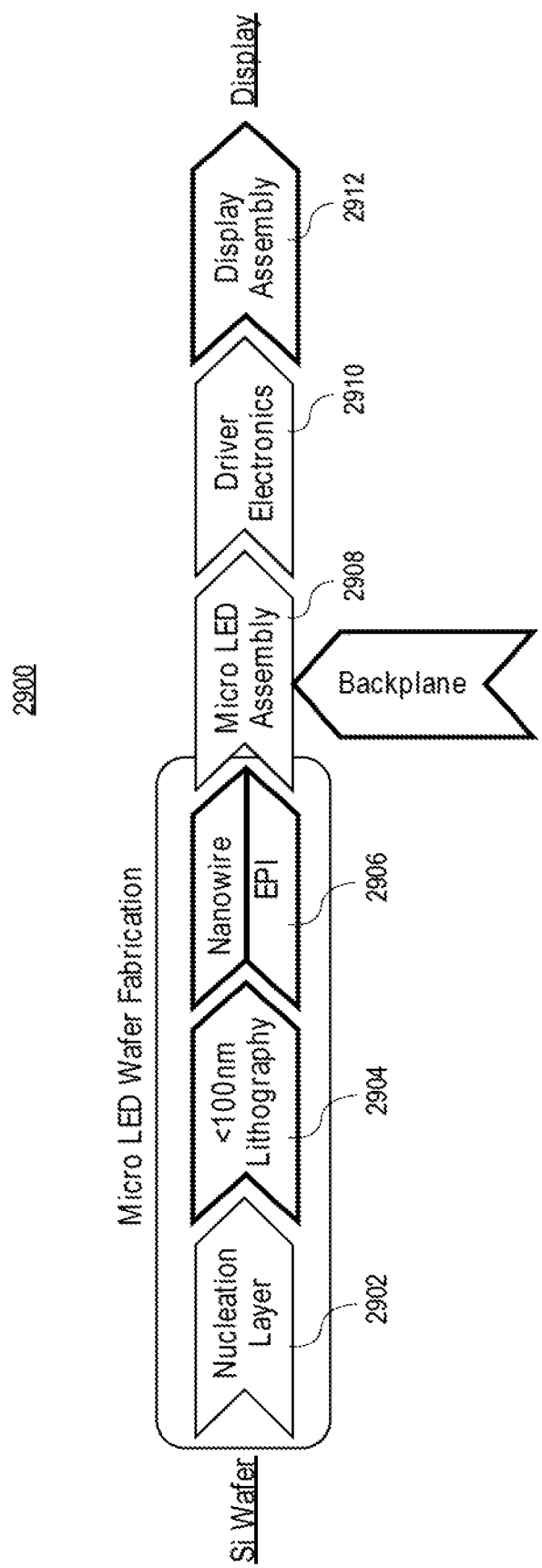
FIG. 29 is a flow diagram illustrating an RGB display production process, in accordance with an embodiment of the present disclosure.

In another aspect, FIG. 29 is a flow diagram 2900 illustrating an RGB display production process, in accordance with an embodiment of the present disclosure. Referring to flow diagram 2900, at operation 2902, a silicon (Si) wafer has a nucleation layer formed thereon, such as a patterned conductive/dielectric nucleation layer. At operation 2904, sub 100 nm lithography is used to pattern a layer on the nucleation layer, or to pattern the nucleation layer. At operation 2906, nanowire growth is performed on the nucleation layer, e.g., by epitaxial deposition. At operation 2908, a backplane is introduced into the micro LED assembly process. At operation 2910, driver electrons are fabricated. At operation 2912, display assembly is performed to finally provide a display.

Figure 30:
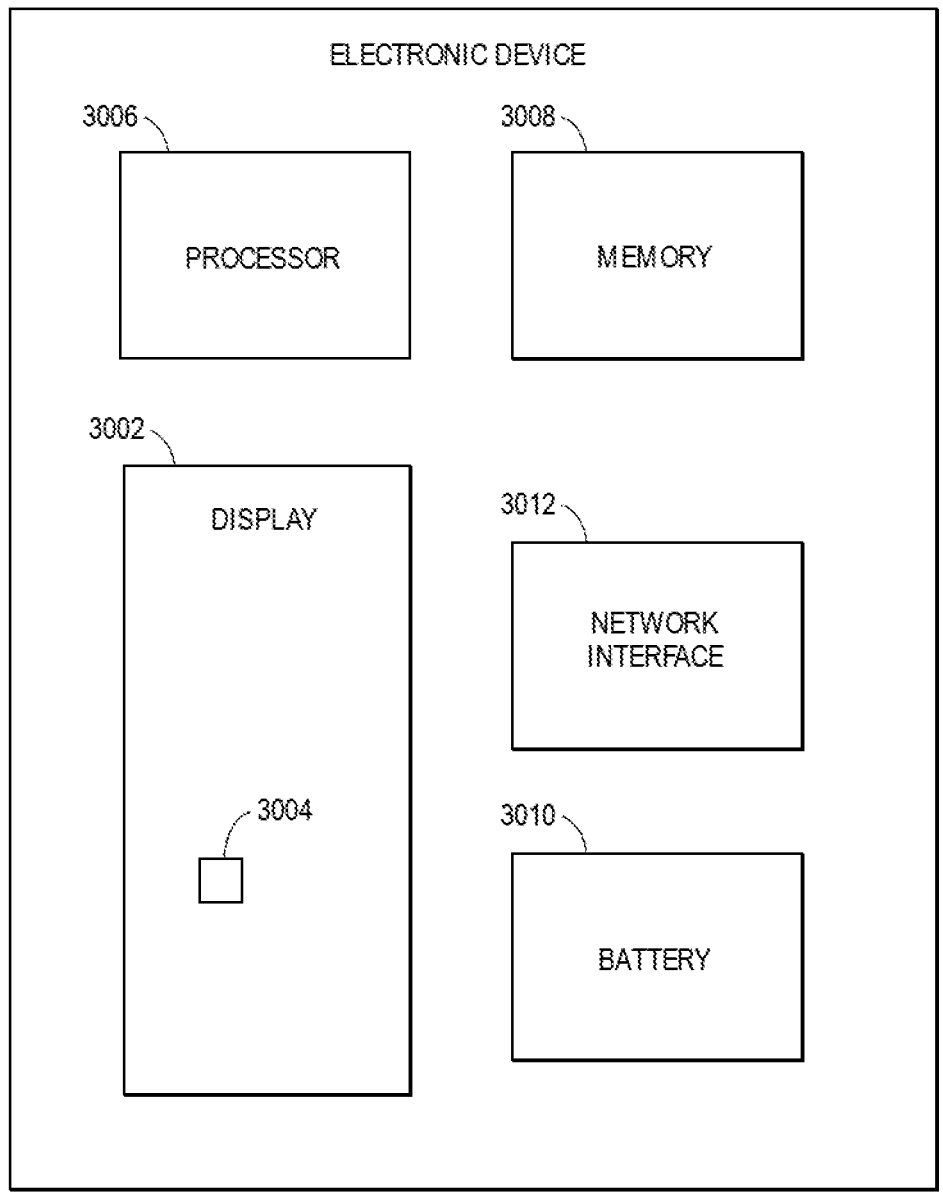
FIG. 30 is an electronic device having a display, in accordance with embodiments of the present disclosure.

FIG. 30 is an electronic device having a display, in accordance with embodiments of the present disclosure.

Referring to FIG. 30, an electronic device 3000 has a display or display panel 3002 with a micro-structure 3004. The display may also have glass layers and other layers, circuitry, and so forth. The display panel 3002 may be a micro-LED display panel. As should be apparent, only one microstructure 3004 is depicted for clarity, though a display panel 3002 will have an array or arrays of microstructures including nanowire LEDs.

The electronic device 3000 may be a mobile device such as smartphone, tablet, notebook, smartwatch, and so forth. The electronic device 3000 may be a computing device, stand-alone display, television, display monitor, vehicle computer display, the like. Indeed, the electronic device 3000 may generally be any electronic device having a display or display panel.

The electronic device 3000 may include a processor 3006 (e.g., a central processing unit or CPU) and memory 3008. The memory 3008 may include volatile memory and non-volatile memory. The processor 3006 or other controller, along with executable code store in the memory 3008, may provide for touchscreen control of the display and well as for other features and actions of the electronic device 3000.

In addition, the electronic device 3000 may include a battery 3010 that powers the electronic device including the display panel 3002. The device 3000 may also include a network interface 3012 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 3000 may include additional components including circuitry and other components.

Thus, embodiments described herein include micro light-emitting diode displays and methods of fabricating micro light-emitting diode displays.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A micro light emitting diode pixel structure includes a plurality of micro light emitting diode devices in a dielectric layer. A transparent conducting oxide layer is above the dielectric layer. A color conversion device (CCD) is above the transparent conducting oxide layer and over one of the plurality of micro light emitting diode devices.

Example embodiment 2: The micro light emitting diode pixel structure of example embodiment 1, wherein the color conversion device includes a color conversion device material layer sandwiched between a plurality of silicon oxide layers.

Example embodiment 3: The micro light emitting diode pixel structure of example embodiment 2, wherein the color conversion device material layer includes a photoresist material with quantum dots therein.

Example embodiment 4: The micro light emitting diode pixel structure of example embodiment 2 or 3, wherein the plurality of silicon oxide layers of the color conversion device includes an oxide-oxide bond interface between the transparent conducting oxide layer and the color conversion device material layer.

Example embodiment 5: The micro light emitting diode pixel structure of example embodiment 1, 2, 3 or 4, wherein the color conversion device is included in passivation oxide layer, the passivation oxide layer over the transparent conducting oxide layer.

Example embodiment 6: The micro light emitting diode pixel structure of example embodiment 1, 2, 3, 4 or 5, wherein the plurality of micro light emitting diode devices includes a green micro light emitting diode device, a first blue micro light emitting diode device, and a second blue micro light emitting diode device.

Example embodiment 7: The micro light emitting diode pixel structure of example embodiment 6, wherein the color conversion device is over the second blue micro light emitting diode device.

Example embodiment 8: The micro light emitting diode pixel structure of example embodiment 7, wherein the color conversion device coverts blue light from the second blue micro light emitting diode device to red light.

Example embodiment 9: The micro light emitting diode pixel structure of example embodiment 1, 2, 3, 4, 5, 6, 7 or 8, wherein the plurality of micro light emitting diode devices is a plurality of GaN nanowire-based or nanopyramid-based micro light emitting diode devices.

Example embodiment 10: The micro light emitting diode pixel structure of example embodiment 1, 2, 3, 4, 5, 6, 7, 8 or 9, wherein the plurality of micro light emitting diode devices, the transparent conducting oxide layer, and the color conversion device form a front plane of the micro light emitting diode pixel structure, and wherein the micro light emitting diode pixel structure further includes a backplane beneath the front plane. The backplane includes a glass substrate having an insulating layer thereon, and a plurality of pixel thin film transistor circuits in and on the insulating layer. Each of the pixel thin film transistor circuits includes a gate electrode and a channel including polycrystalline silicon or indium gallium zinc oxide (IGZO).

Example embodiment 11: The micro light emitting diode pixel structure of example embodiment 10, wherein each of the pixel thin film transistor circuits is to drive at least one of the plurality of micro light emitting diode devices.

Example embodiment 12: The micro light emitting diode pixel structure of example embodiment 10 or 11, wherein each of the pixel thin film transistor circuits includes a current mirror and a linearized transconductance amplifier coupled to the current mirror.

Example embodiment 13: A micro light emitting diode pixel structure includes a substrate having a plurality of conductive interconnect structures in a first dielectric layer thereon. A plurality of micro light emitting diode devices is in a second dielectric layer above the first dielectric layer. Individual ones of the plurality of micro light emitting diode devices are electrically coupled to a corresponding one of the plurality of conductive interconnect structures. The second dielectric layer is separate and distinct from the first dielectric layer. A transparent conducting oxide layer is on the plurality of micro light emitting diode devices and on the second dielectric layer. A color conversion device is above the transparent conducting oxide layer and over one of the plurality of micro light emitting diode devices.

Example embodiment 14: The micro light emitting diode pixel structure of example embodiment 13, wherein the plurality of micro light emitting diode devices includes a green micro light emitting diode device, a first blue micro light emitting diode device, and a second blue micro light emitting diode device.

Example embodiment 15: The micro light emitting diode pixel structure of example embodiment 14, wherein the color conversion device is over the second blue micro light emitting diode device.

Example embodiment 16: The micro light emitting diode pixel structure of example embodiment 15, wherein the color conversion device coverts blue light from the second blue micro light emitting diode device to red light.

Example embodiment 17: The micro light emitting diode pixel structure of example embodiment 13, 14, 15 or 16, wherein the substrate is a silicon substrate including metal oxide semiconductor (CMOS) devices or thin film transistor (TFT) devices coupled to the plurality of conductive interconnect structures.

Example embodiment 18: A micro light emitting diode pixel structure includes a plurality of micro light emitting diode devices in a first dielectric layer. A micro light emitting diode device is in a second dielectric layer, the second dielectric layer above the first dielectric layer. The micro light emitting diode device in the second dielectric layer is offset from the plurality of micro light emitting diode devices in the first dielectric layer. A transparent conducting oxide layer is above the second dielectric layer.

Example embodiment 19: The micro light emitting diode pixel structure of example embodiment 18, wherein the transparent conducting oxide layer is further in openings in the second dielectric layer over the micro light emitting diode device in the second dielectric layer and over each of the plurality of micro light emitting diode devices in the first dielectric layer.

Example embodiment 20: The micro light emitting diode pixel structure of example embodiment 18 or 19, wherein the plurality of micro light emitting diode devices in the first dielectric layer includes a green micro light emitting diode device and a blue micro light emitting diode device, and wherein the micro light emitting diode device in the second dielectric layer is a red micro light emitting diode device.

Example embodiment 21: The micro light emitting diode pixel structure of example embodiment 18, 19 or 20, wherein the plurality of micro light emitting diode devices in the first dielectric layer is a plurality of GaN nanowire-based or nanopyramid-based micro light emitting devices.

Example embodiment 22: The micro light emitting diode pixel structure of example embodiment 18, 19, 20 or 21, wherein the micro light emitting diode device in the second dielectric layer is a GaN nanowire-based or nanopyramid-based micro light emitting diode device.

Example embodiment 23: The micro light emitting diode pixel structure of example embodiment 18, 19, 20 or 21, wherein the micro light emitting diode device in the second dielectric layer is an organic light emitting diode device.

Example embodiment 24: The micro light emitting diode pixel structure of example embodiment 18, 19, 20, 21, 22 or 23, further including a glass substrate having an insulating layer thereon. A plurality of pixel thin film transistor circuits is in and on the insulating layer. Each of the pixel thin film transistor circuits is to drive at least one of the micro light emitting diode device in the second dielectric layer and the plurality of micro light emitting diode devices in the first dielectric layer.

Example embodiment 25: The micro light emitting diode pixel structure of example embodiment 24, wherein each of the pixel thin film transistor circuits includes a gate electrode and a channel including polycrystalline silicon or indium gallium zinc oxide (IGZO).

Example embodiment 26: The micro light emitting diode pixel structure of example embodiment 24 or 25, wherein each of the pixel thin film transistor circuits includes a current mirror and a linearized transconductance amplifier coupled to the current mirror.

What is claimed is:

1. A micro light emitting diode pixel structure, comprising:
   a plurality of micro light emitting diode devices in a dielectric layer;
   a transparent conducting oxide layer above the dielectric layer; and
   a color conversion device above the transparent conducting oxide layer, the color conversion device over only one micro light emitting diode device of the plurality of micro light emitting diode devices and not over the other micro light emitting diode devices of the plurality of micro light emitting diode devices.

2. The micro light emitting diode pixel structure of claim 1, wherein the color conversion device comprises a color conversion device material layer sandwiched between a plurality of silicon oxide layers.

3. The micro light emitting diode pixel structure of claim 2, wherein the color conversion device material layer comprises a photoresist with quantum dots therein.

4. The micro light emitting diode pixel structure of claim 2, wherein the plurality of silicon oxide layers of the color conversion device comprises an oxide-oxide bond interface between the transparent conducting oxide layer and the color conversion device material layer.

5. The micro light emitting diode pixel structure of claim 1, wherein the color conversion device is included in a passivation oxide layer, the passivation oxide layer over the transparent conducting oxide layer.

6. The micro light emitting diode pixel structure of claim 1, wherein the plurality of micro light emitting diode devices comprises a green micro light emitting diode device, a first blue micros light emitting diode device, and a second blue micro light emitting diode device.

7. The micro light emitting diode pixel structure of claim 6, herein the color conversion device is over the second blue micro light emitting diode device.

8. The micro light emitting diode pixel structure of claim 7, wherein the color conversion device coverts blue light from the second blue micro light emitting diode device to red light.

9. The micro light emitting diode pixel structure of claim 1, wherein the plurality of micro light emitting diode devices is a plurality of GaN nanowire-based or nanopyramid-based micro light emitting diode devices.

10. The micro light emitting diode pixel structure of claim 1, wherein the plurality of micro light emitting diode devices, the transparent conducting oxide layer, and the color conversion device form a front plane of the micro light emitting diode pixel structure, and wherein the micro light emitting diode pixel structure further comprises a backplane beneath the front plane, the backplane comprising:
   a glass substrate having an insulating layer thereon; and
   a plurality of pixel thin film transistor circuits in and on the insulating layer, each of the pixel thin film transistor circuits comprising a gate electrode and a channel comprising polycrystalline silicon or indium gallium zinc oxide (IGZO).

11. The micro light emitting diode pixel structure of claim 10, wherein each of the pixel thin film transistor circuits is to drive at least one of the plurality of micro light emitting diode devices.

12. The micro light emitting diode pixel structure of claim 10, wherein each of the pixel thin film transistor circuits comprises a current mirror and a linearized transconductance amplifier coupled to the current mirror.

13. A micro light emitting diode pixel structure, comprising:
    a substrate having a plurality of conductive interconnect structures in a first dielectric layer thereon;
    a plurality of micro light emitting diode devices in a second dielectric layer above the first dielectric layer, individual ones of the plurality of micro light emitting diode devices electrically coupled to a corresponding one of the plurality of conductive interconnect structures, wherein the second dielectric layer is separate and distinct from the first dielectric layer;
    a transparent conducting oxide layer on the plurality of micro light emitting diode devices and on the second dielectric layer; and
    a color conversion device above the transparent conducting oxide layer, the color conversion device over only one micro light emitting diode device of the plurality of micro light emitting diode devices and not over the other micro light emitting diode devices of the plurality of micro light emitting diode devices.

14. The micro light emitting diode pixel structure of claim 13, wherein the plurality of micro light emitting diode devices comprises a green micro light emitting diode device, a first blue micro light emitting diode device, and a second blue micro light emitting diode device.

15. The micro light emitting diode pixel structure of claim 14, wherein the color conversion device is over the second blue micro light emitting diode device.

16. The micro light emitting diode pixel structure of claim 15, wherein the color conversion device coverts blue light from the second blue micro light emitting diode device to red light.

17. The micro light emitting diode pixel structure of claim 13, wherein the substrate is a silicon substrate comprising metal oxide semiconductor (CMOS) devices or thin film transistor (TET) devices coupled to the plurality of conductive interconnect structures.

18. A micro light emitting diode pixel structure, comprising:
    a plurality of micro light emitting diode devices in a first dielectric layer;
    a micro light emitting diode device in a second dielectric layer, the second dielectric layer above the first dielectric layer, wherein the micro light emitting diode device in the second dielectric layer is offset from the plurality of micro light emitting diode devices in the first dielectric layer; and
    a transparent conducting oxide layer above the second dielectric layer.

19. The micro light emitting diode pixel structure of claim 18, wherein the transparent conducting oxide layer is further in openings in the second dielectric layer over the micro light emitting diode device in the second dielectric layer and over each of the plurality of micro light emitting diode devices in the first dielectric layer.

20. The micro light emitting diode pixel structure of claim 18, wherein the plurality of micro light emitting diode devices in the first dielectric layer comprises a green micro light emitting diode device and a blue micro light emitting diode device, and wherein the micro light emitting diode device in the second dielectric layer is a red micro light emitting diode device.

21. The micro light emitting diode pixel structure of claim 18, wherein the plurality of micro light emitting diode devices in the first dielectric layer is a plurality of GaN nanowire-based or nanopyramid-based micro light emitting diode devices.

22. The micro light emitting diode pixel structure of claim 21, wherein the micro light emitting diode device in the second dielectric layer is a GaN nanowire-based or nanopyramid-based micro light emitting diode device.

23. The micro light emitting diode pixel structure of claim 21, wherein the micro light emitting diode device in the second dielectric layer is an organic light emitting diode device.

24. The micro light emitting diode pixel structure of claim 18, further comprising:
    a glass substrate having insulating layer thereon; and
    a plurality of pixel thin film transistor circuits in and on the insulating layer, each of the pixel thin film transistor circuits to drive at least one of the micro light emitting diode device in the second dielectric layer and the plurality of micro light emitting diode devices in the first dielectric layer.

25. The micro light emitting diode pixel structure of claim 24, wherein each of the pixel thin film transistor circuits comprises a gate electrode and a channel comprising polycrystalline silicon or indium gallium zinc oxide (IGZO).

26. A micro light emitting diode pixel structure, comprising:
    a plurality of micro light emitting diode devices in a dielectric layer;
    a transparent conducting oxide layer above the dielectric layer; and
    a color conversion device above the transparent conducting oxide layer and over one of the plurality of micro light emitting diode devices, wherein the color conversion device comprises a color conversion device material layer sandwiched between a plurality of silicon oxide layers, and wherein the plurality of silicon oxide layers of the color conversion device comprises an oxide-oxide bond interface between the transparent conducting oxide layer and the color conversion device material layer.

27. A micro light emitting pixel structure, comprising:
    a plurality of micro light emitting diode devices in a dielectric layer;
    a transparent conducting oxide layer above the dielectric layer; and
    a color conversion device above the transparent conducting oxide layer and over one of the plurality of micro light emitting diode devices, wherein the plurality of micro light emitting diode devices comprises a green micro light emitting diode device, a first blue micro light emitting; diode device, and a second blue micro light emitting diode device.

28. A micro light emitting; pixel structure, comprising:
    a plurality of micro light emitting diode devices in a dielectric layer;
    a transparent conducting oxide layer above the dielectric layer; and a color conversion device above the transparent conducting oxide layer and over one of the plurality of micro light emitting diode devices, wherein the plurality of micro light emitting diode devices, the transparent conducting oxide layer, and the color conversion device form a front plane of the micro light emitting diode pixel structure, and wherein the micro light emitting diode pixel structure further comprises a backplane beneath the front plane, the backplane comprising:

a glass substrate having an insulating :layer thereon; and a plurality of pixel thin film transistor circuits in and on the insulating layer, each of the pixel thin film transistor circuits comprising a gate electrode and a channel comprising polycrystalline silicon or indium gallium zinc oxide (IGZO), wherein each of the pixel thin film transistor circuits comprises a current mirror and a linearized transconductance amplifier coupled to the current mirror.

* * * * *